United States Patent [19]
Sheahan

[11] Patent Number: 5,900,746
[45] Date of Patent: * May 4, 1999

[54] ULTRA LOW JITTER DIFFERENTIAL TO FULLSWING BICMOS COMPARATOR WITH EQUAL RISE/FALL TIME AND COMPLEMENTARY OUTPUTS

[75] Inventor: Benjamin Joseph Sheahan, Dallas, Tex.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/664,095

[22] Filed: Jun. 13, 1996

[51] Int. Cl.$^6$ ............................................. H03K 19/0175
[52] U.S. Cl. ........................... 326/73; 326/77; 326/66
[58] Field of Search .................... 326/64, 66, 73, 326/77

[56] References Cited

U.S. PATENT DOCUMENTS

| | | | |
|---|---|---|---|
| 5,214,317 | 5/1993 | Nguyen | 326/66 |
| 5,329,183 | 7/1994 | Tamegaya | 326/66 |
| 5,465,057 | 11/1995 | Takahashi | 326/66 |
| 5,528,171 | 6/1996 | Doi et al. | 326/66 |
| 5,534,794 | 7/1996 | Moreland | 326/66 |
| 5,631,580 | 5/1997 | Rau | 326/66 |

*Primary Examiner*—Michael Tokar
*Assistant Examiner*—Richard Roseen
*Attorney, Agent, or Firm*—W. Daniel Swayze, Jr.; Wade James Brady, III; Richard L. Donaldson

[57] ABSTRACT

A pair of complementary signals are switched between a high state and a low state such that the complementary signals are switched within a time period less than two gate delays. An inverter biases other inverters so that these two inverters are maintained at their threshold levels. The maintenance at the threshold values enable these two inverters to be switched quickly.

13 Claims, 65 Drawing Sheets

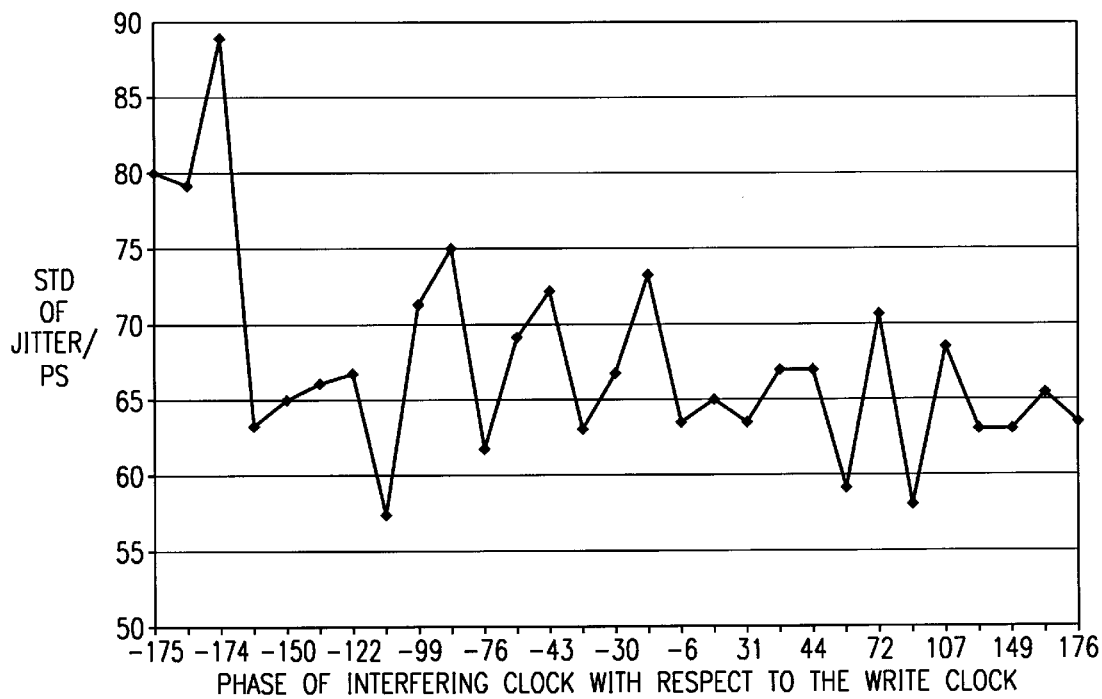
GOOD MAX JITTER=90 PS RMS  *FIG. 6*
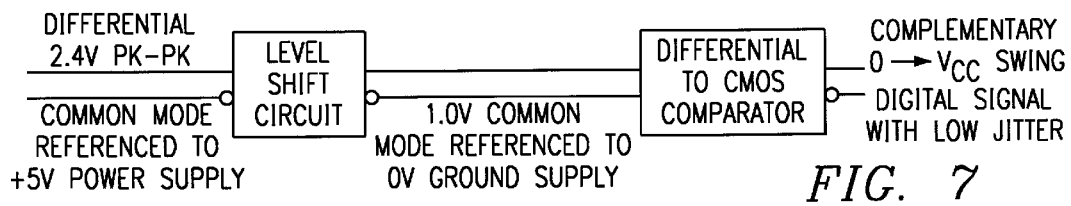
*FIG. 7*
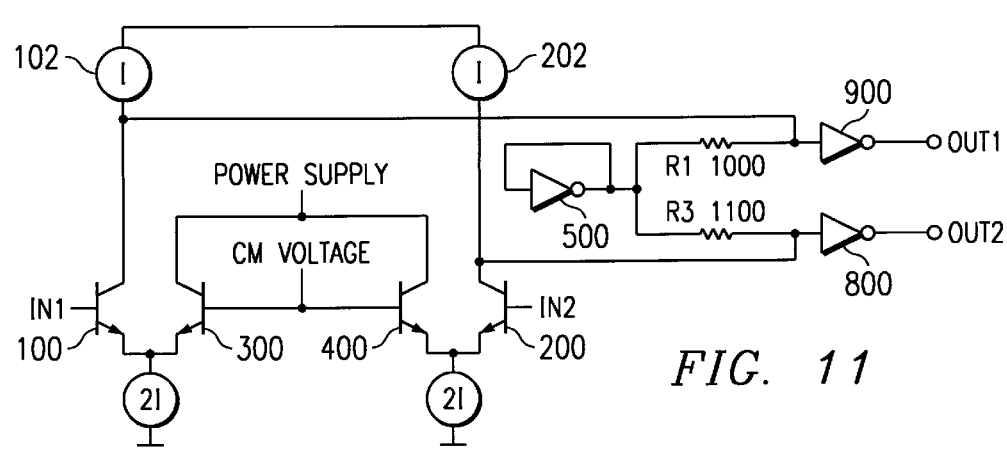
*FIG. 11*

SNC4_LEVEL

SNC4_LEVEL

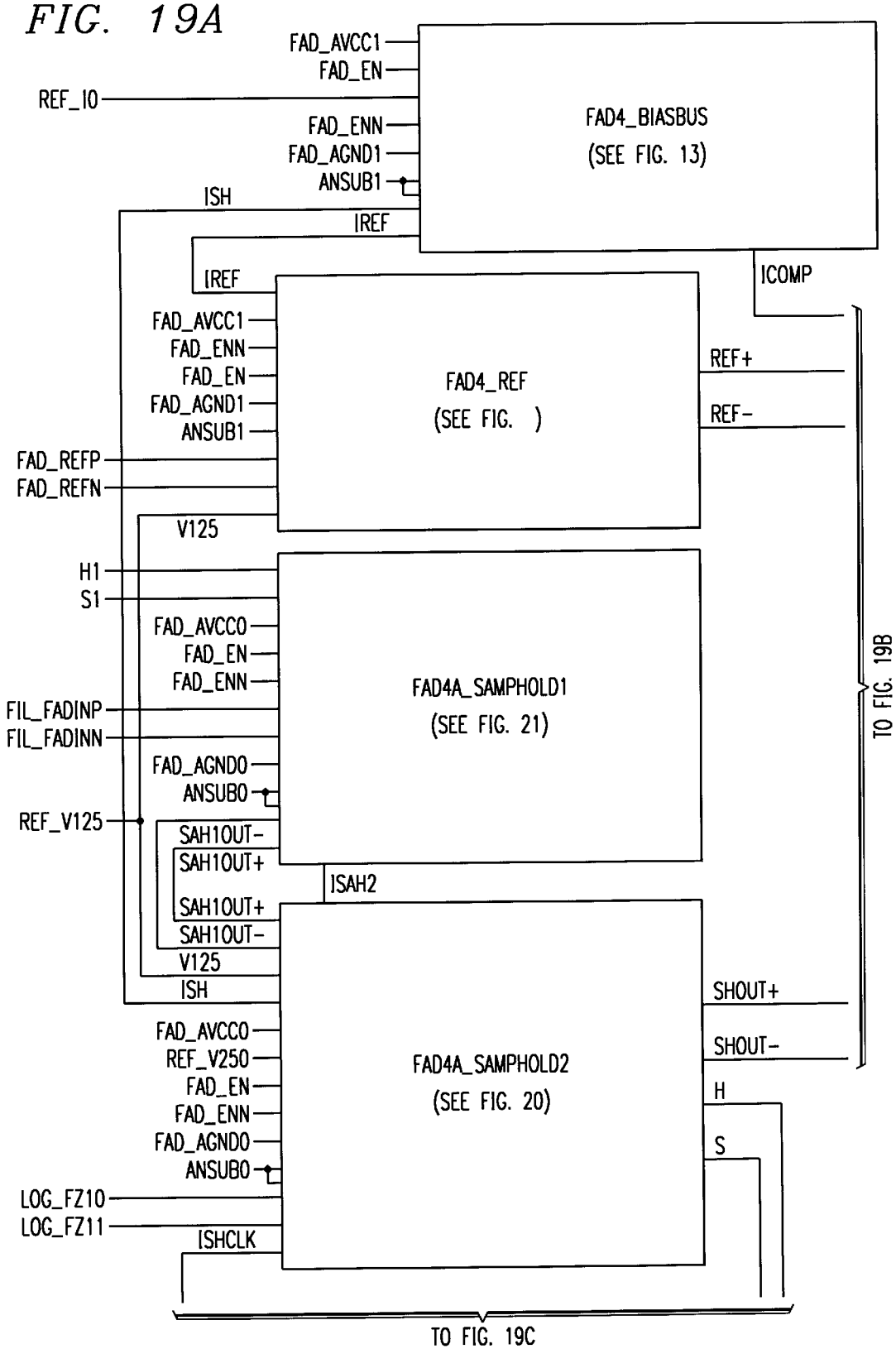

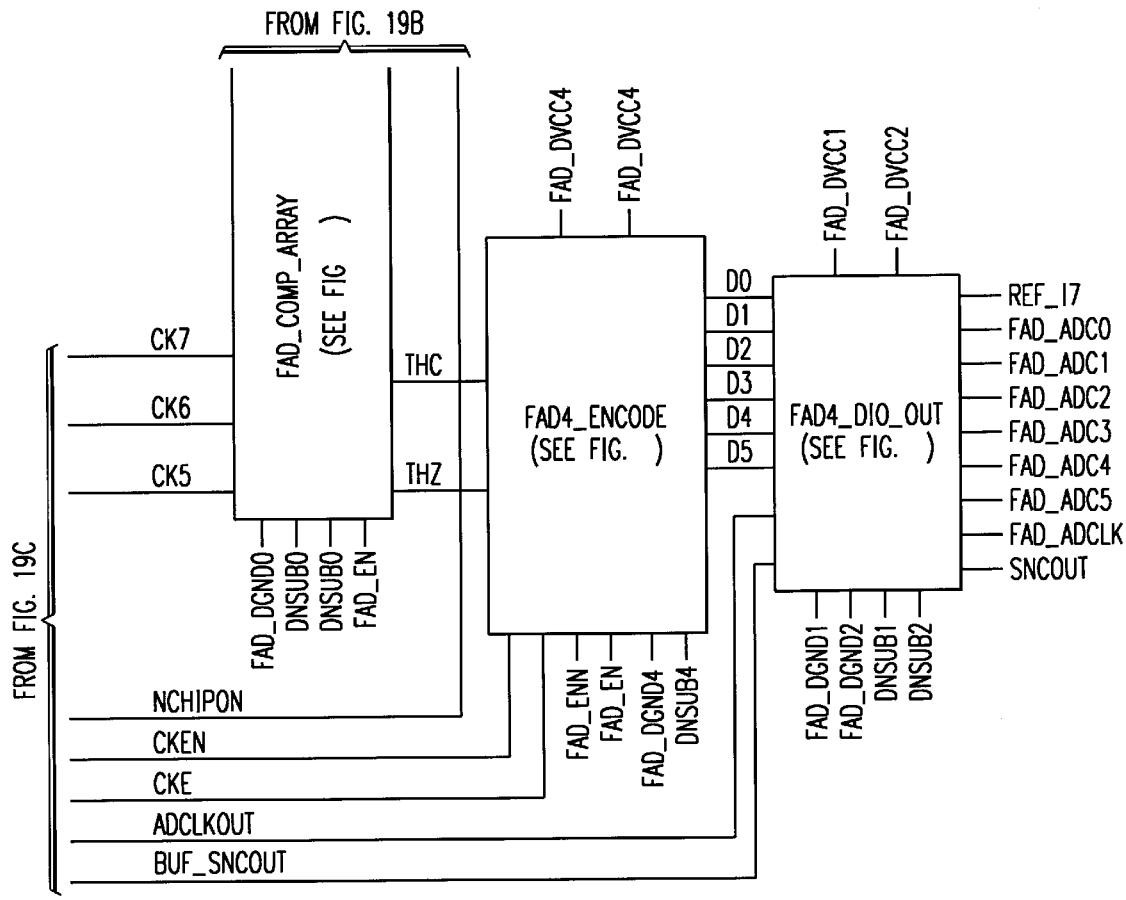
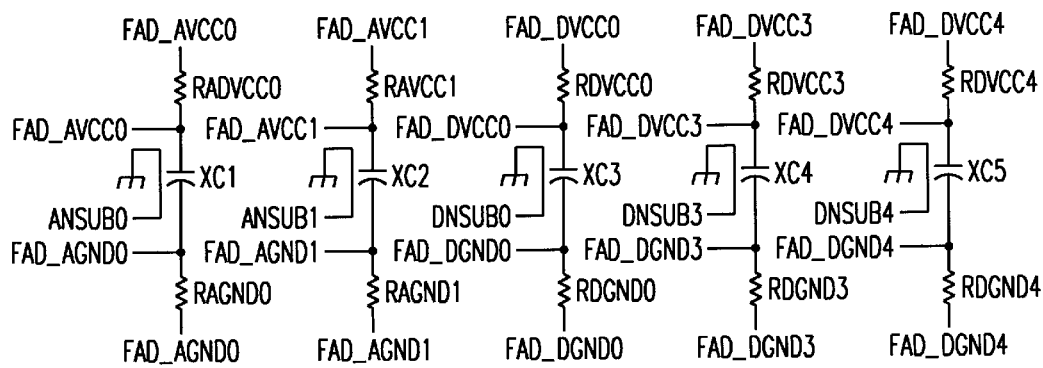
FIG. 19D

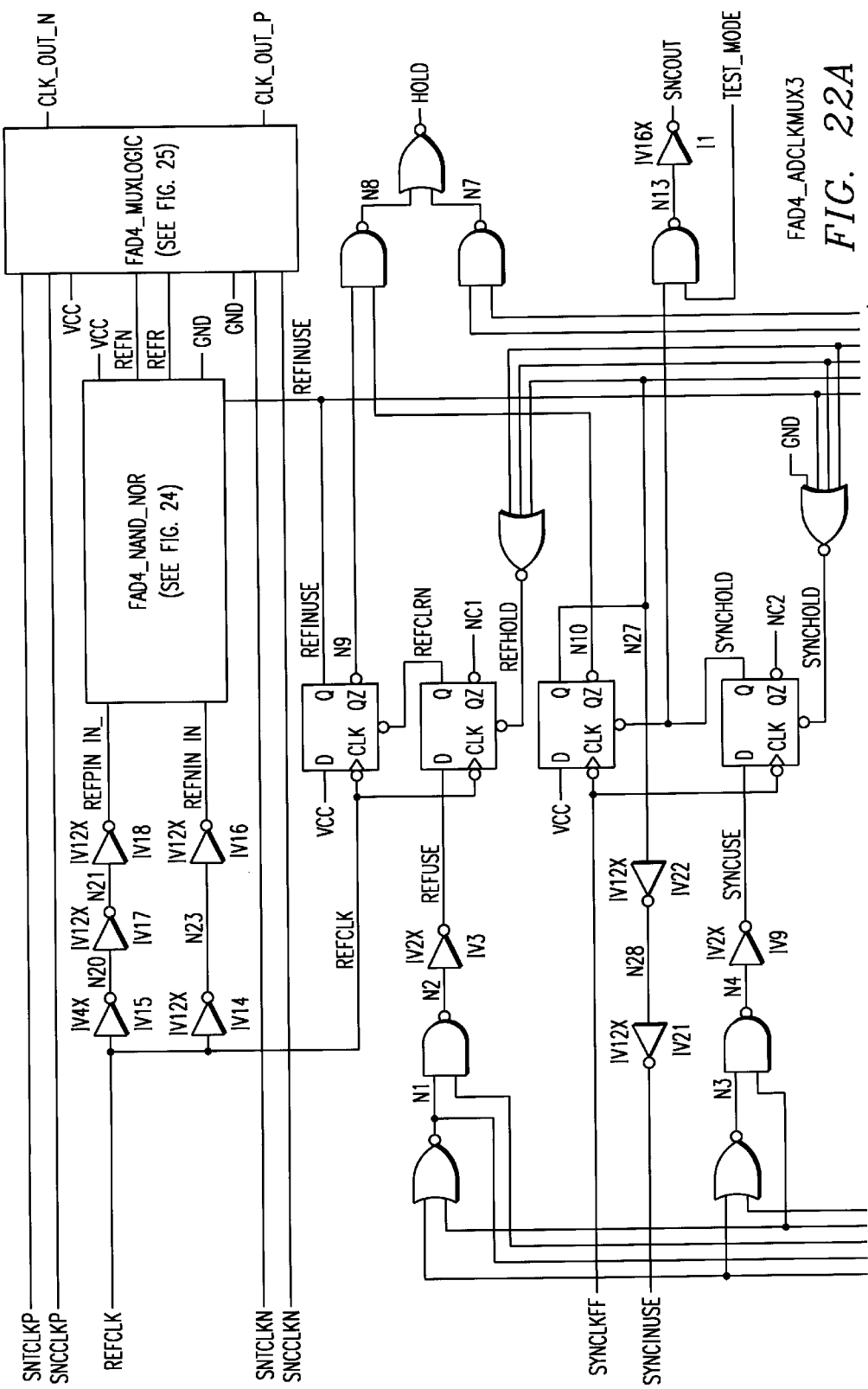

ULTRA LOW JITTER DIFFERENTIAL TO FULLSWING BICMOS COMPARATOR WITH EQUAL RISE/FALL TIME AND COMPLEMENTARY OUTPUTS

TECHNICAL FIELD OF THE INVENTION

This invention relates to read channel devices, more particularly to a device to synchronize to a read signal from a hard disk drive read head.

BACKGROUND OF THE INVENTION

A typical disk includes a series of tracks or channels which are concentrically arranged. These tracks are written and read by a head which senses the information stored on the disks. This information may include format information, as well as, user information. When this information is read by the head it is transferred to various circuits for interpretation. This circuitry may be known as a read channel circuit.

In attempting to design read channel devices to read, for example, hard disk drives, many designs have been presented in order to achieve high area density on the hard disk drive while maintaining the synchronization necessary to read every data area located on the hard disk drive.

FIG. 1 illustrates typical information loaded onto a hard disk drive in order to achieve the proper synchronization with each of the data areas. The information required for such synchronization includes a preamble 100 necessary to achieve the synchronization.

The ID field 102 is used to identify the particular data sector while the digital acquisition field may be used to acquire the correct phase. However, the use of such a format introduces a significant overhead in the actual data stored.

The data stored and used by the user will be significantly reduced by the digital acquisition phase synchronization preamble required for the read operation. Thus, if these fields could be made smaller or eliminated entirely the data field containing the actual user data could be increased.

One solution to this problem has been the use of partial response maximum likelihood (PRML) to achieve high area density on hard disk drives. Typically, a PRML channel gains about 30–40 percent more storage capacity than a conventional peak-detection channel.

FIG. 2 illustrates a typical hard disk drive system including the analog front end signal processor and a companion digital ASIC. The analog read signal goes through an automatic gain control (AGC) and filter path and the filter is synchronously sampled by the A/D converter (ADC) which is clocked by the synchronizer SNC phase lock loop PLL. The digitized samples are input to the digital chip where it is further processed by a finite-impulse-response FIR digital filter which equalizes the signal to a PR4 partial response spectrum shape. The signal is finally passed through a Viterbi detector which performs a maximum likelihood sequence detection. The digital read data is then output.

SUMMARY OF THE INVENTION

The present invention reduces the overhead associated with the information located on a disk. The present invention provides a reduction of the digital acquisition field thereby increasing the area available for user data, while determining both the correct frequency and the correct phase in order to successfully perform a read operation. The present invention reads data from a hard disk drive with an extremely low error rate. The present invention provides a zero phase restart so that the synchronization phase lock loop clock will sample the read signal at the correct phase. Additionally, the present invention provides a sample and hold circuit that samples the filtered and equalized read signal at the correct phase. The present invention determines when a signal crosses zero in which to start the phase lock loop. The present invention samples and stores read signal at a very precise phase delay after the signal crosses zero. This phase delay corresponds to the particular frequency being used and is independent of process and temperature variations. The present invention provides a circuit which has a time delay less than 4.5 nano seconds between the output of the VCO and the input to a second sample on hold circuit. The time delay may not exceed ½ the period of the highest frequency clock signal.

FIG. 3 illustrates a good run of a read operation employing the present invention.

The present invention eliminates phase error and consequently eliminates the need to correct for this phase error when reading the hard drive.

The present invention includes an apparatus for switching a first complementary signal and a second complementary signal, including an input circuit to receive the first complementary signal and the second complementary signal, switching circuitry coupled to the input circuit to switch the first complementary signal and the second complementary signal between a high state and a low state, the switching circuitry including two transistors, wherein said switching circuitry switches the first complementary signal and the second complementary signal within two gate delays based on the two transistors.

The present invention includes that the first complementary signal and the second complementary signal alternate between a first level when received by said input circuit and a second level, and that the switch between the first complementary signal and said second complementary signal are switched between the high state and a low state within 1.4 nano seconds.

Furthermore, the present invention includes a circuit for switching between a first complementary signal and a second complementary signal, including, an input circuit to receive the first complementary signal with respect to a first level and the second complementary signal with respect to said first level, a switch coupled to the input circuit to switch the first complementary signal and the second complementary signal between a high state and a low state, a inverting circuit coupled to switch to maintain an output of the inverting circuit at a threshold voltage of the inverting circuit, a pair of voltage limiting devices coupled to said output of said inverting circuit and coupled to said switch to output said first and second complementary circuits at a second level.

The present invention further includes that the output of the inverter is directly coupled to an input of the inverter.

A circuit for switching between a first complementary signal and a second complementary signal wherein said pair of voltage liniting devices are resistors.

A circuit for switching between a first complementary signal and a second complementary signal wherein said resistors have substantially the same resistance.

A circuit for switching between a first complementary signal and a second complementary signal wherein each of said voltage limiting devices are coupled to another transistor.

DETAILED DESCRIPTION OF THE DRAWINGS

FIG. 6 illustrates the low jitter of the present invention;

FIG. 7 illustrates the differential to CMOS comparator of the present invention;

Figure 9:
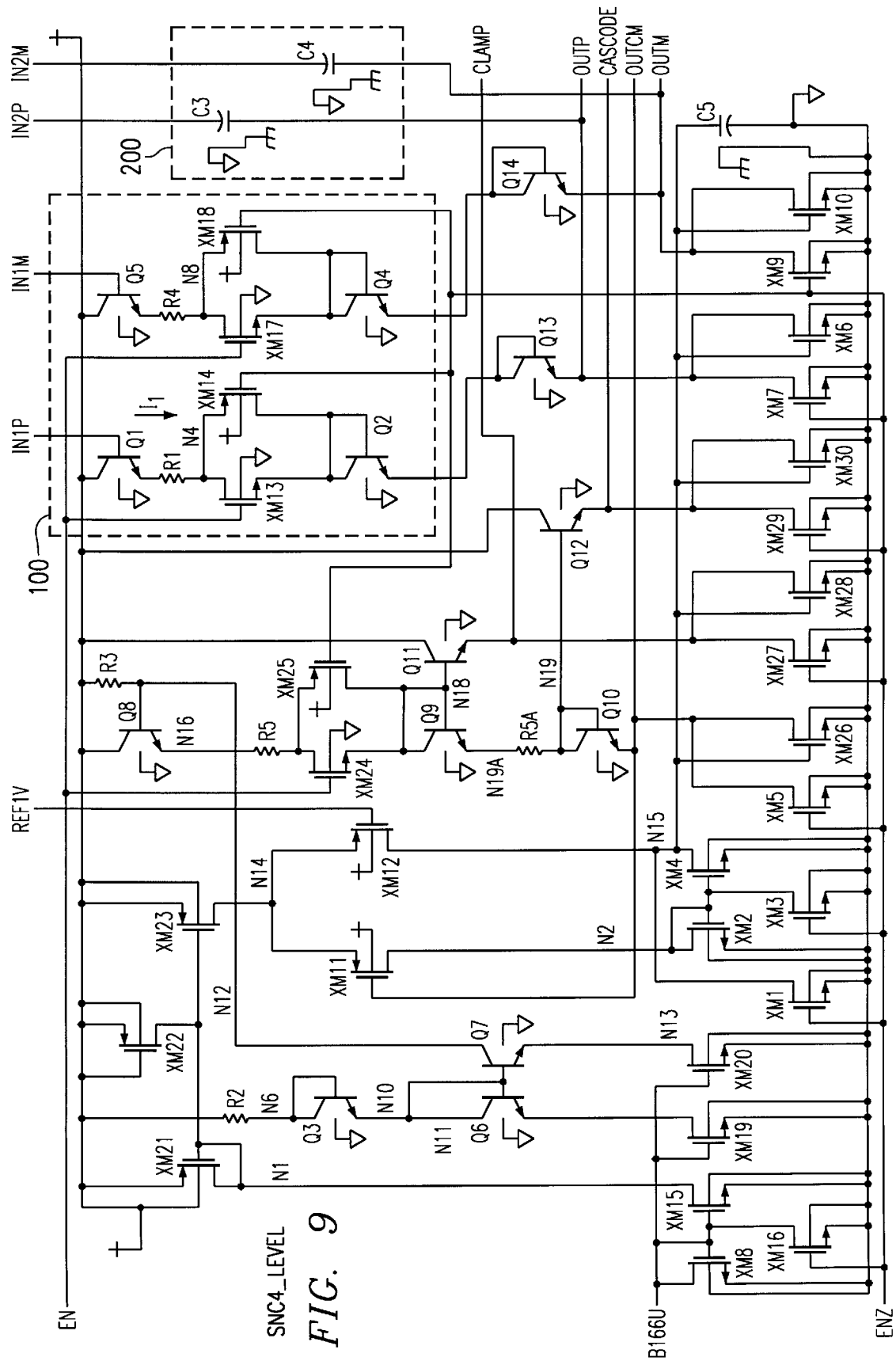
Figure 10A:
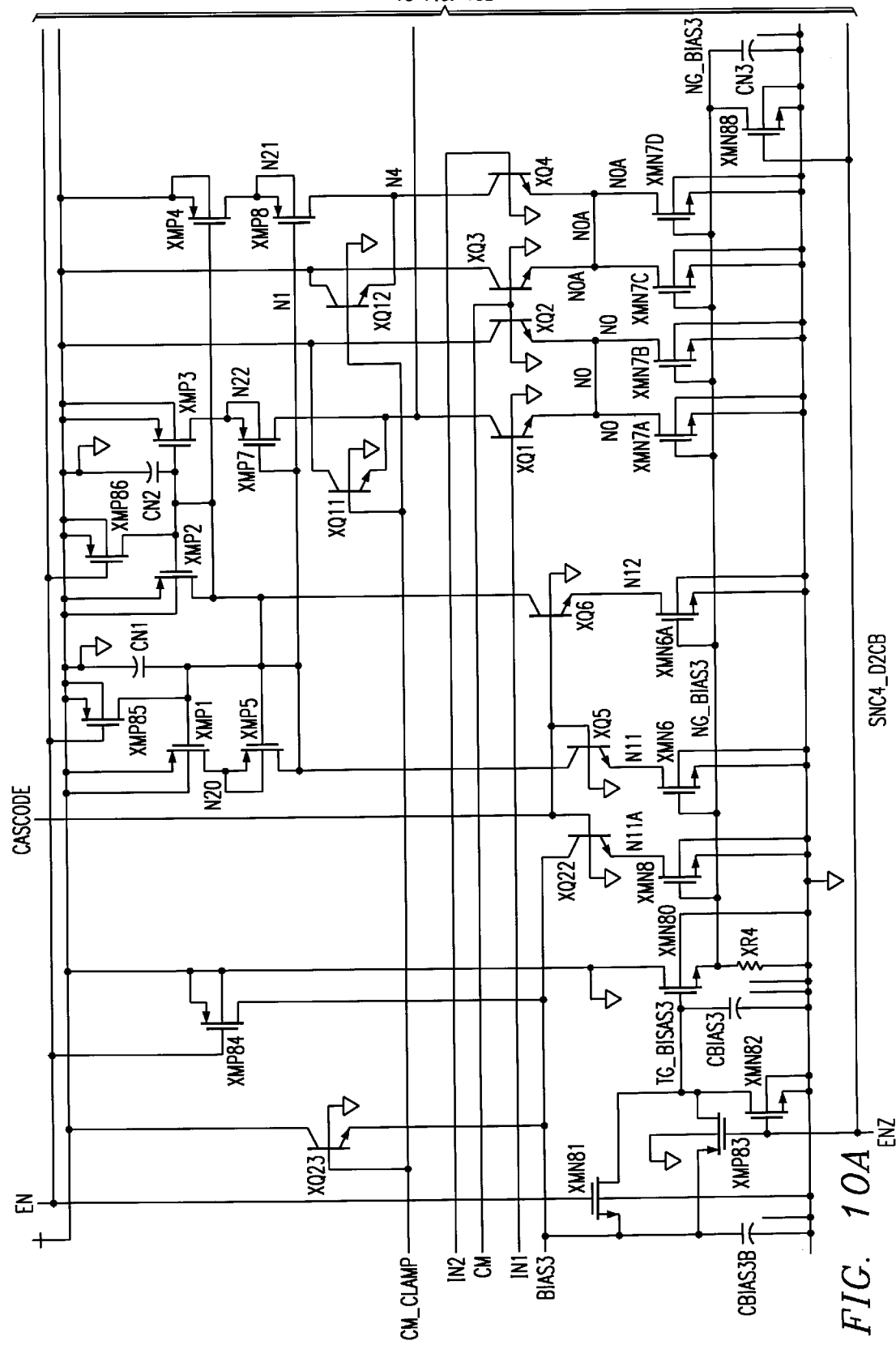
Figure 10B:
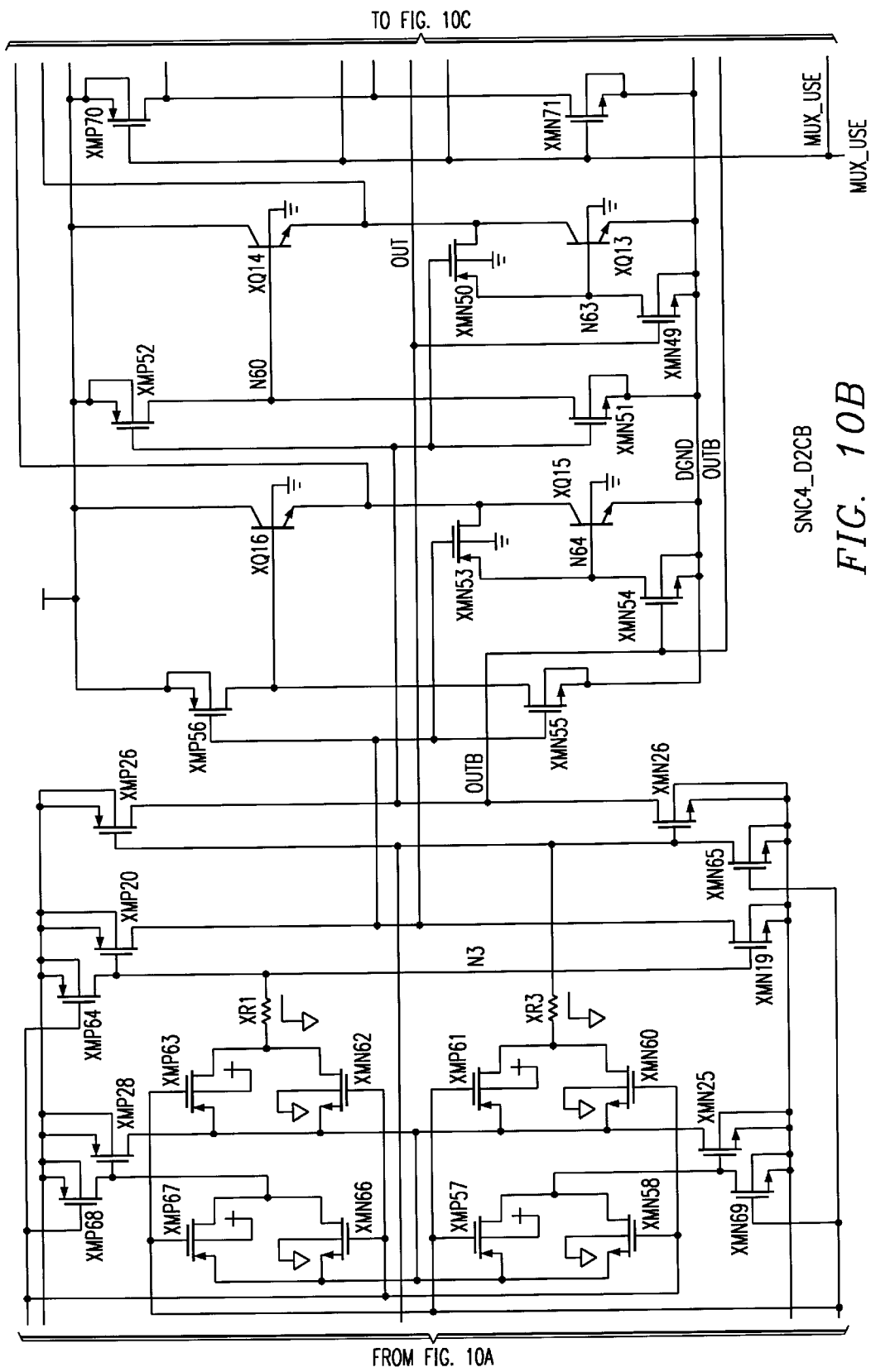
Figure 10C:
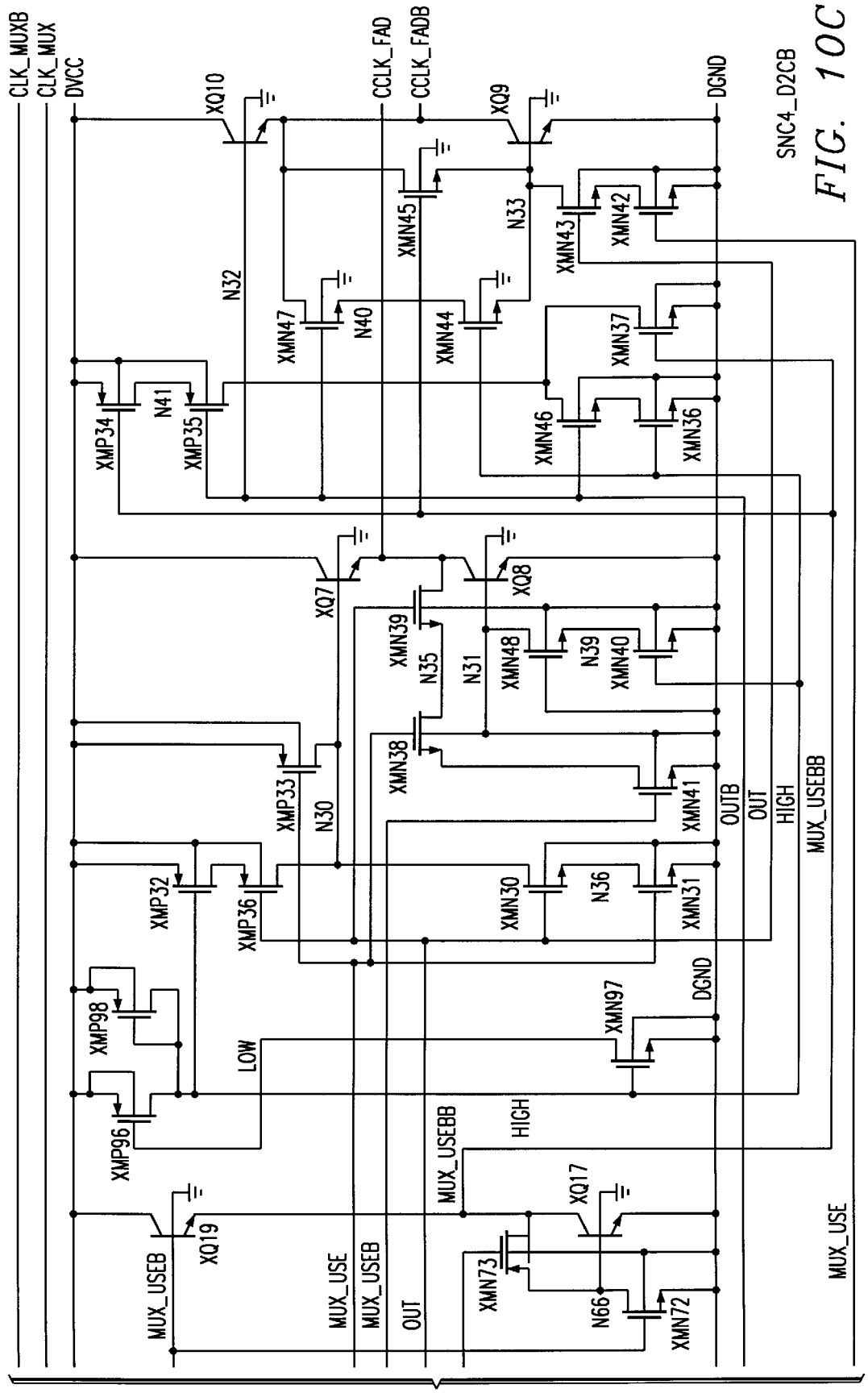
Figure 12A:
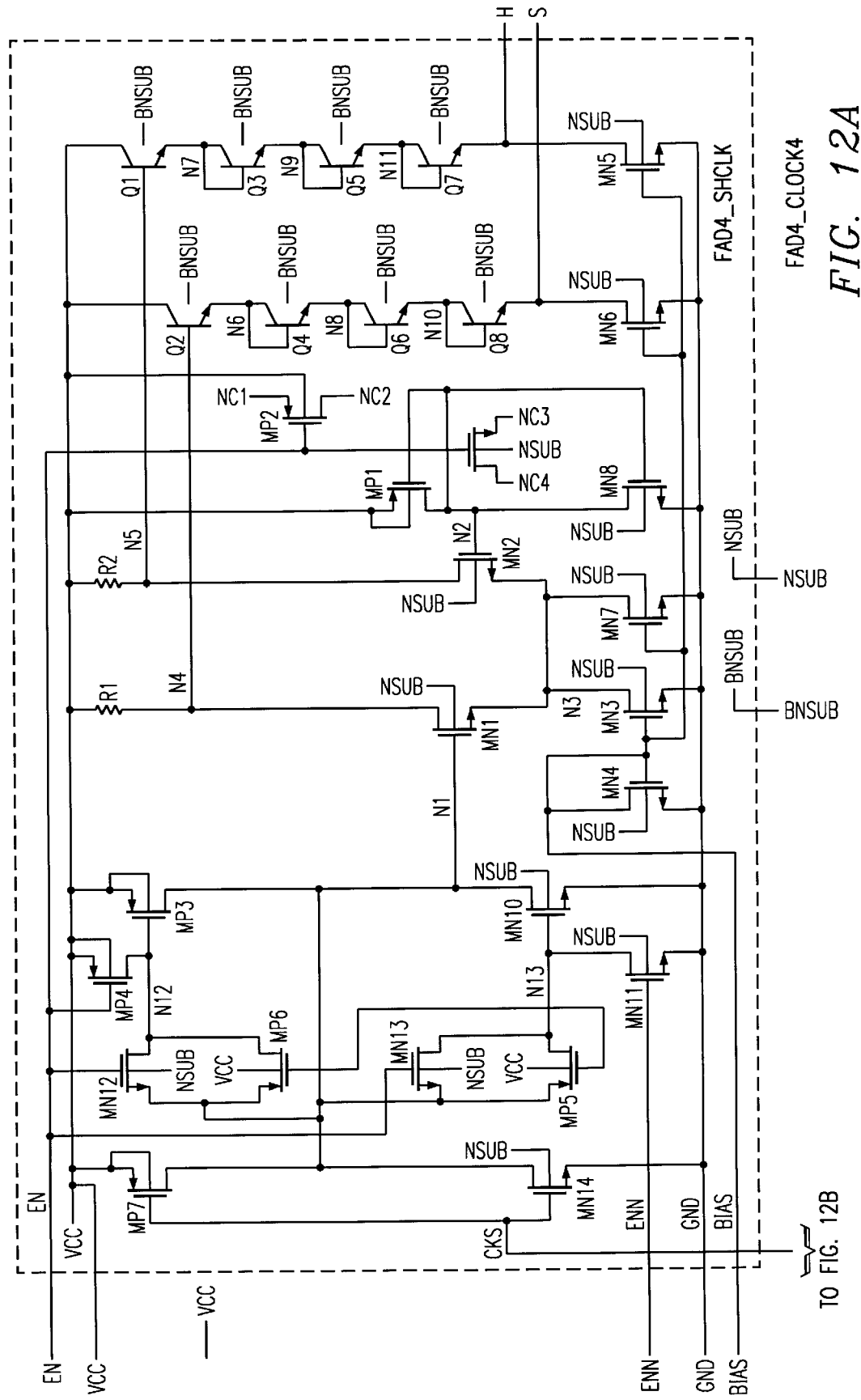
Figure 12B:
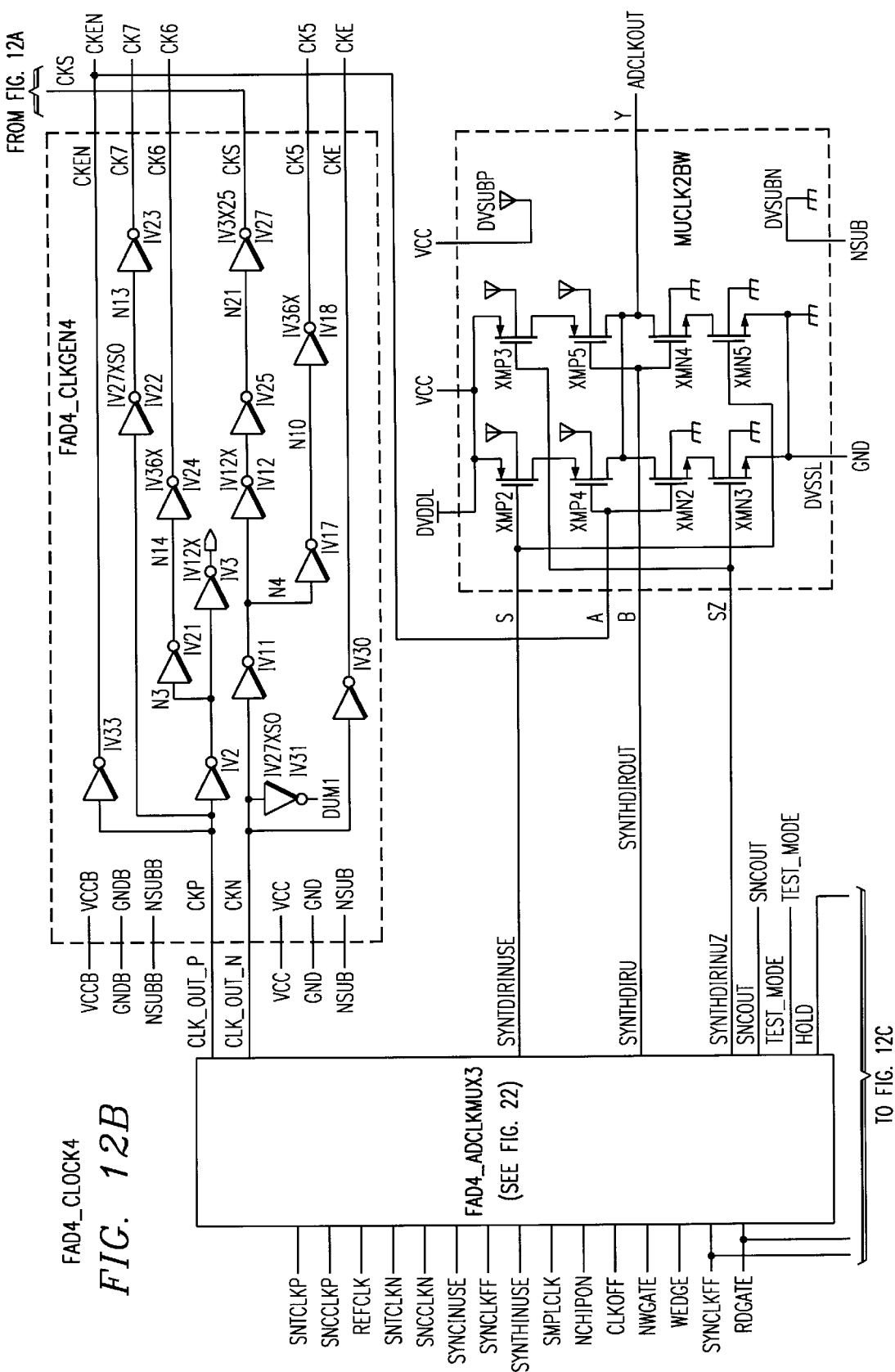
Figure 12C:
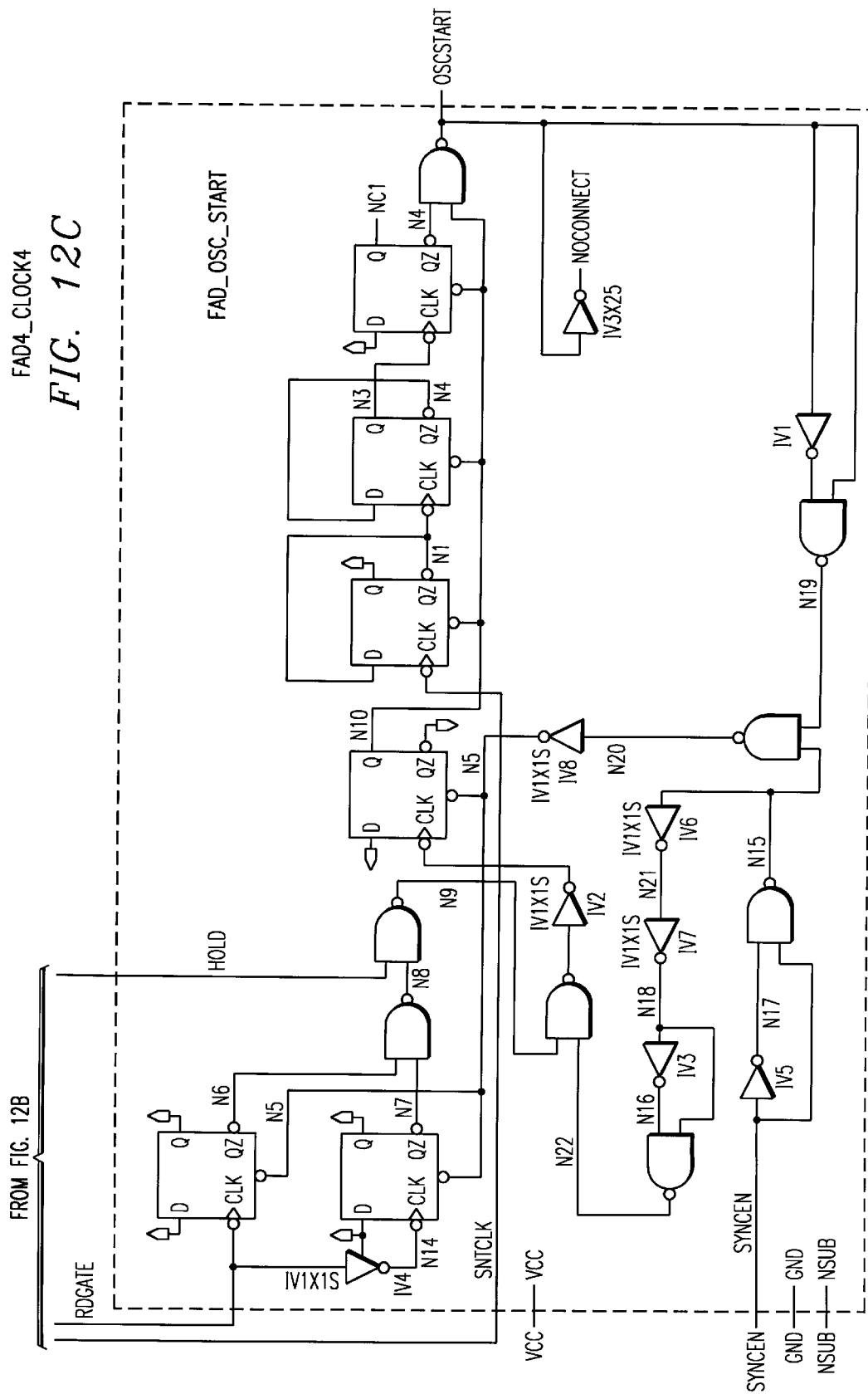
Figure 13A:
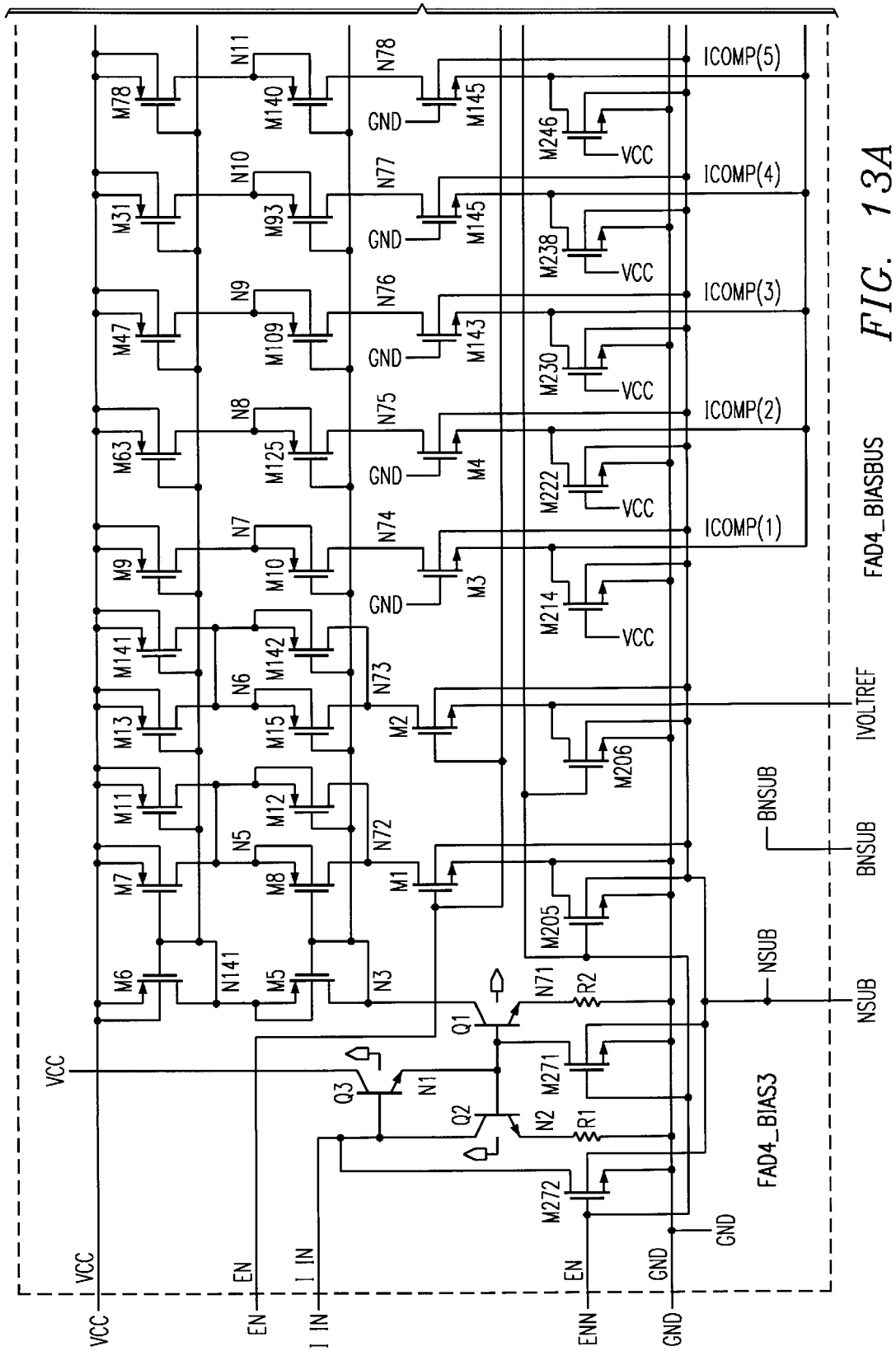
Figure 13B:
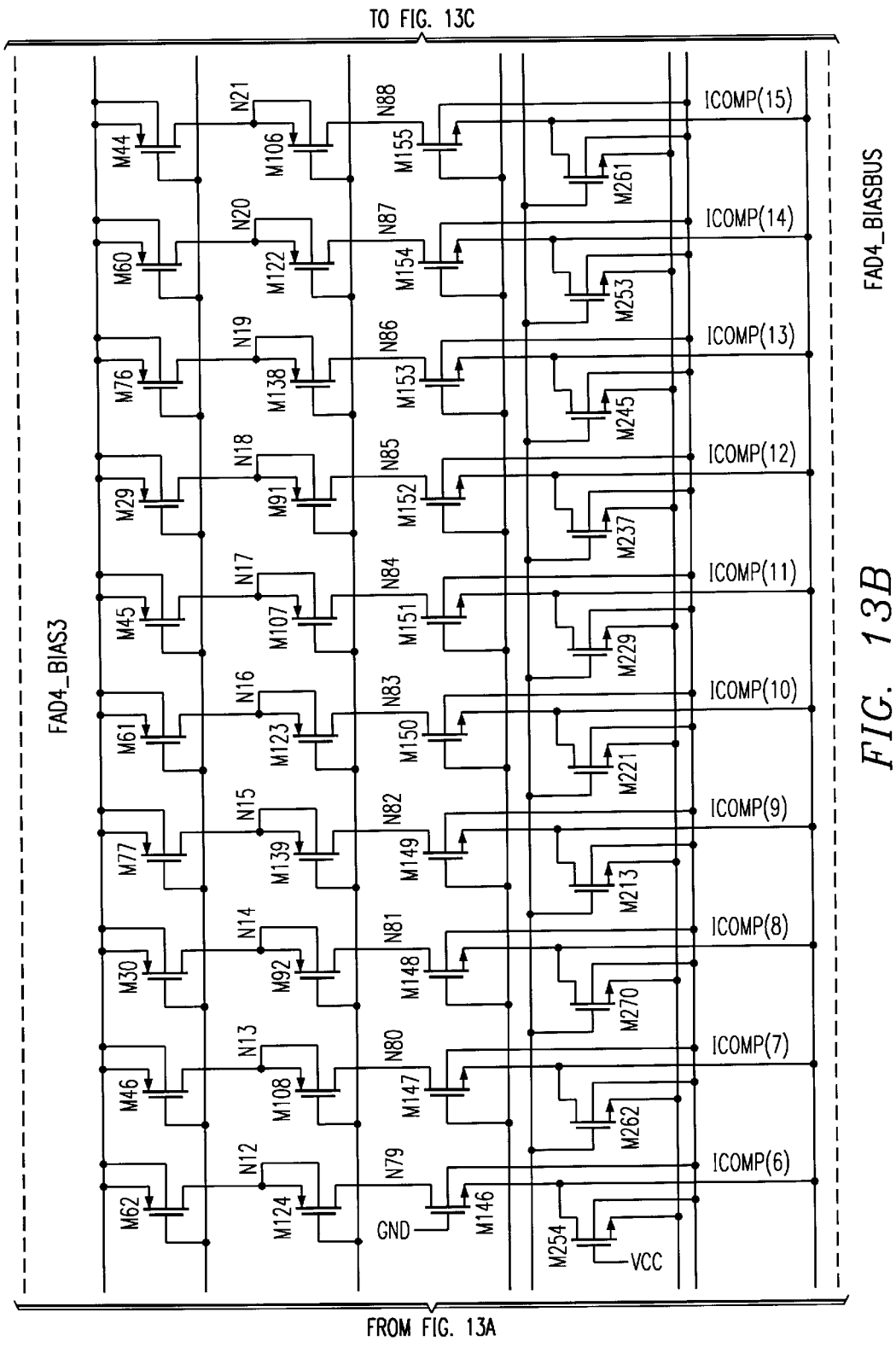
Figure 13C:
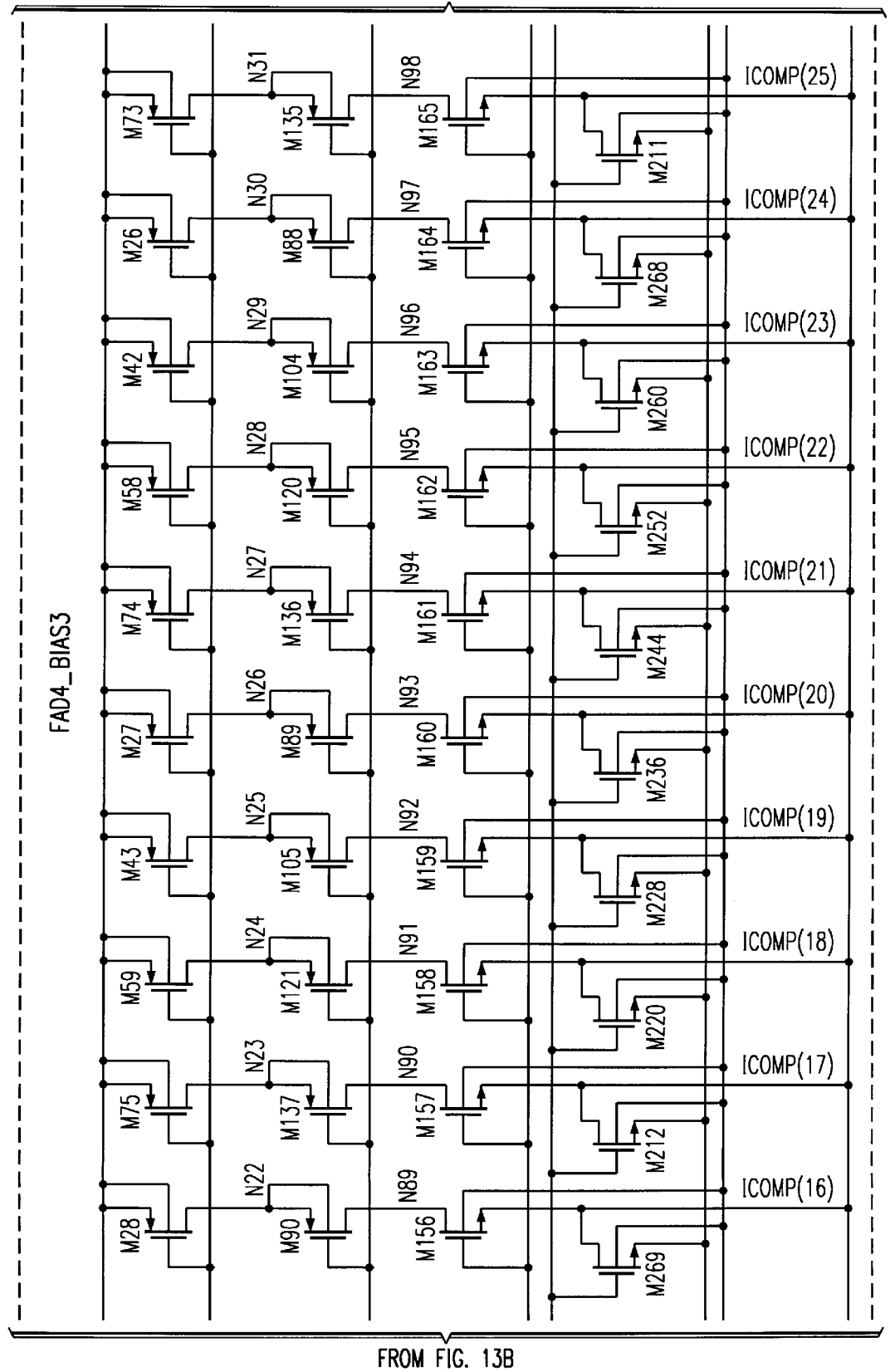
Figure 13D:
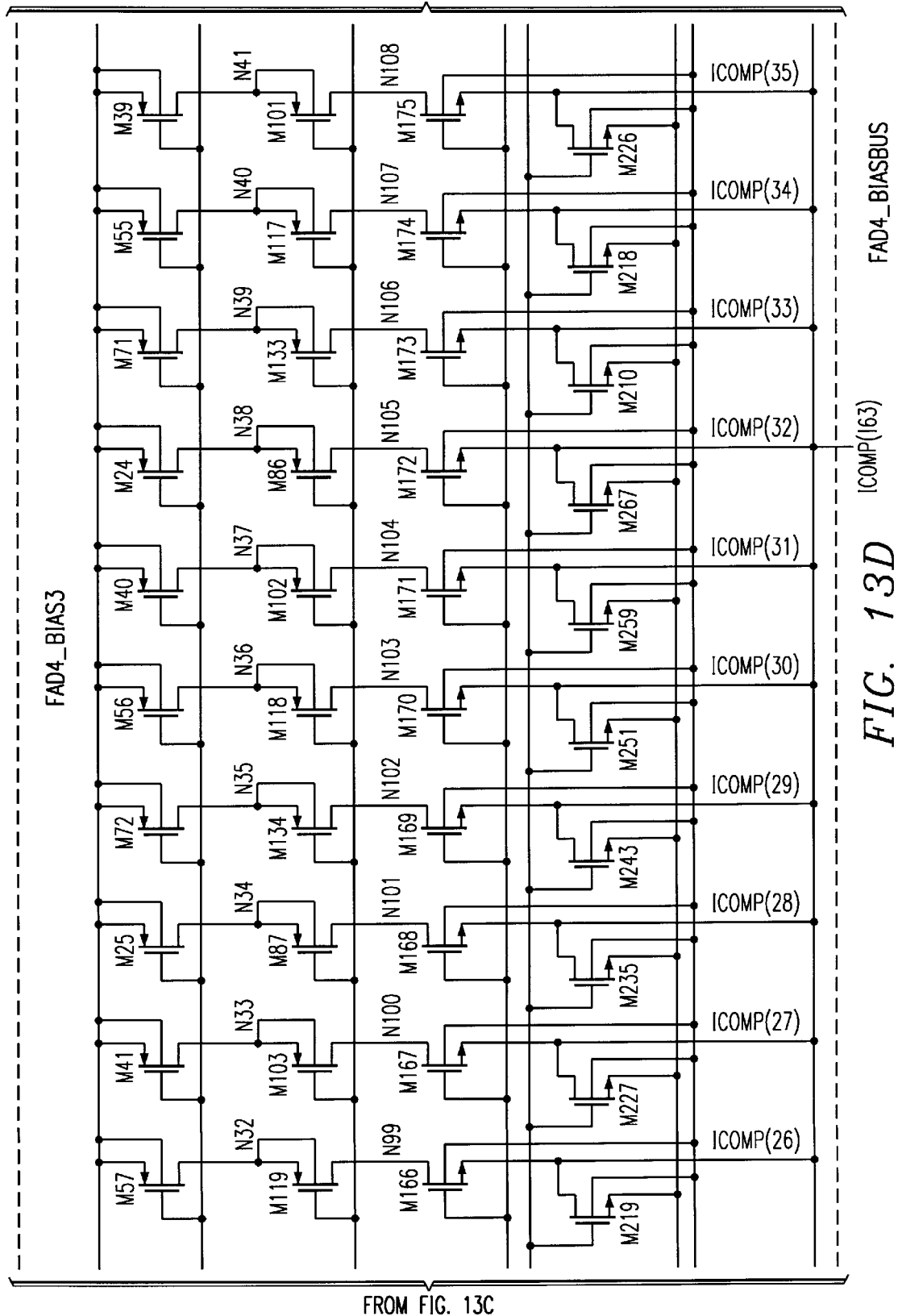
Figure 13E:
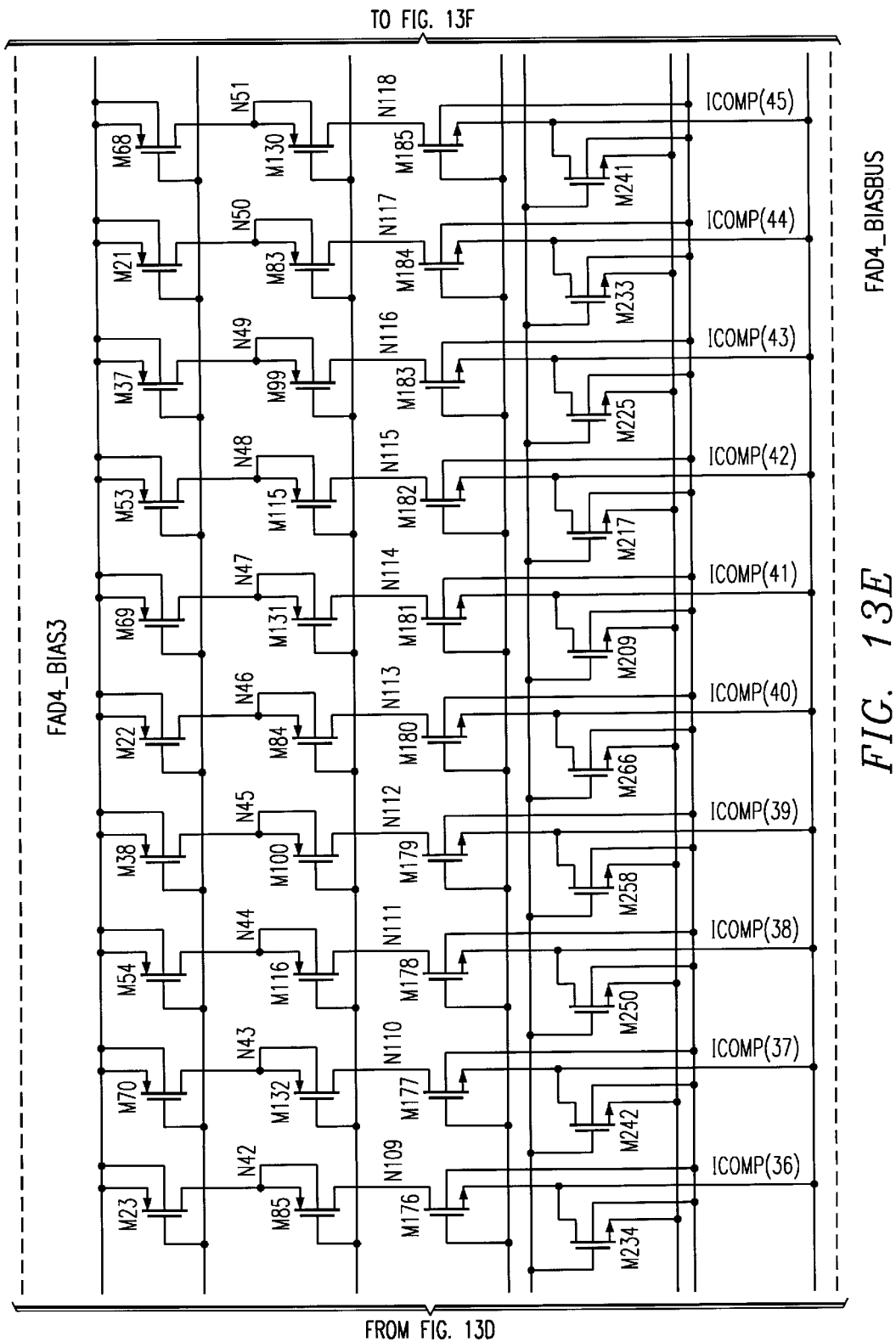
Figure 13F:
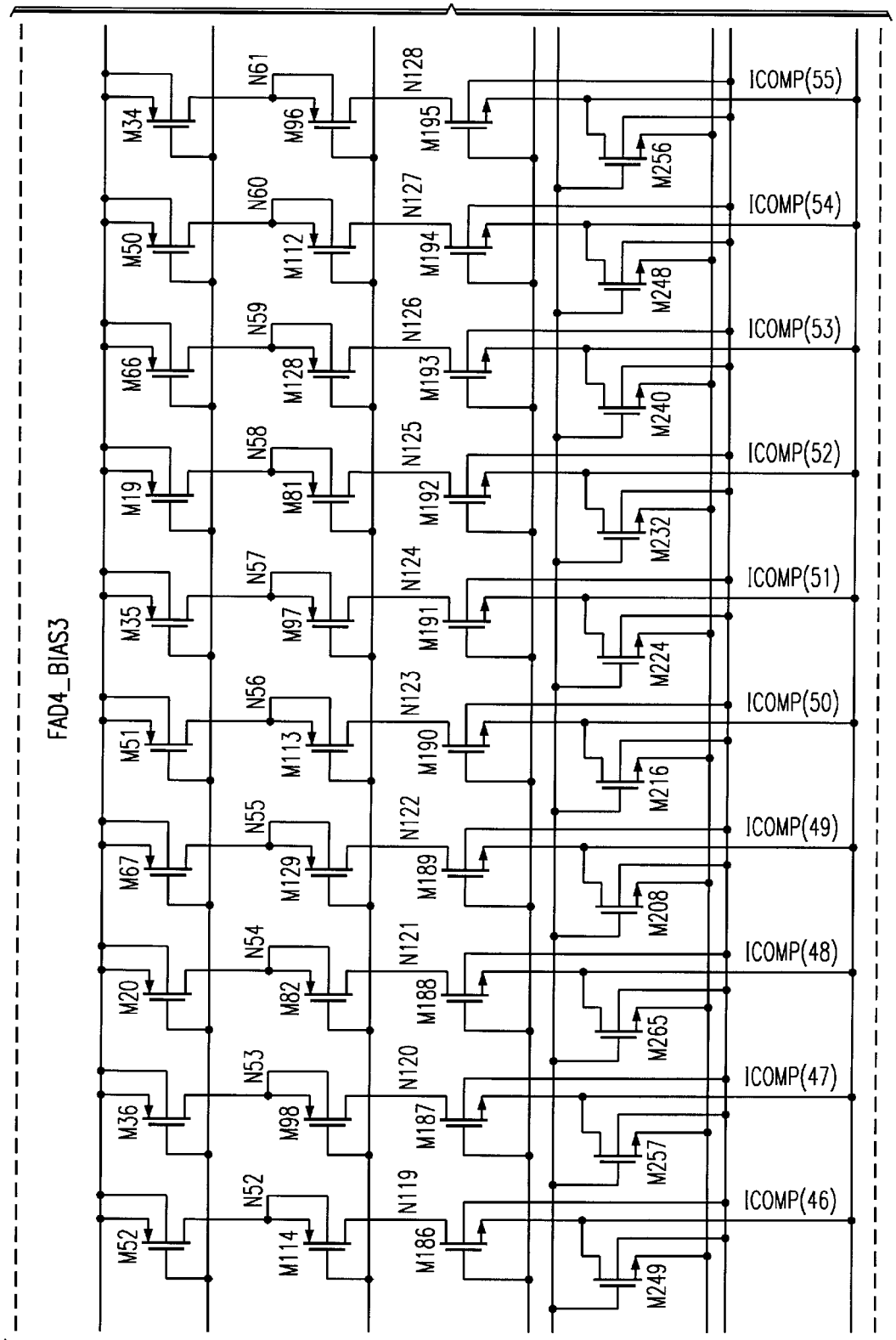
Figure 13G:
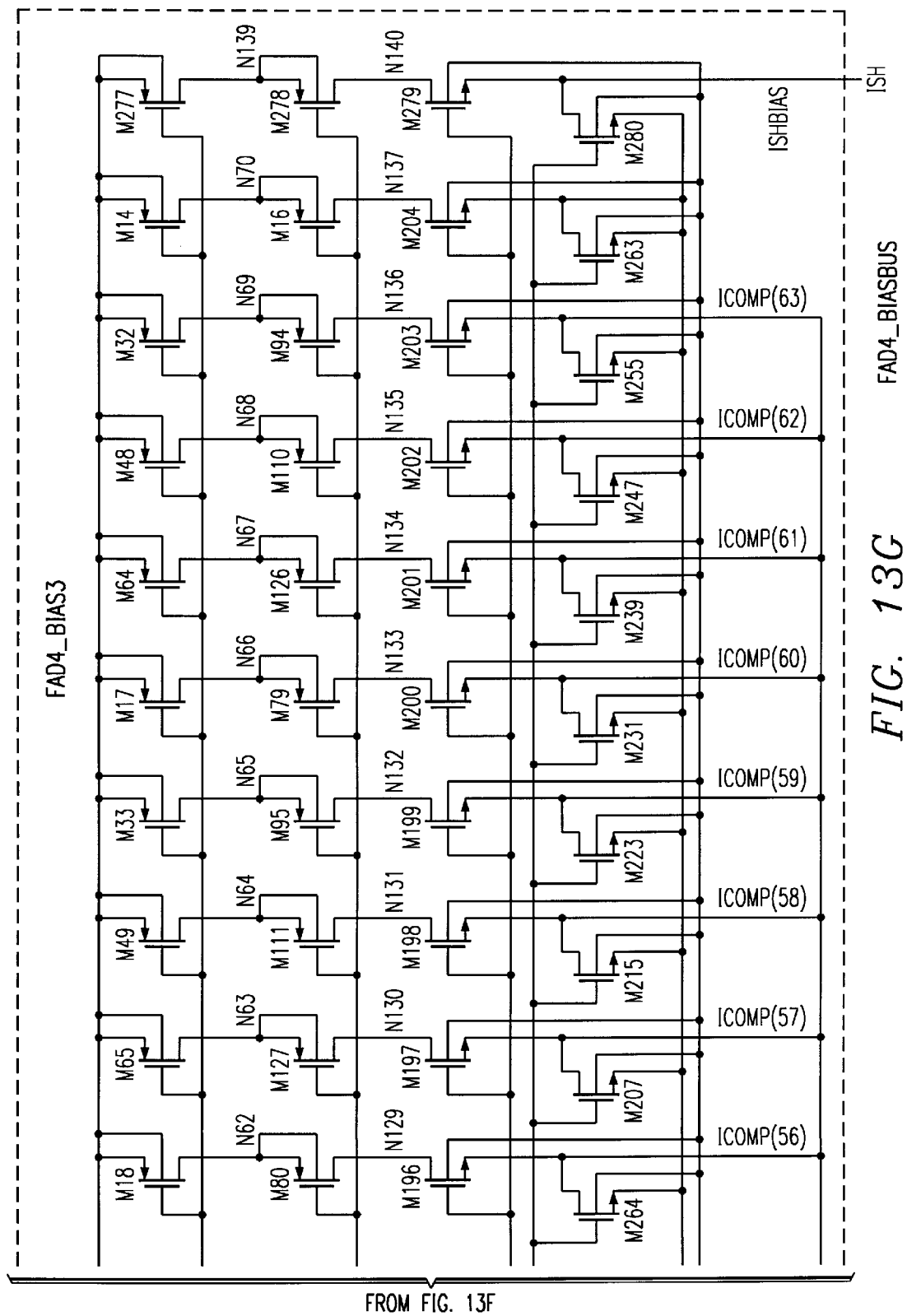
Figure 14A:
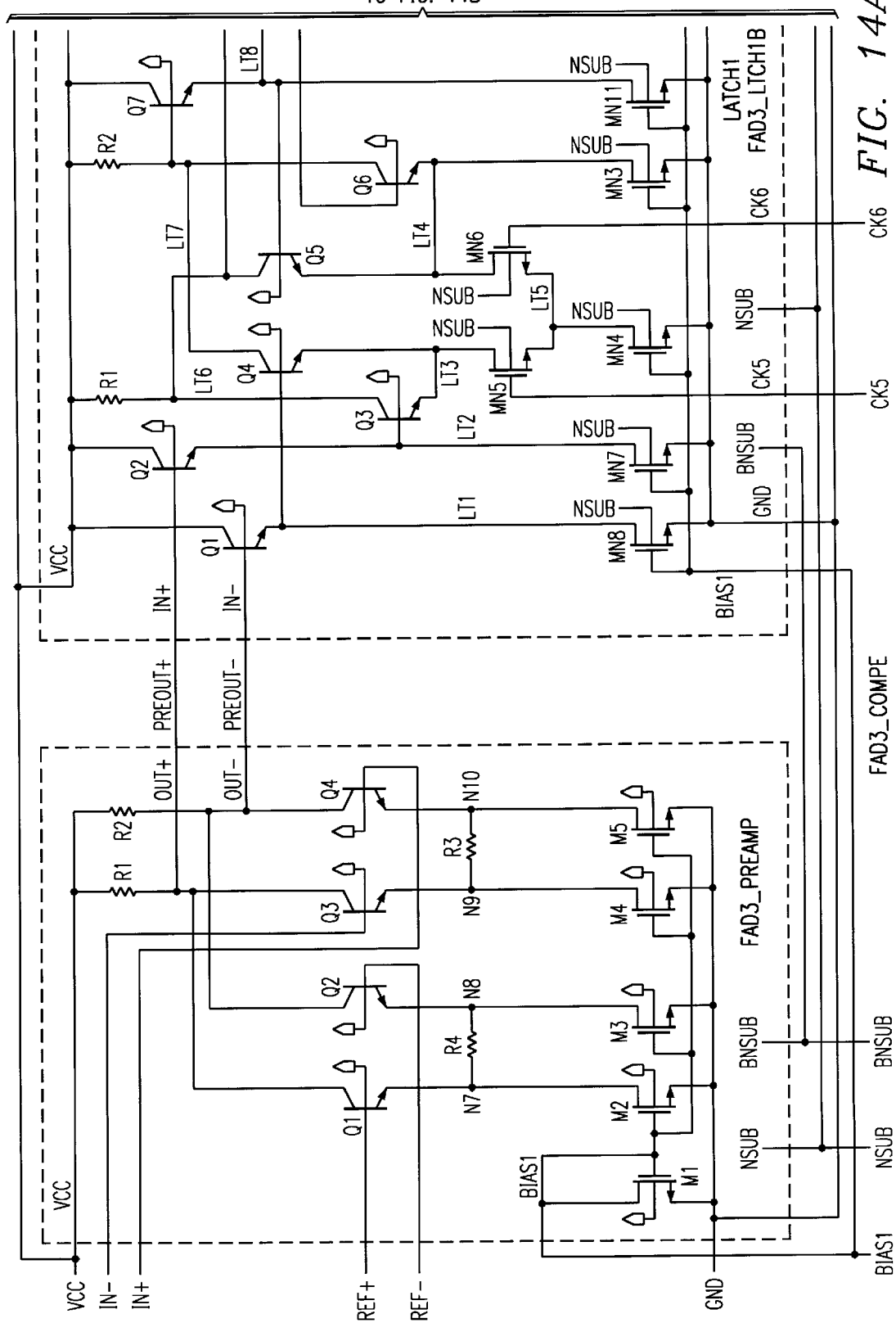
Figure 14B:
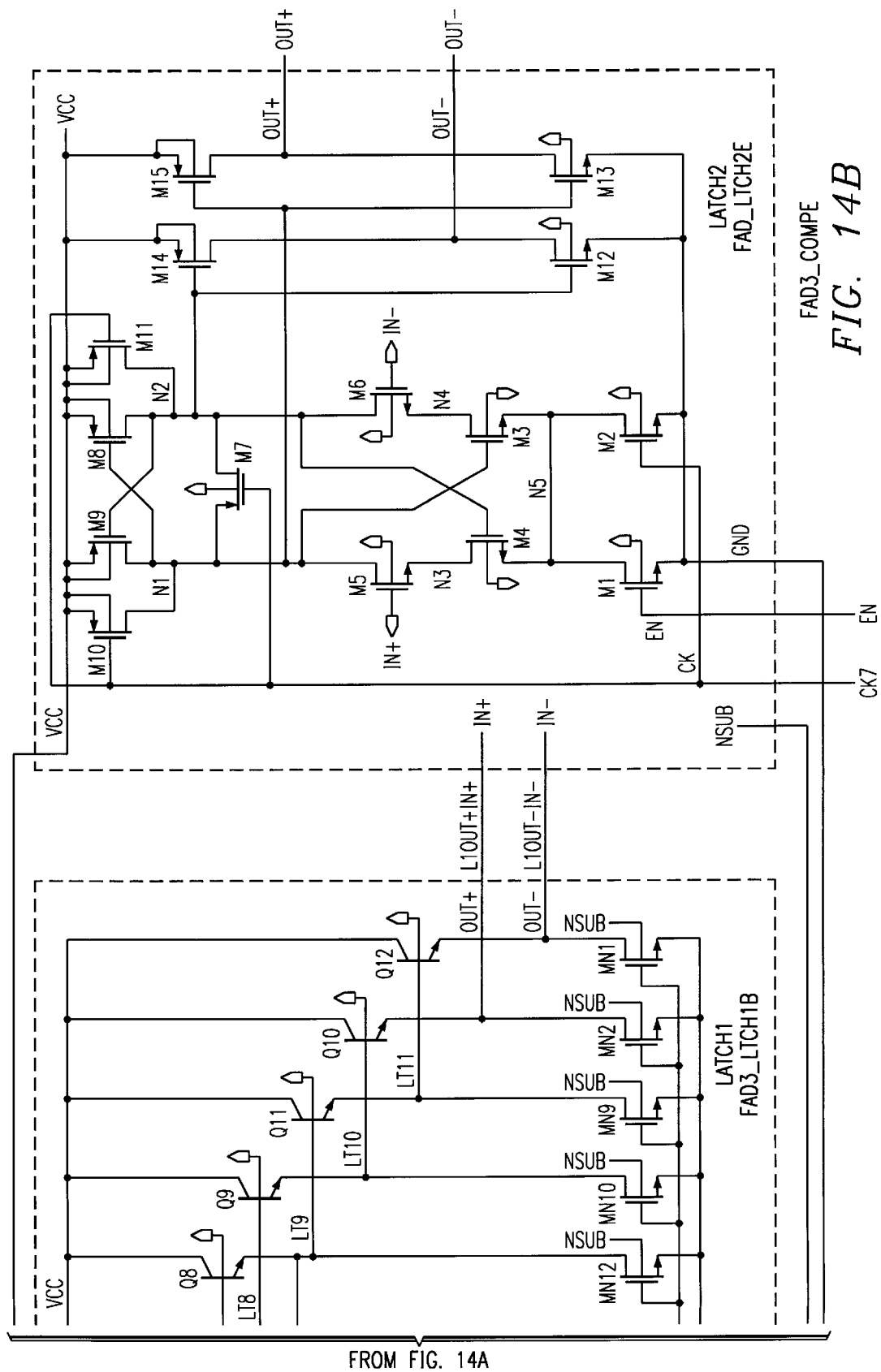
Figure 15A:
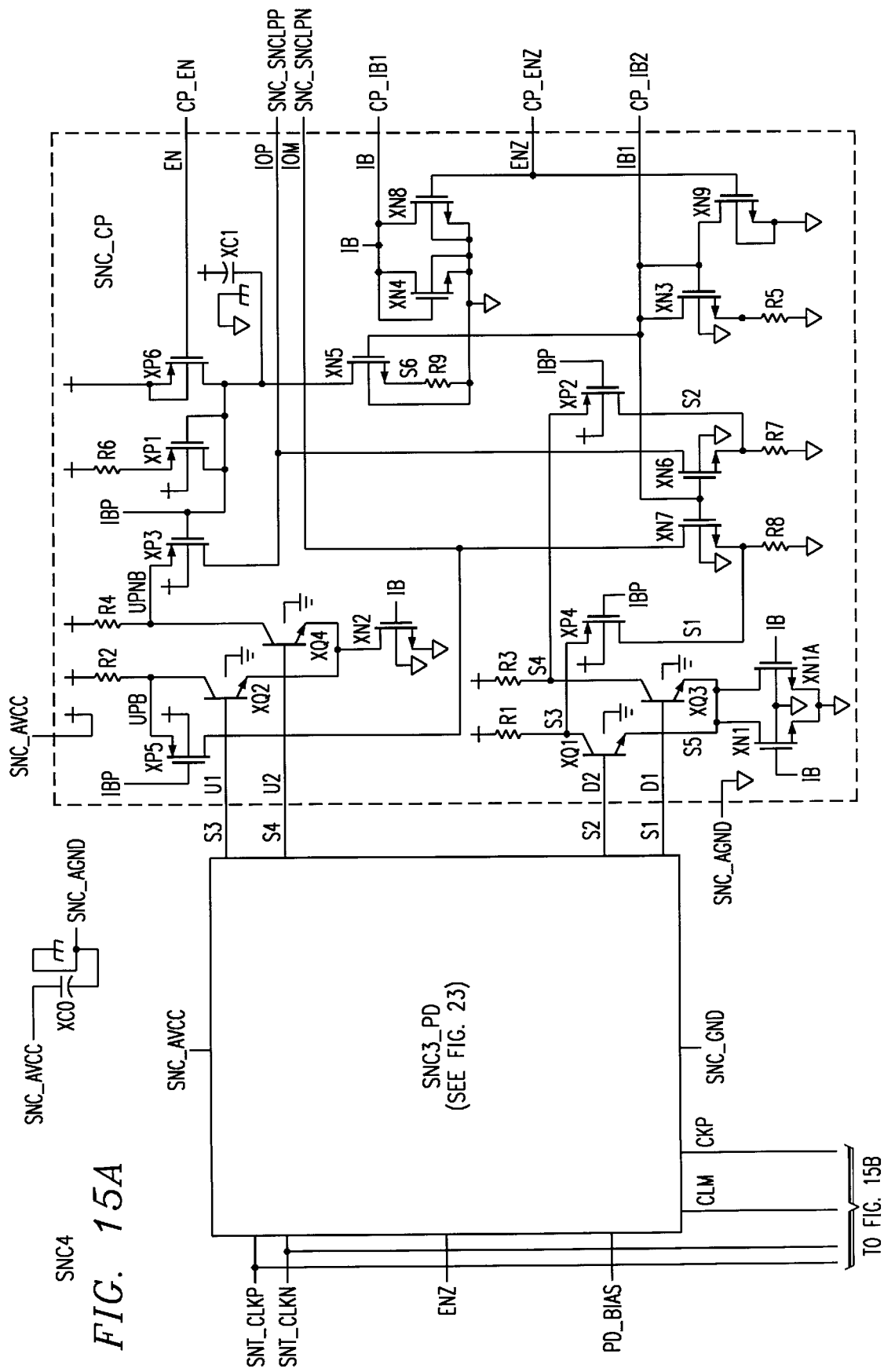
Figure 15B:
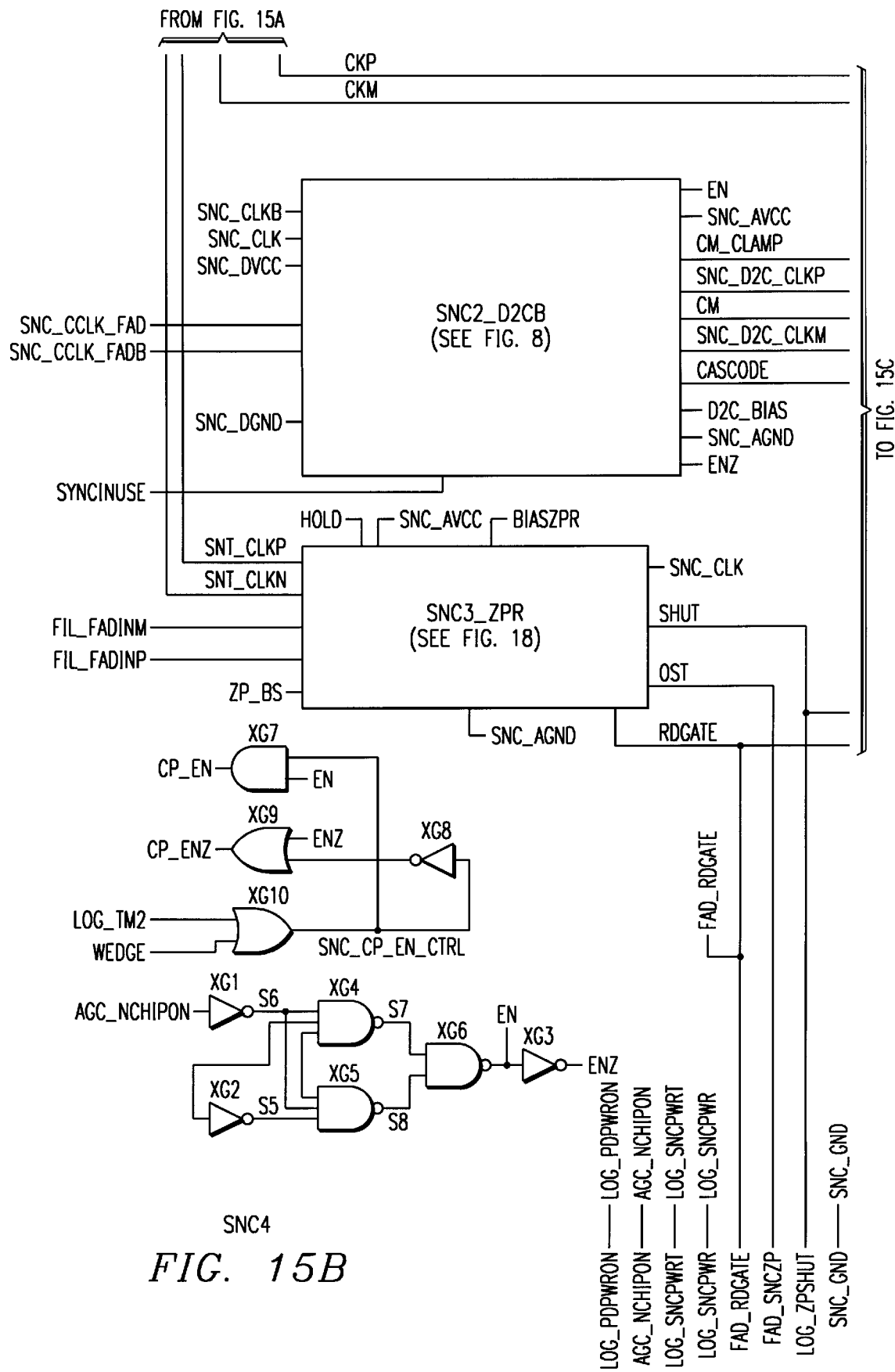
Figure 15C:
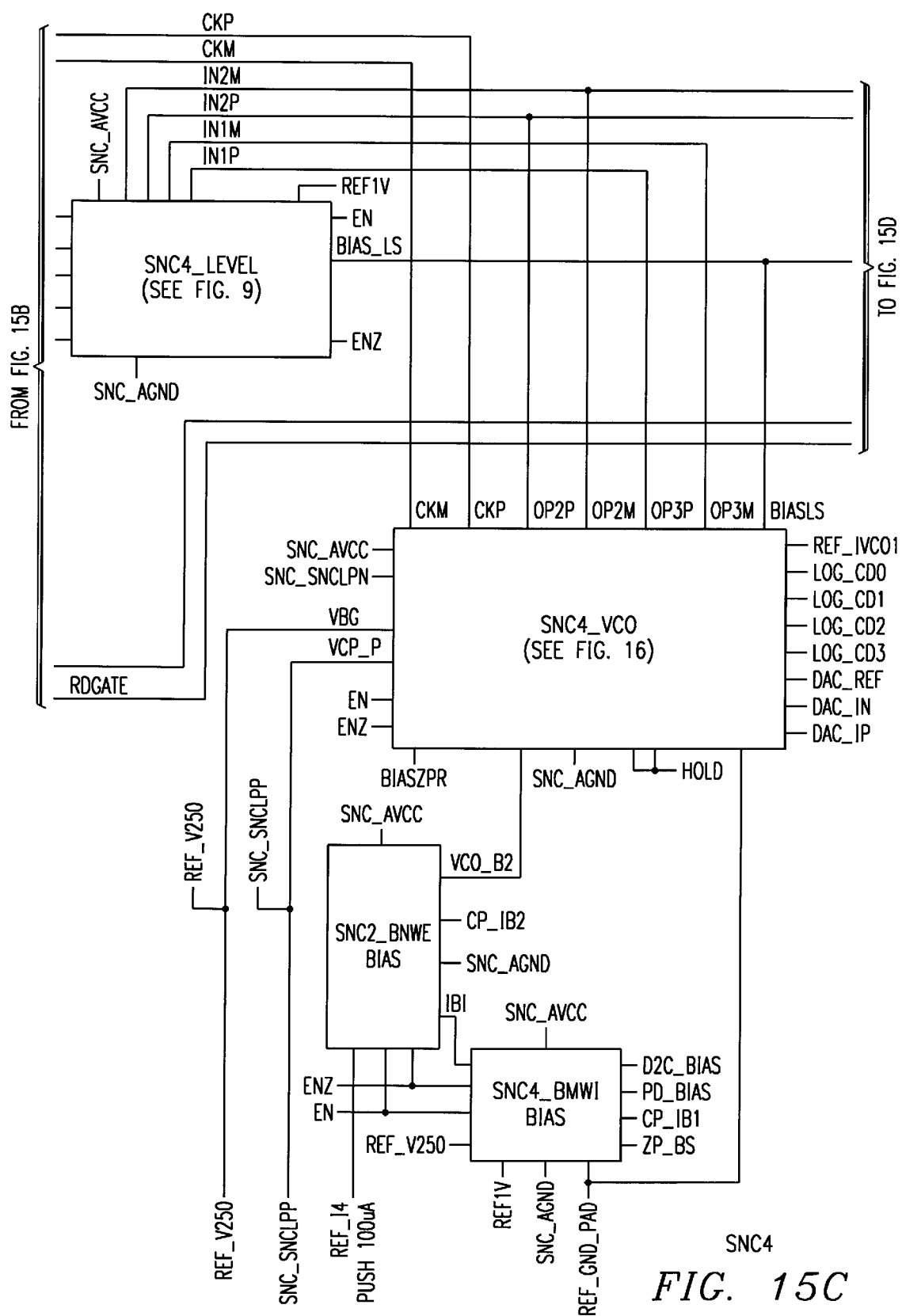
Figure 15D:
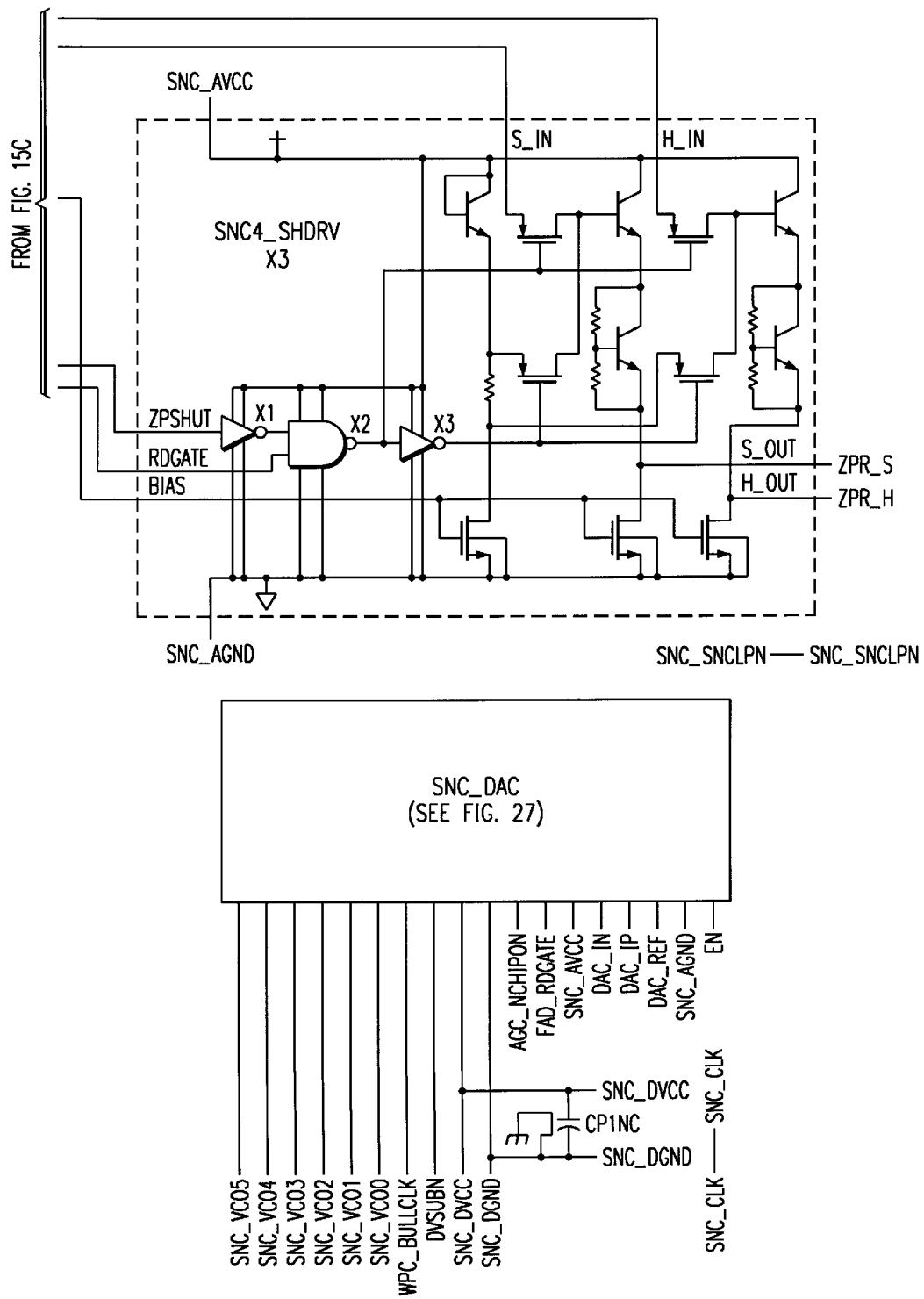
Figure 16A:
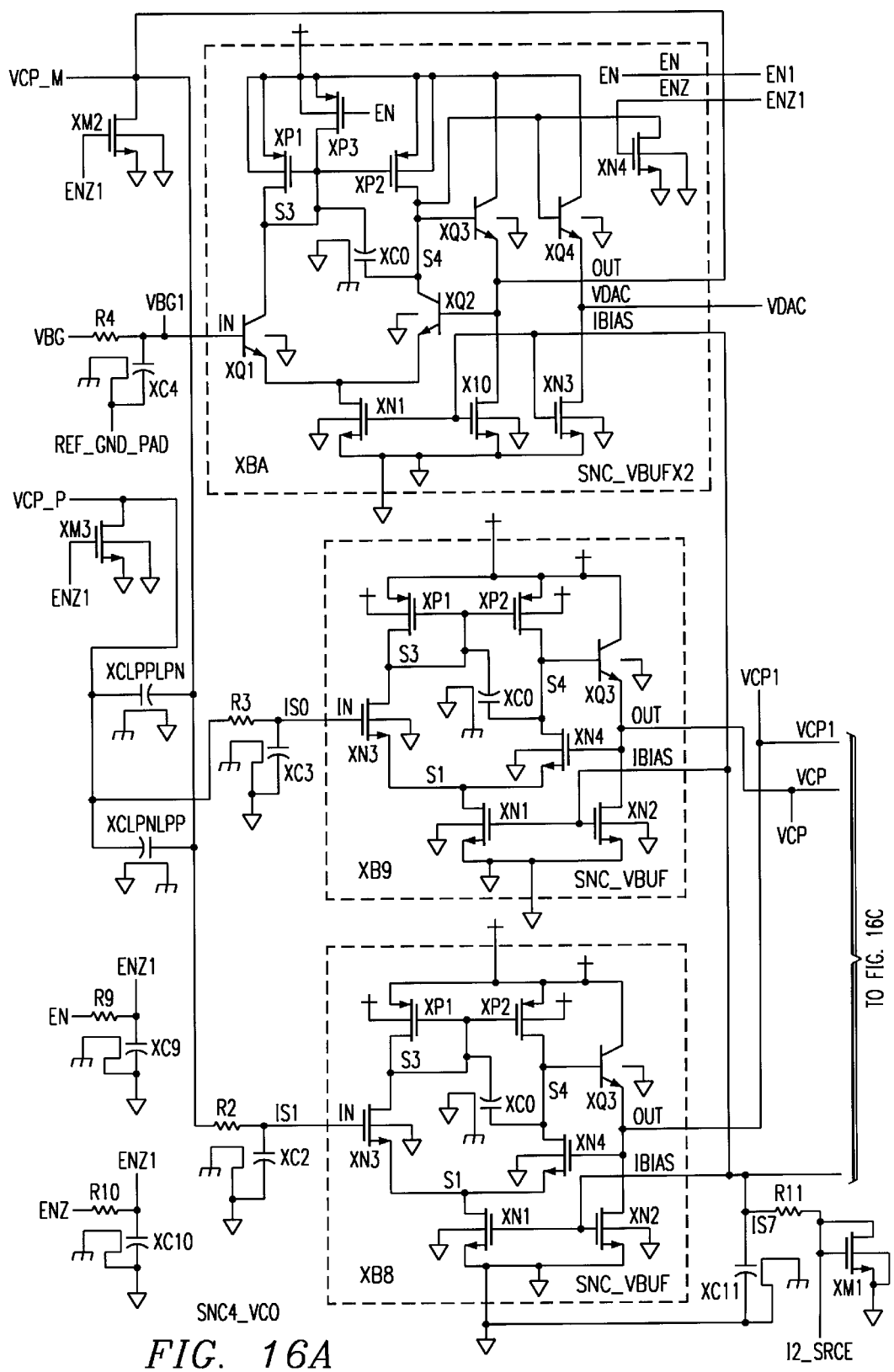
Figure 16B:
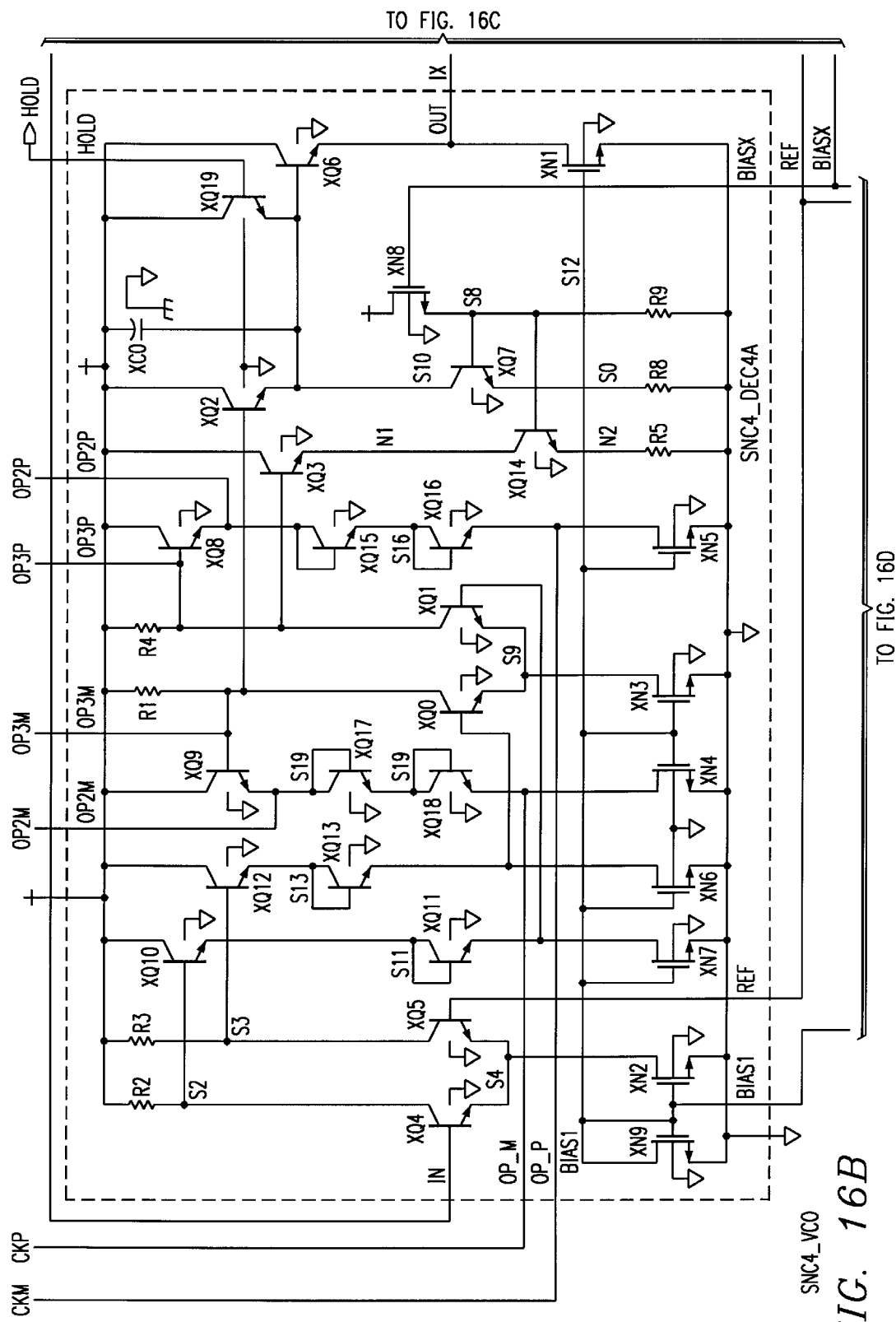
Figure 16C:
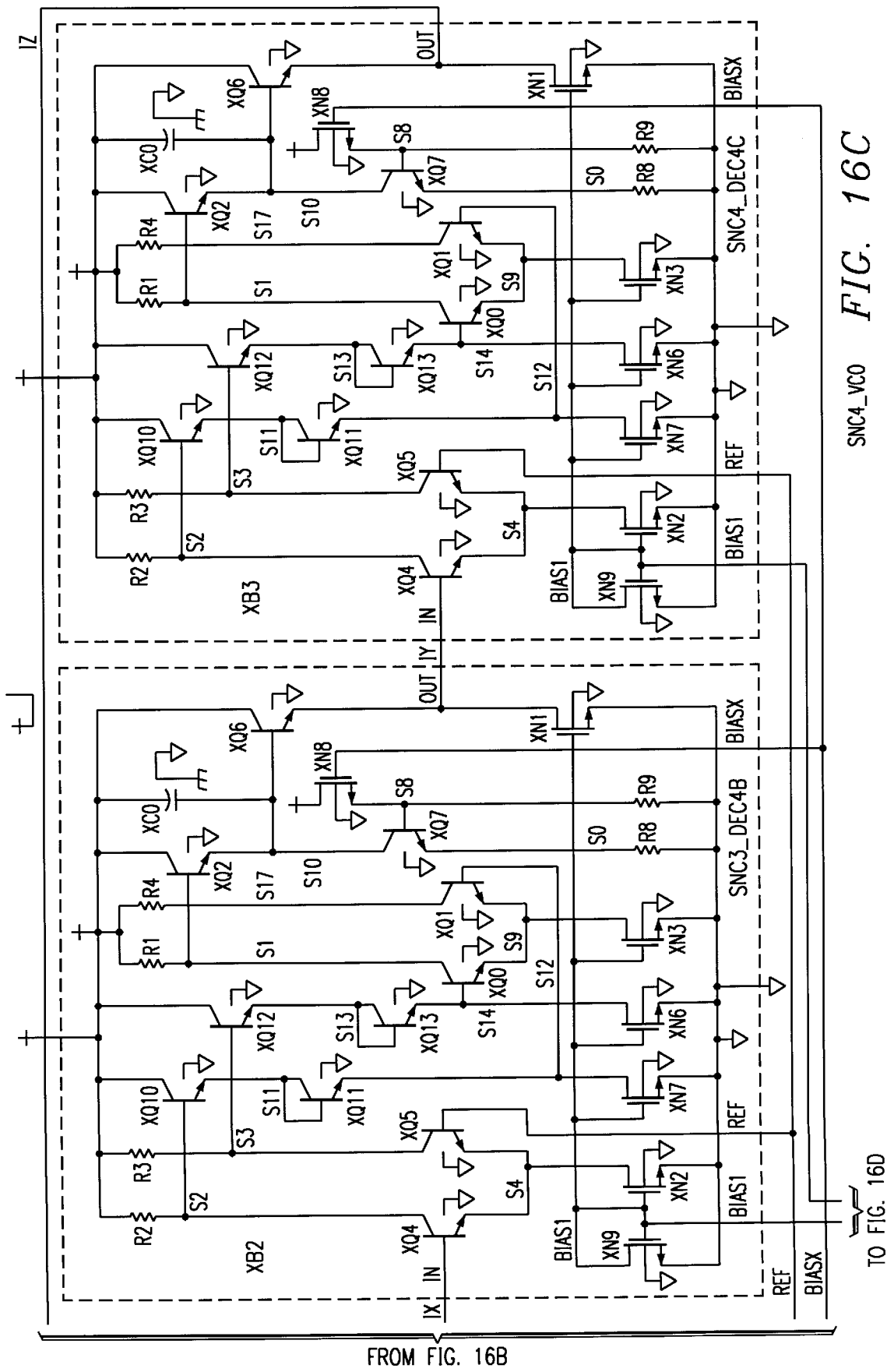
Figure 16D:
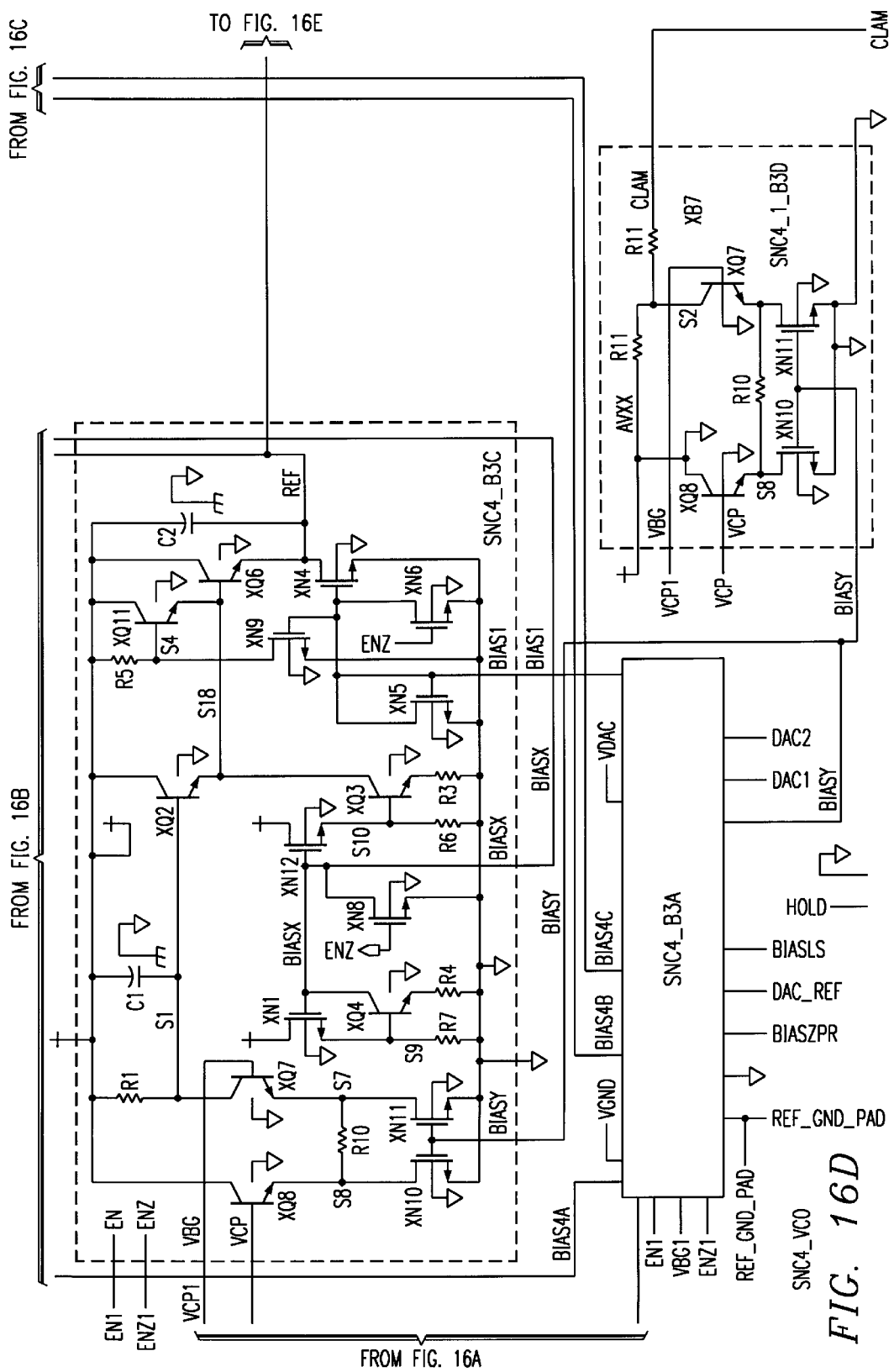
Figure 16E:
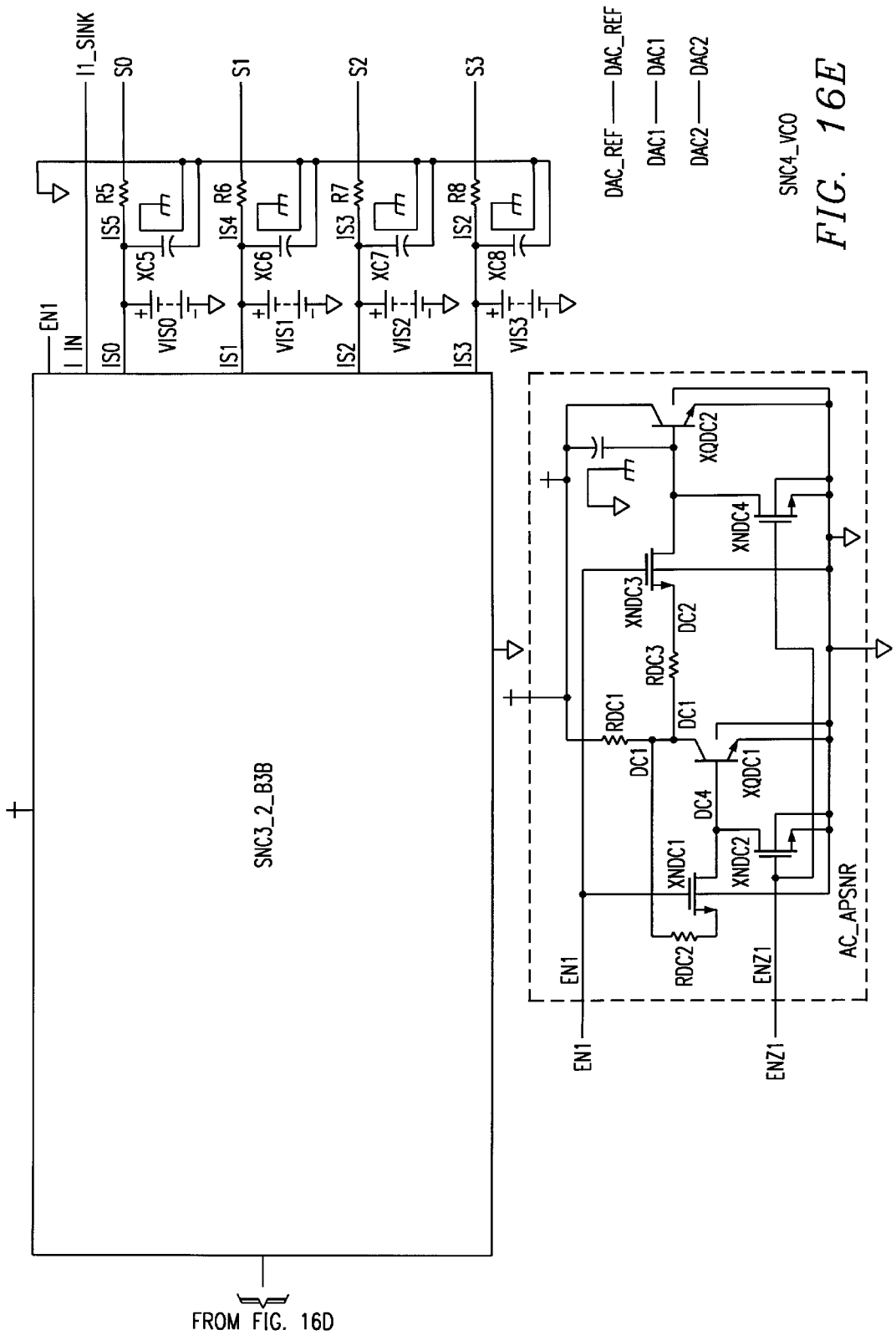
Figure 17:
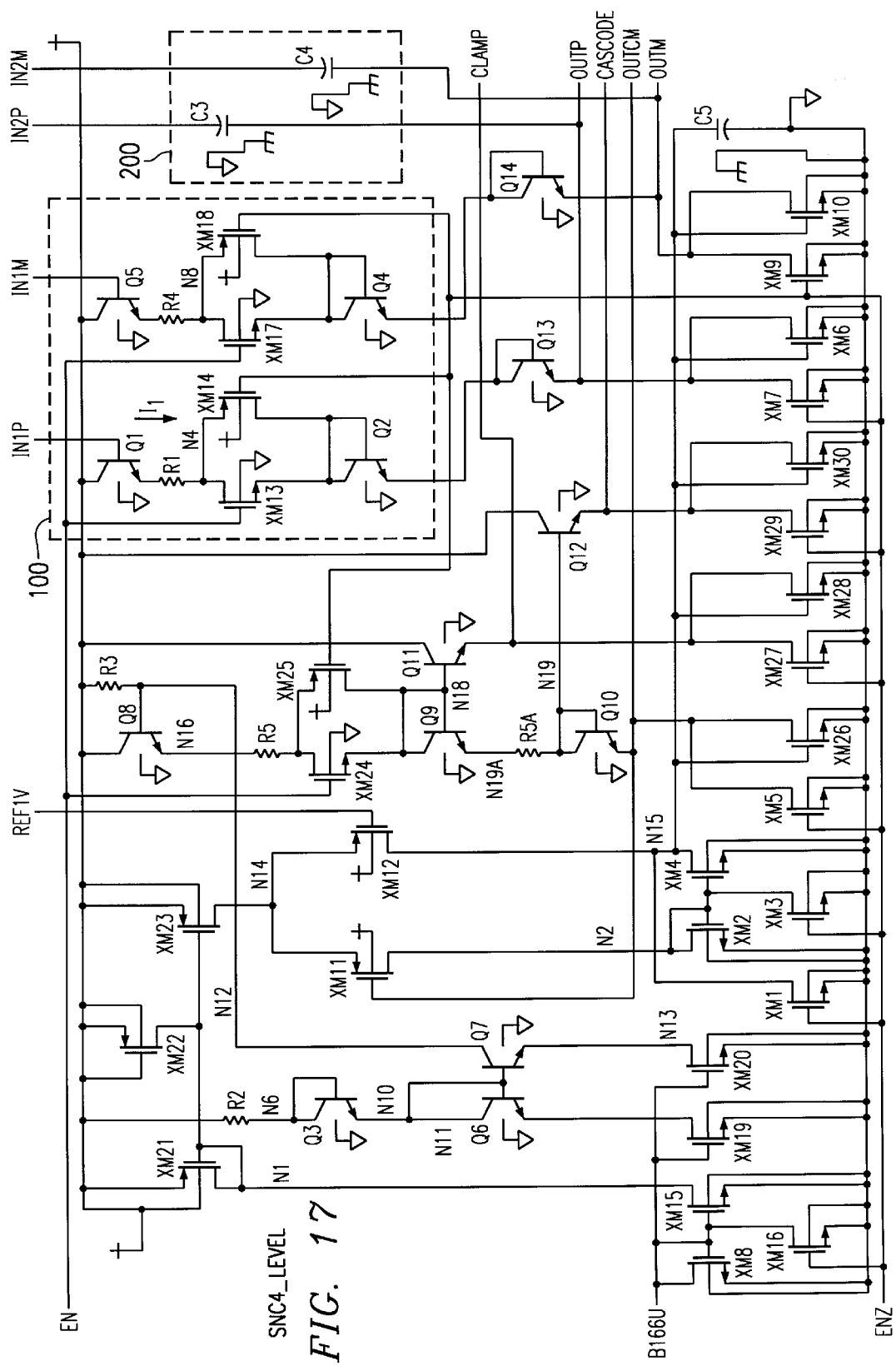
Figure 18A:
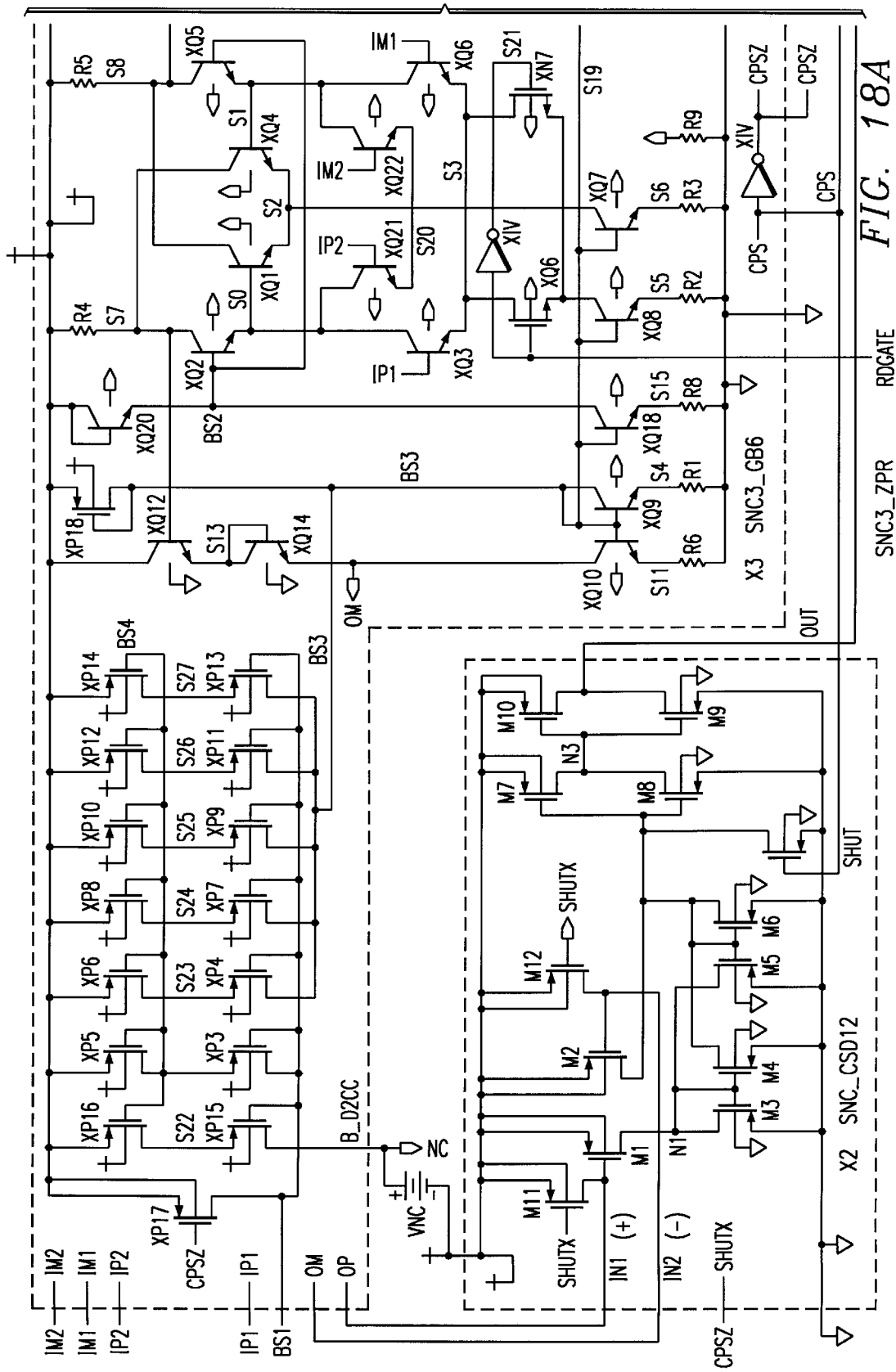
Figure 18B:
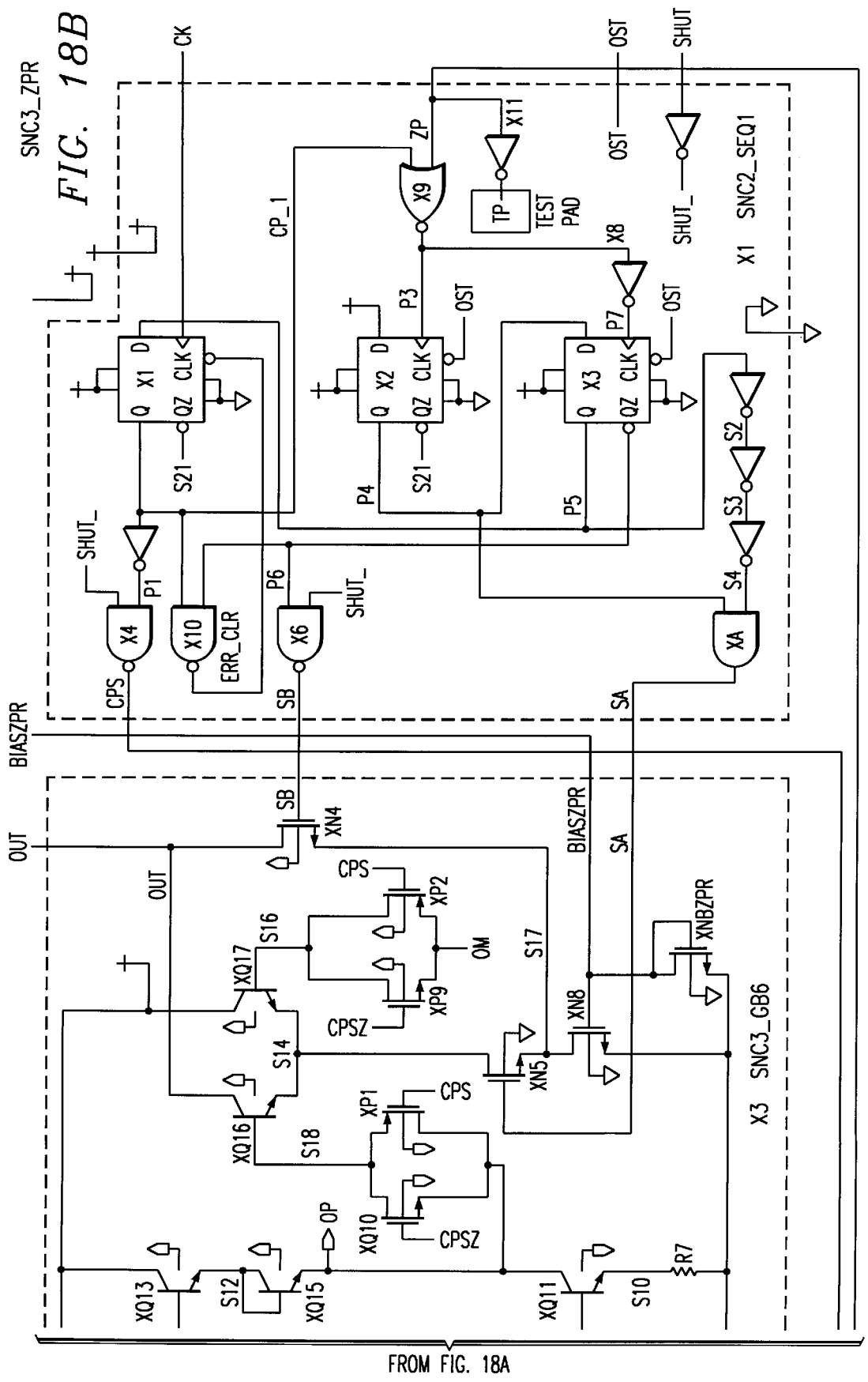
Figure 19B:
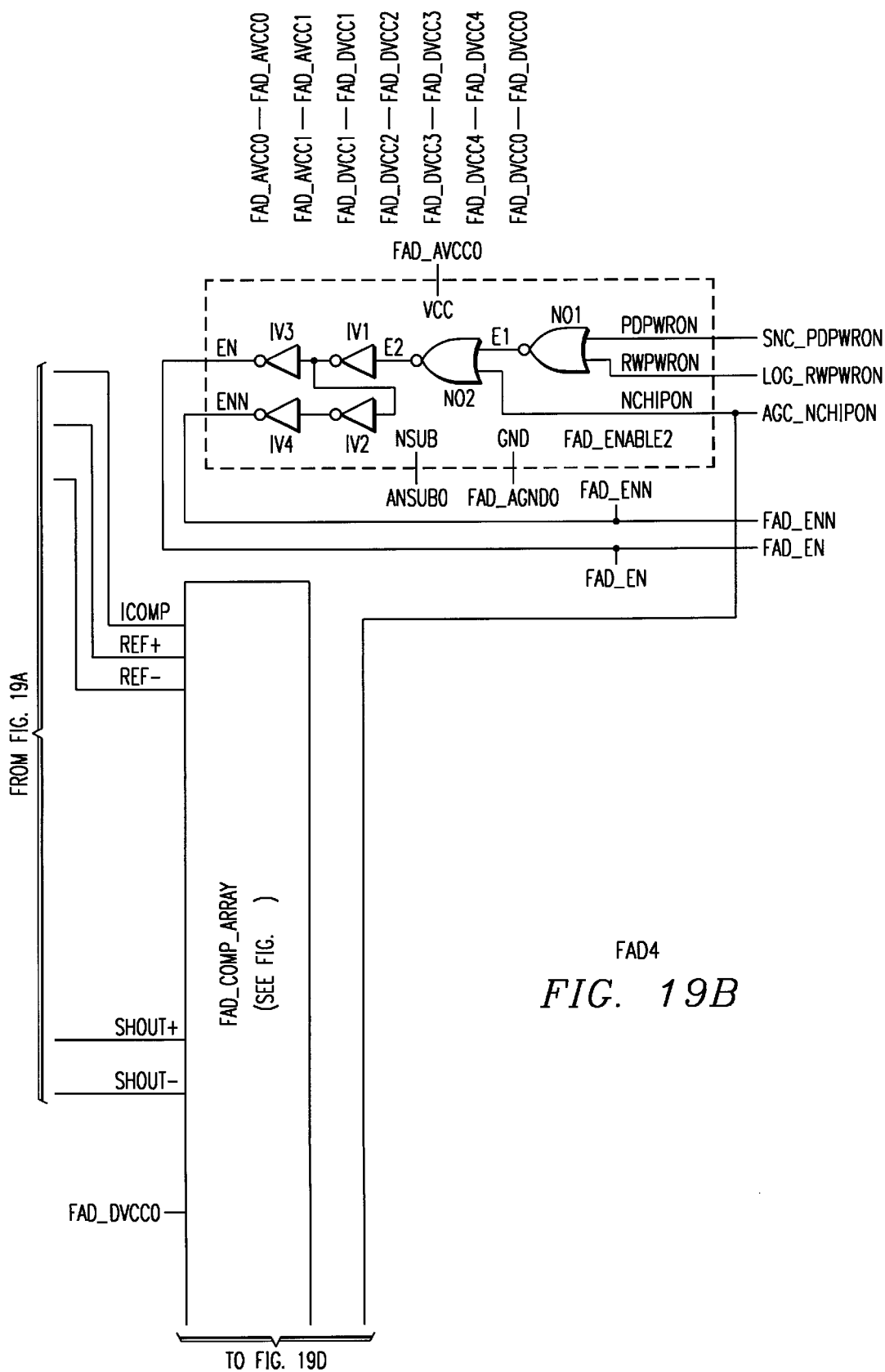
Figure 19C:
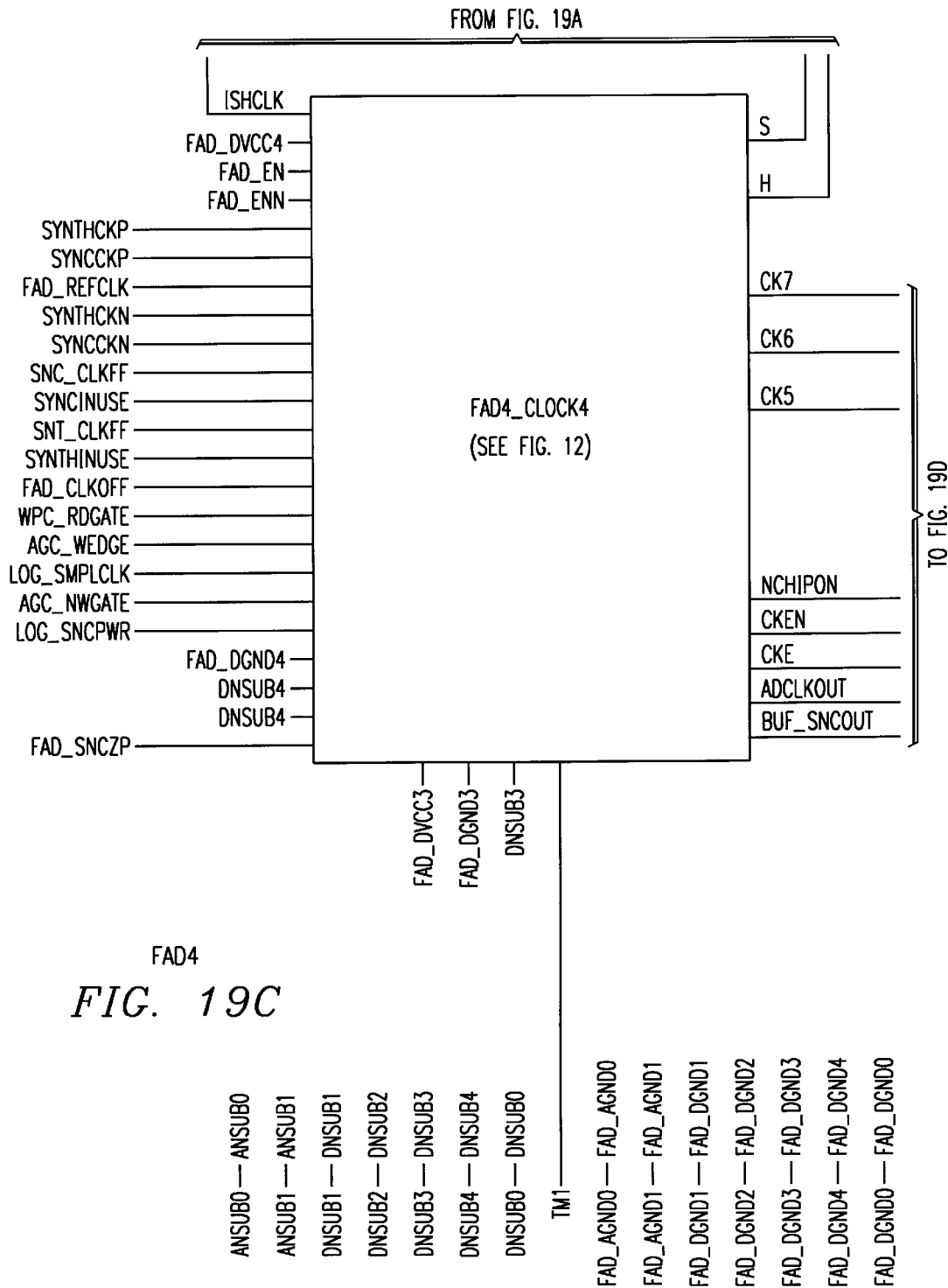
Figure 20A:
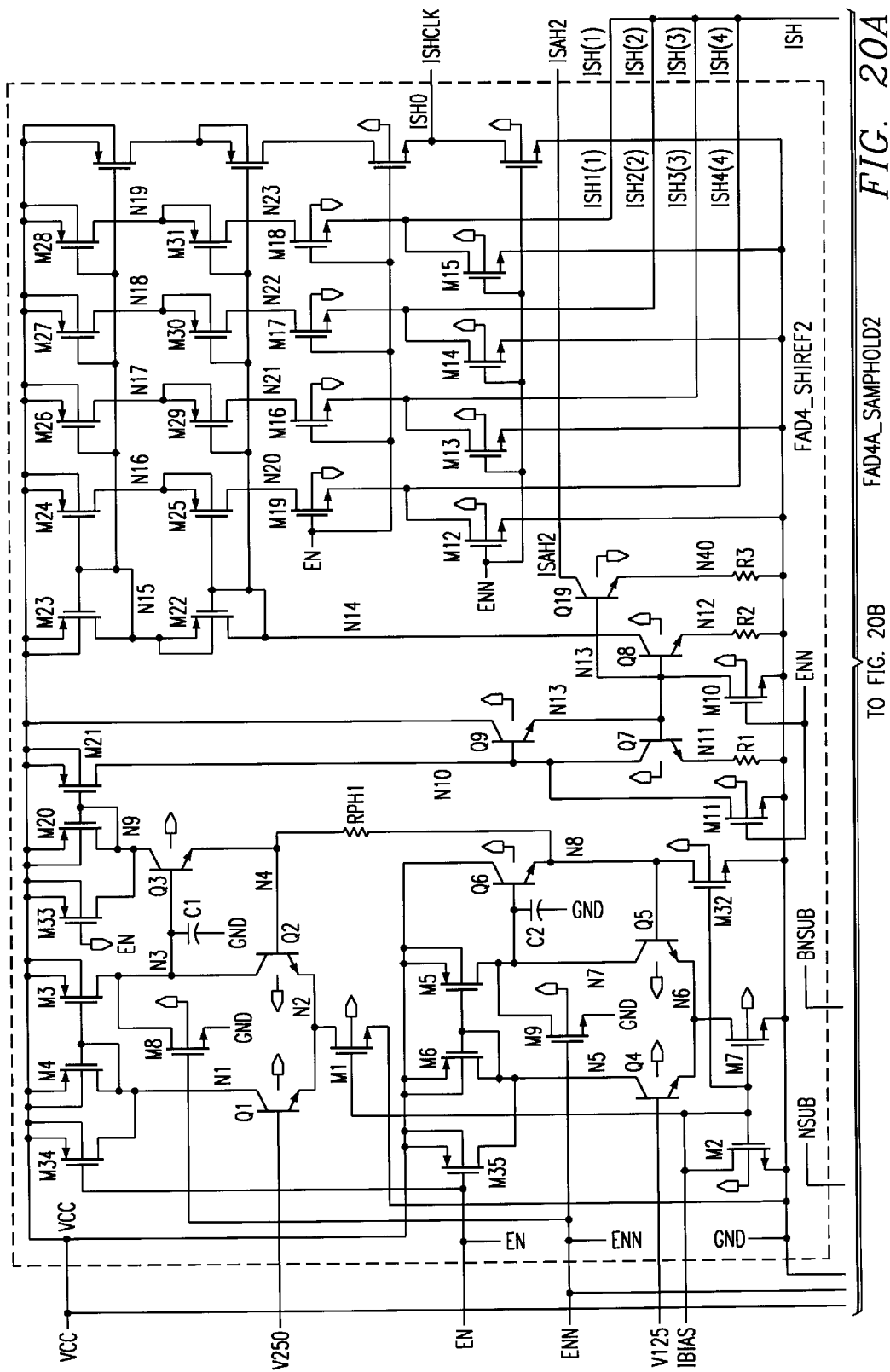
Figure 20B:
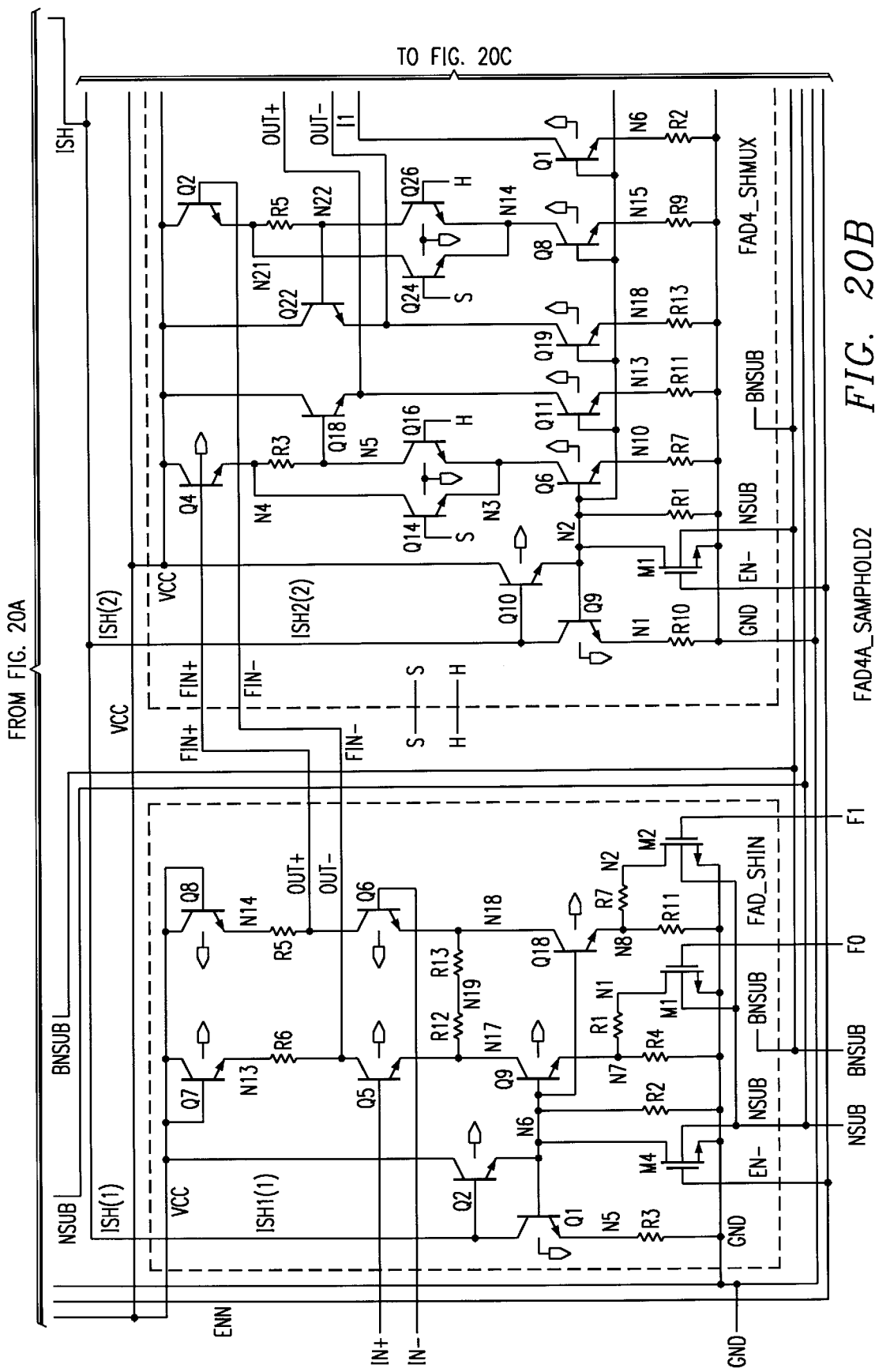
Figure 20C:
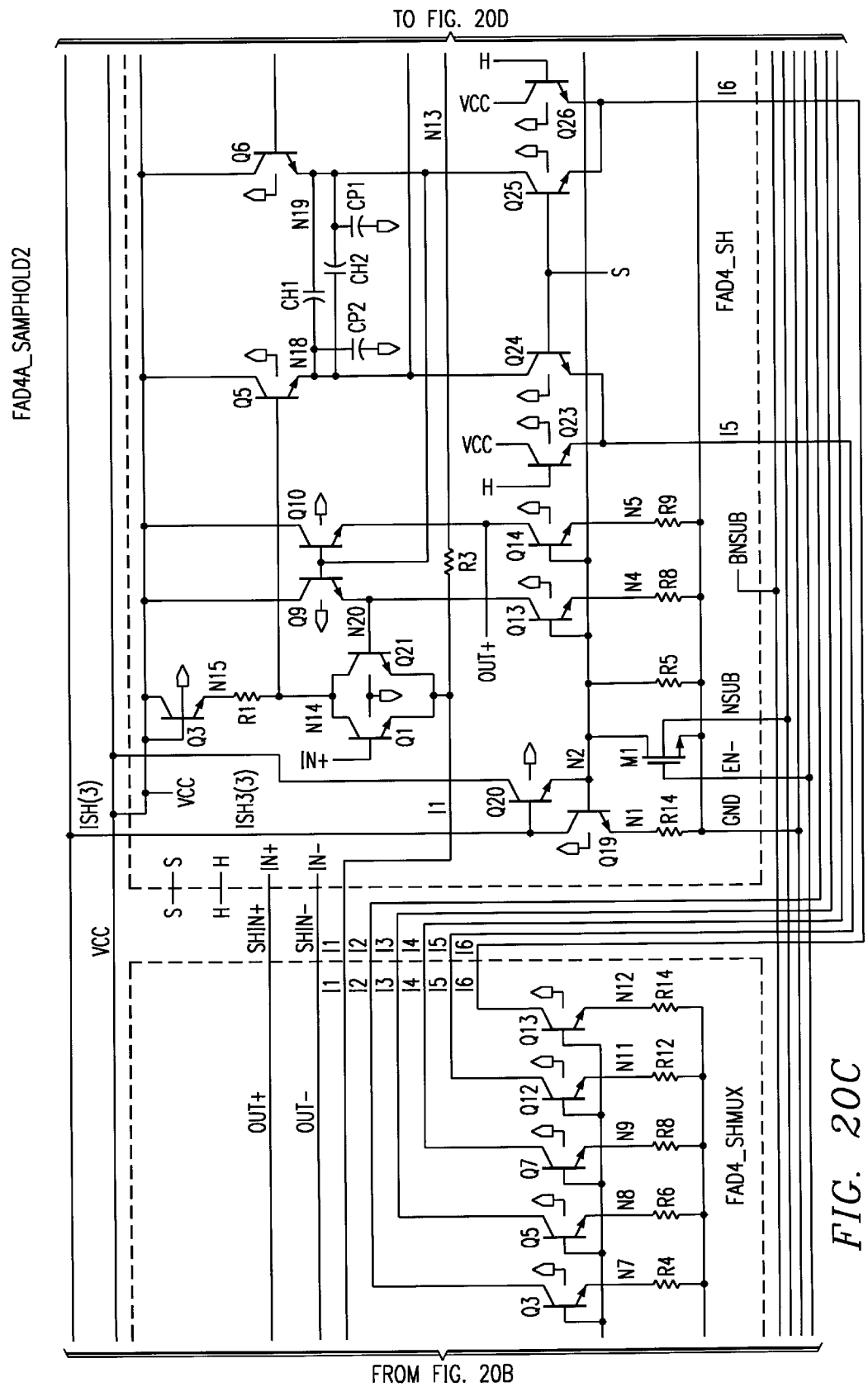
Figure 20D:
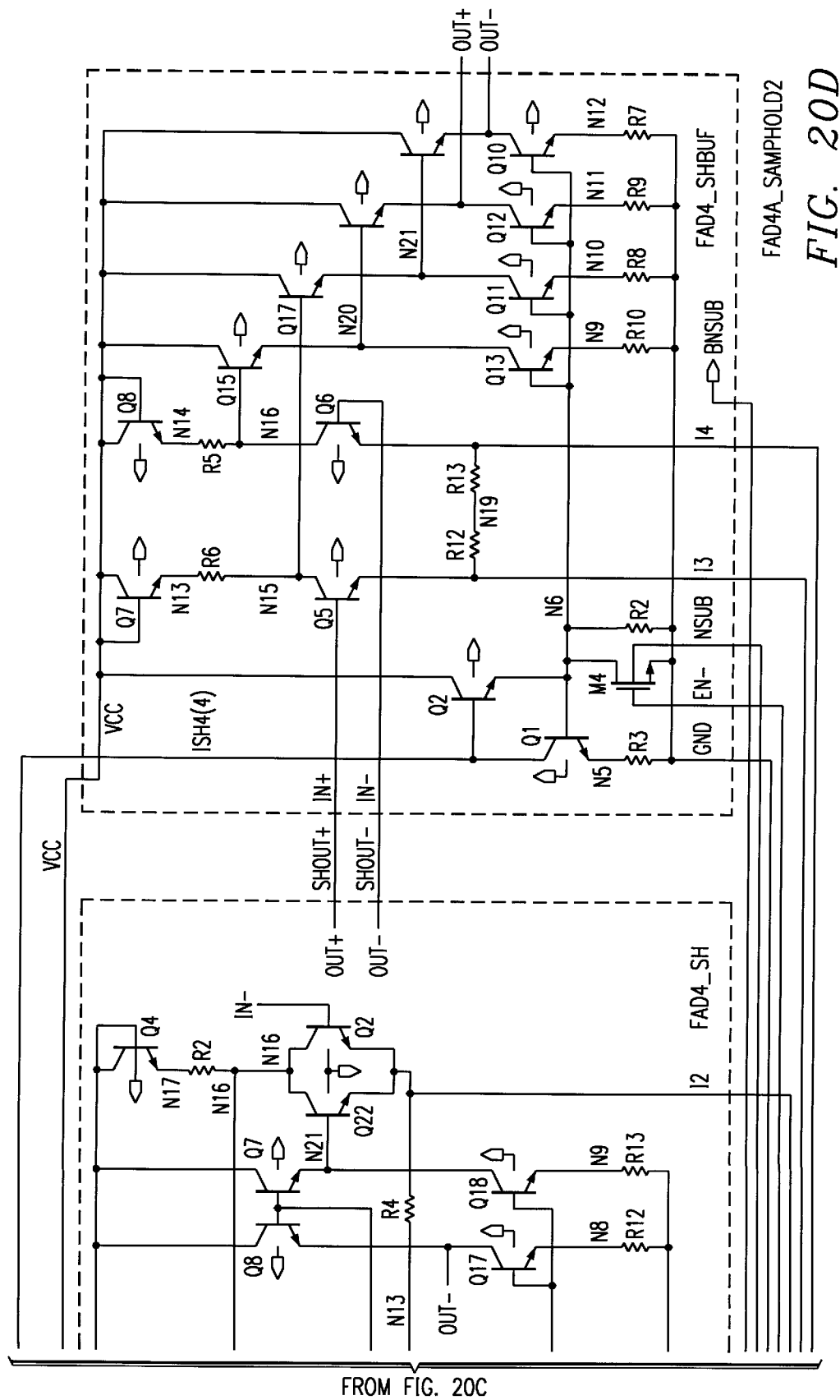
Figure 21A:
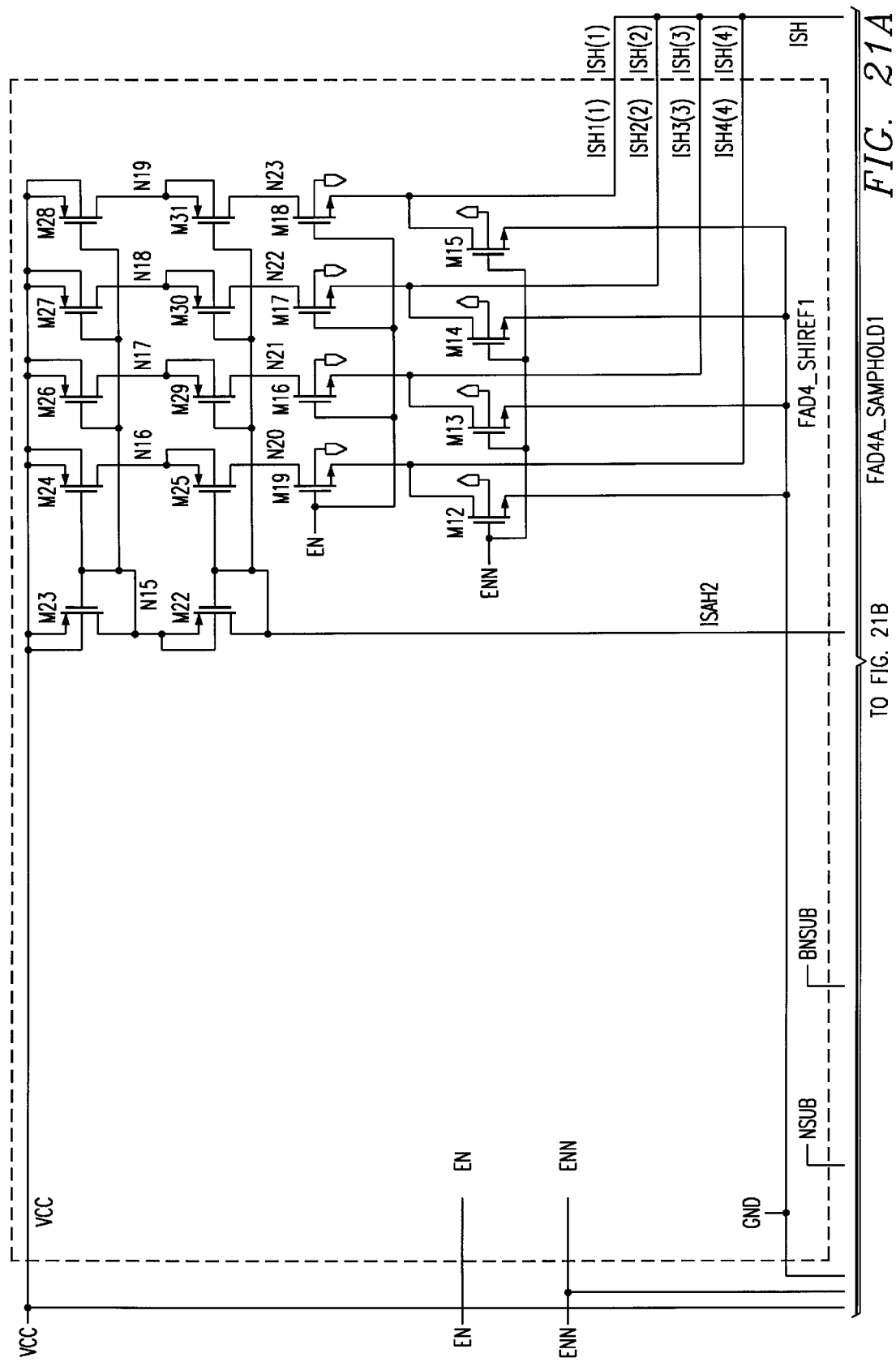
Figure 21B:
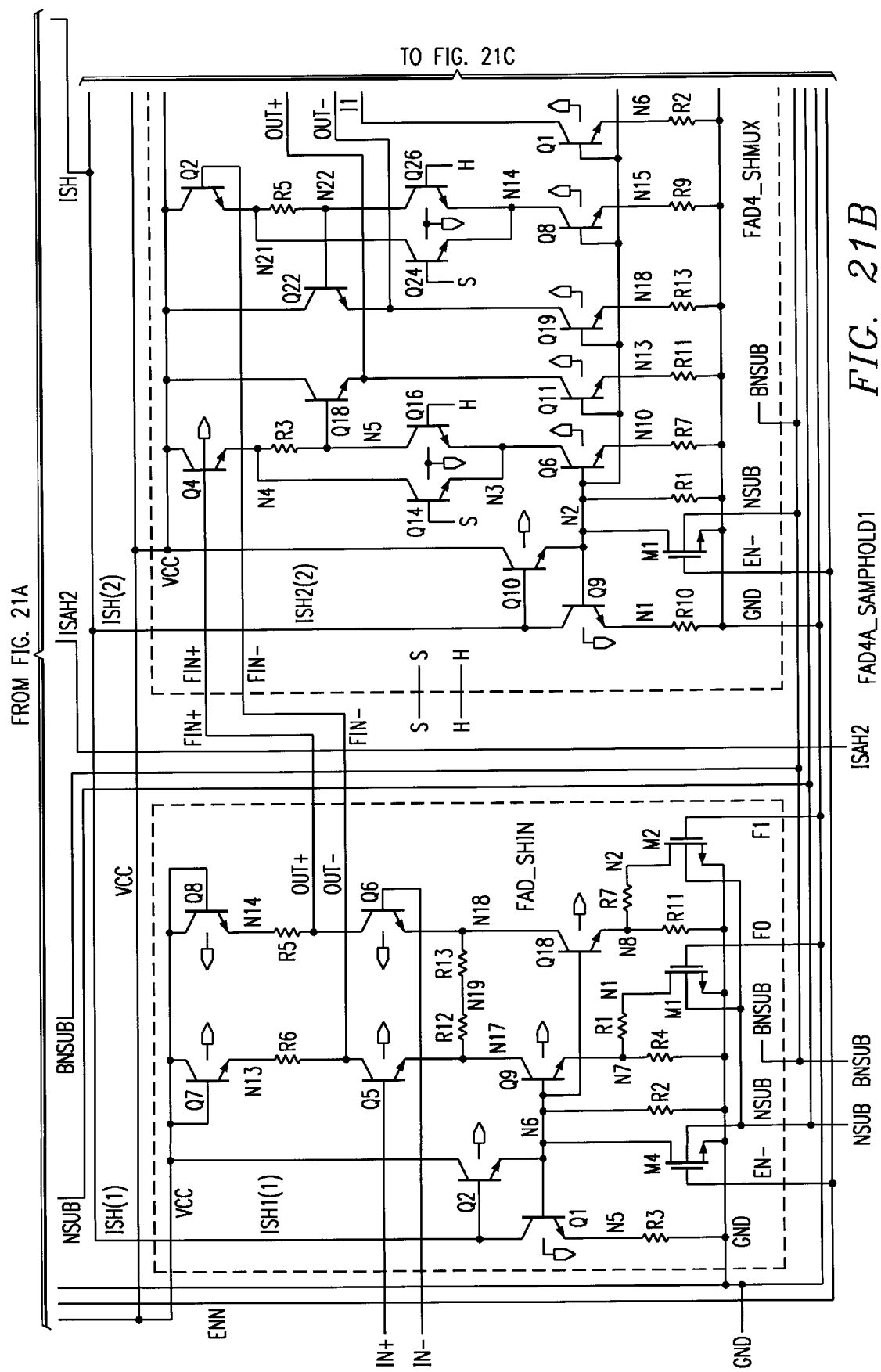
Figure 21C:
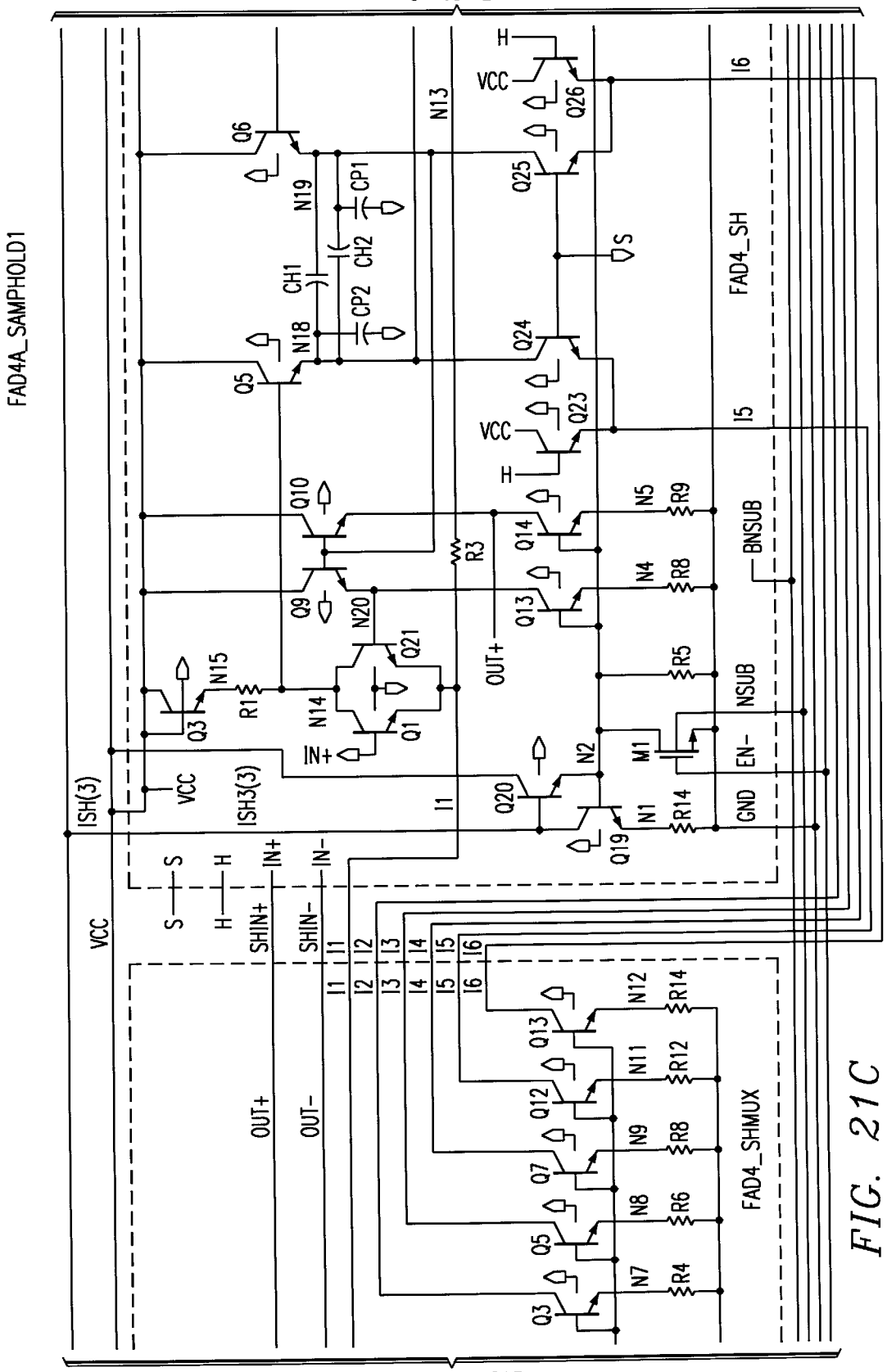
Figure 21D:
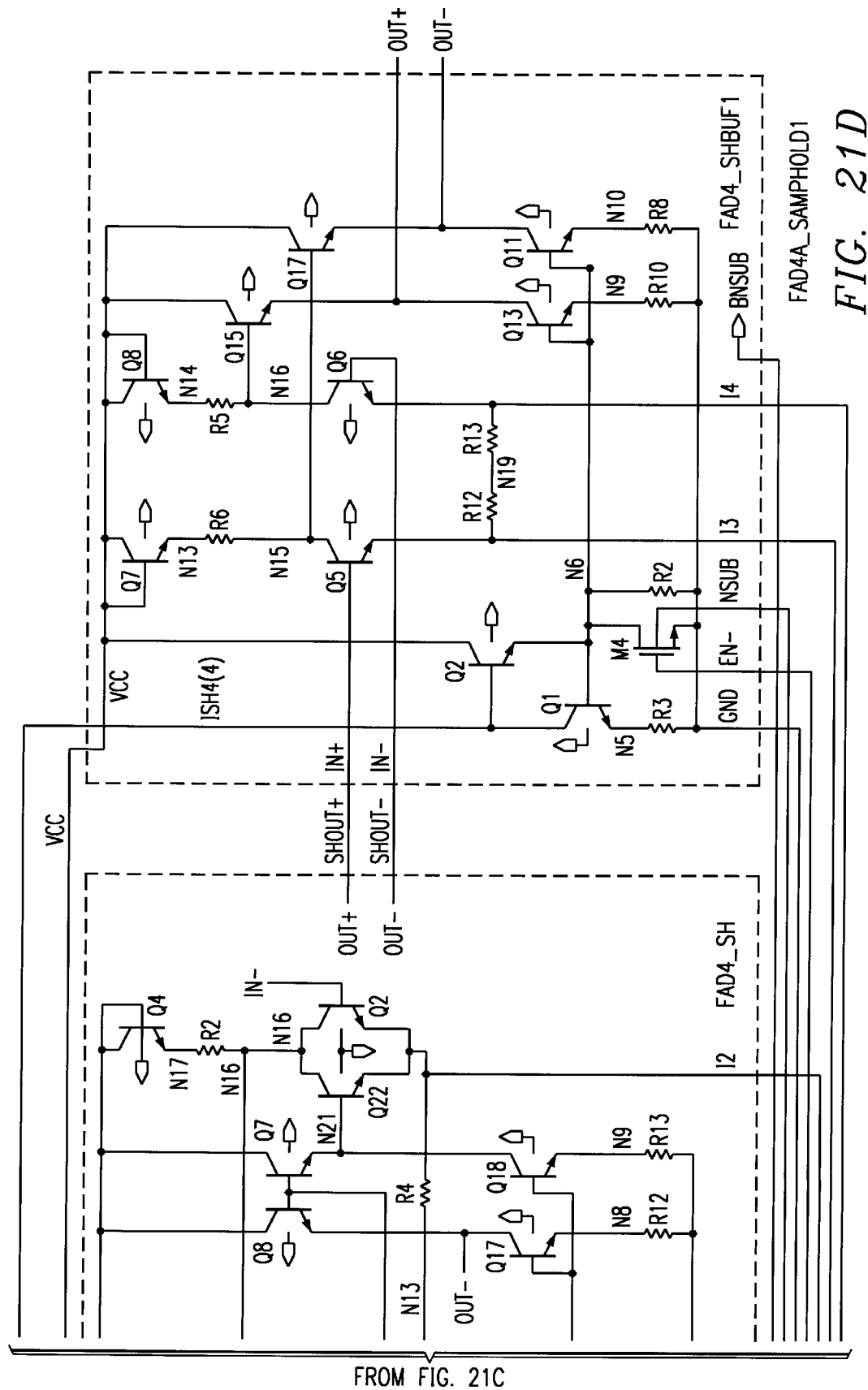
Figure 22B:
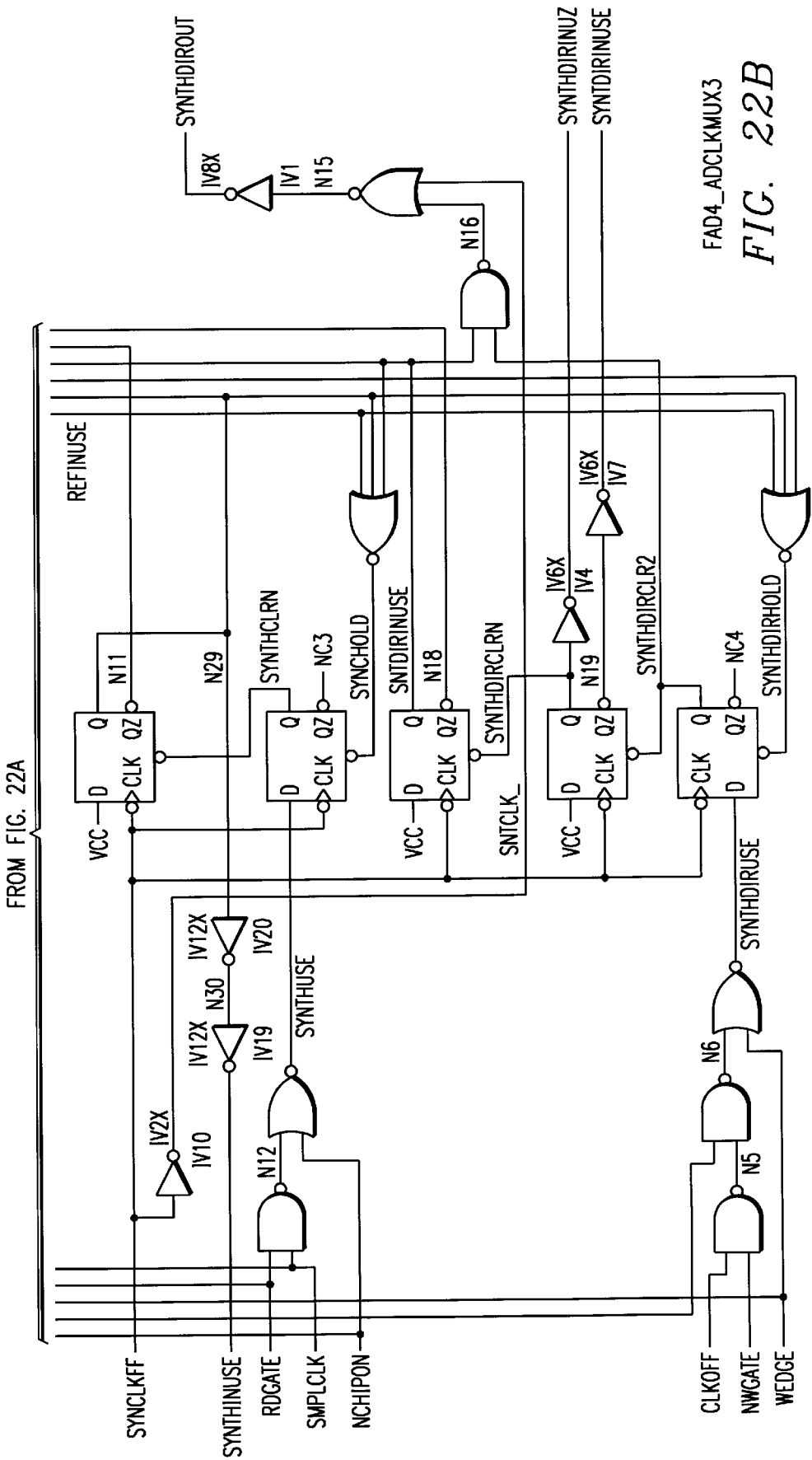
Figures 23A, 23F:
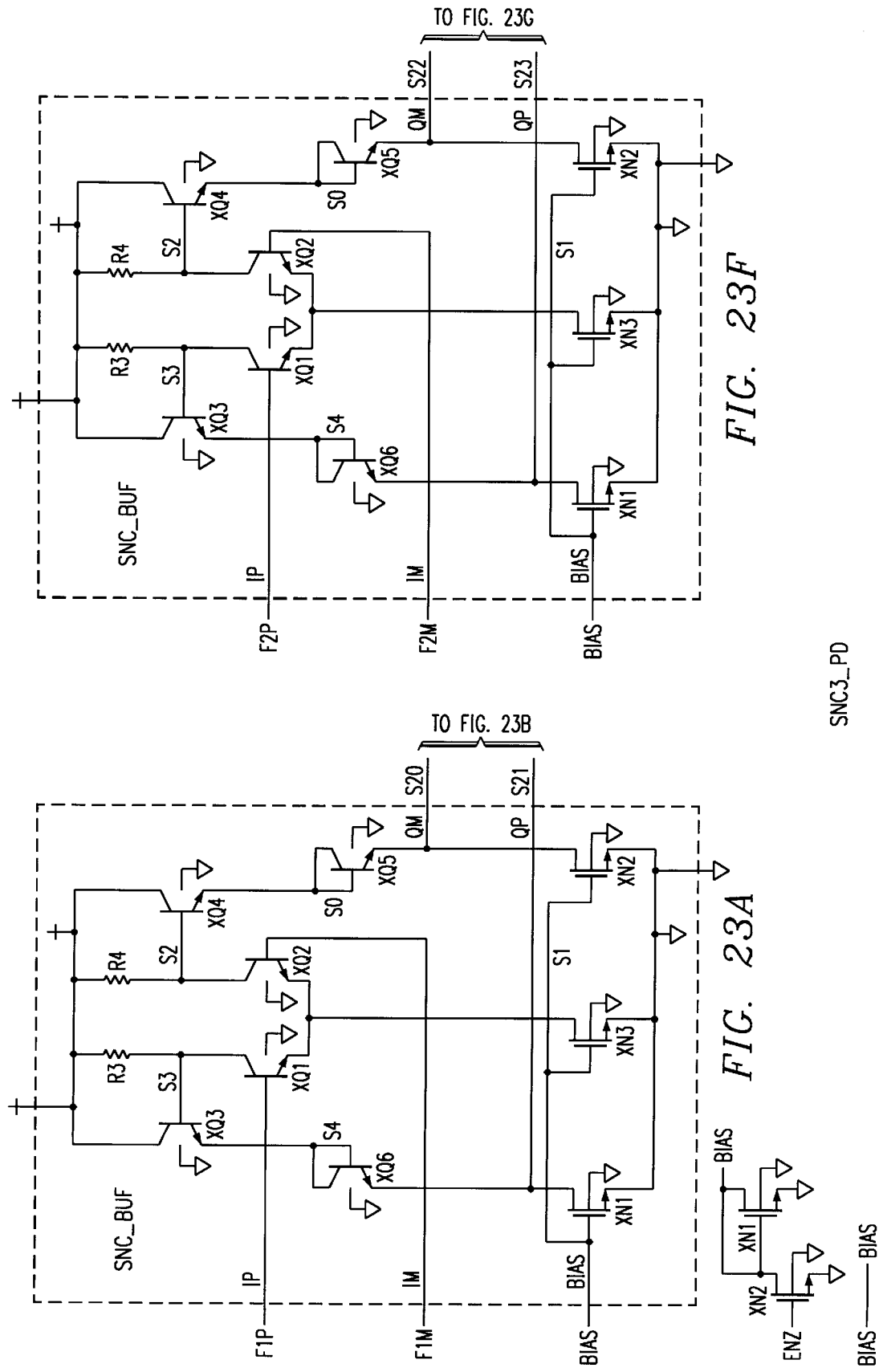
Figure 23B:
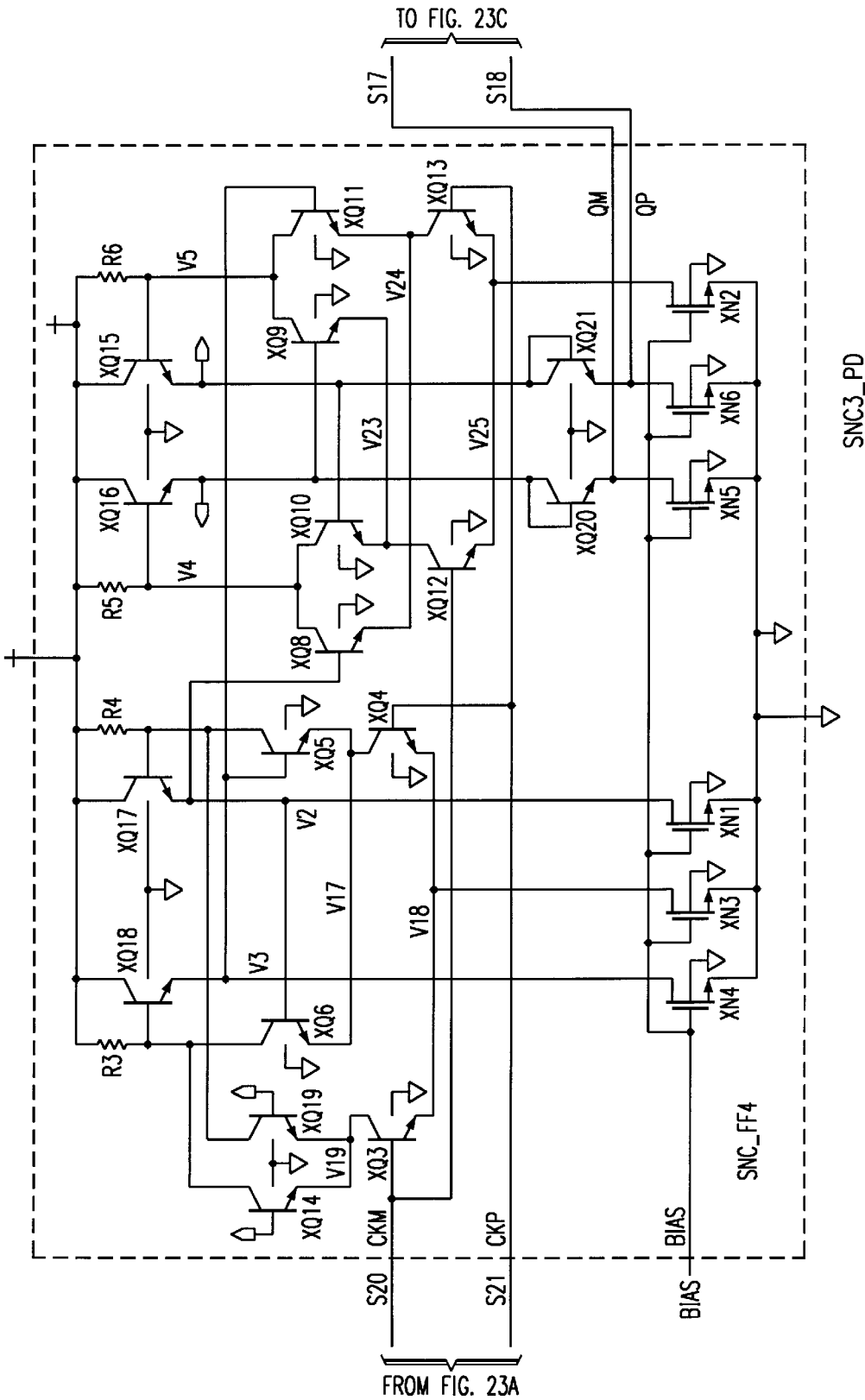
Figure 23C:
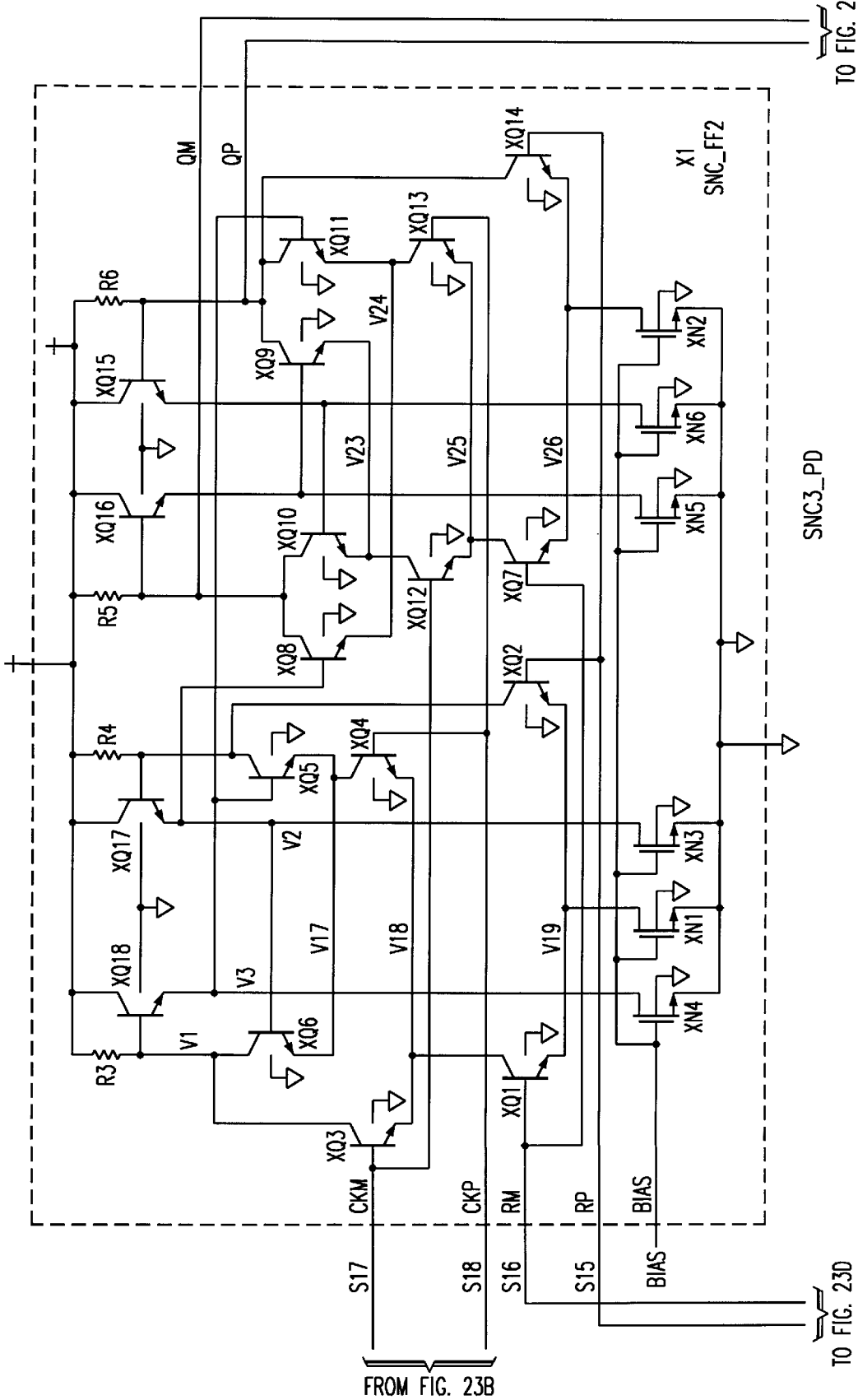
Figure 23D:
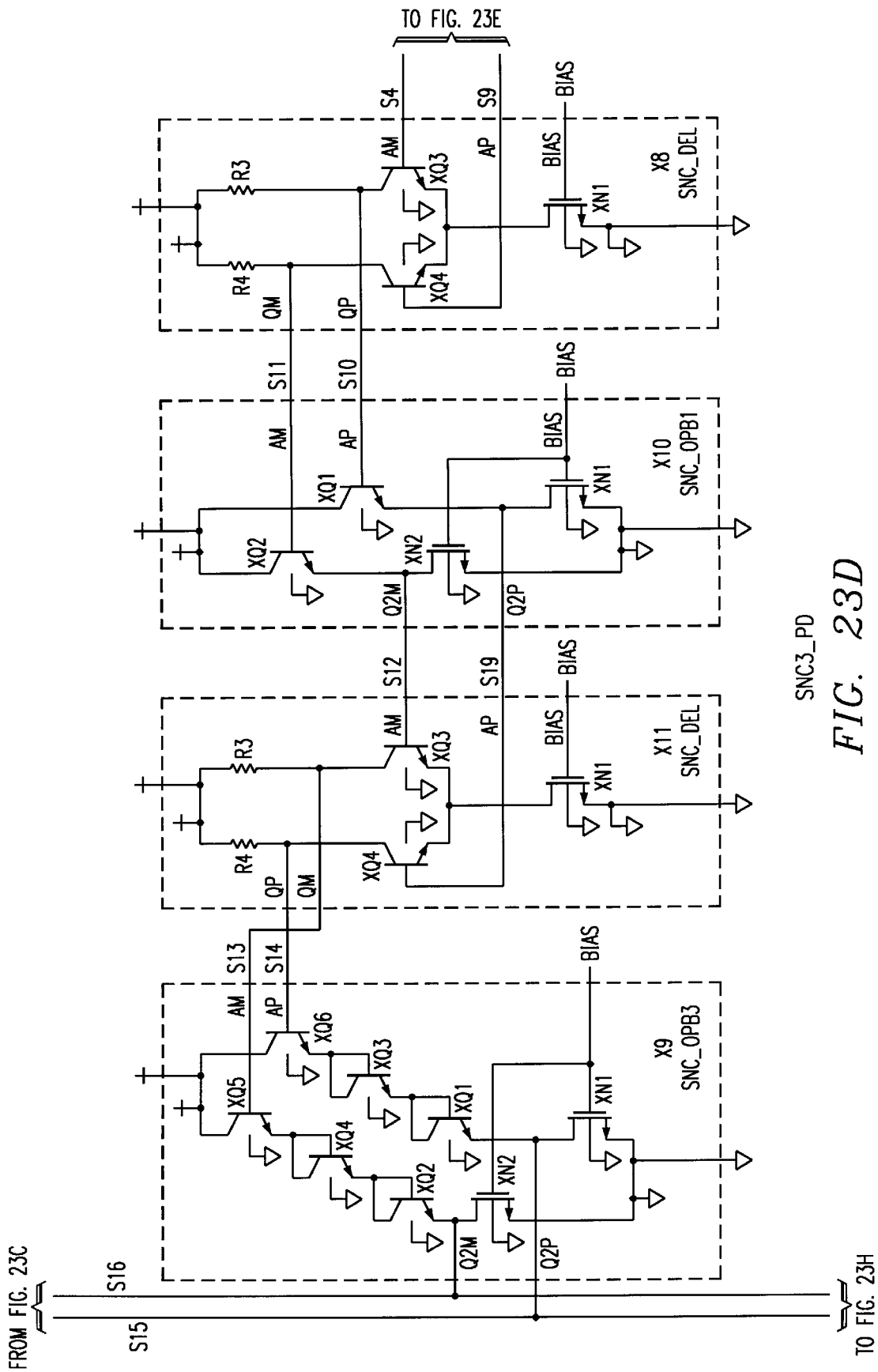
Figure 23E:
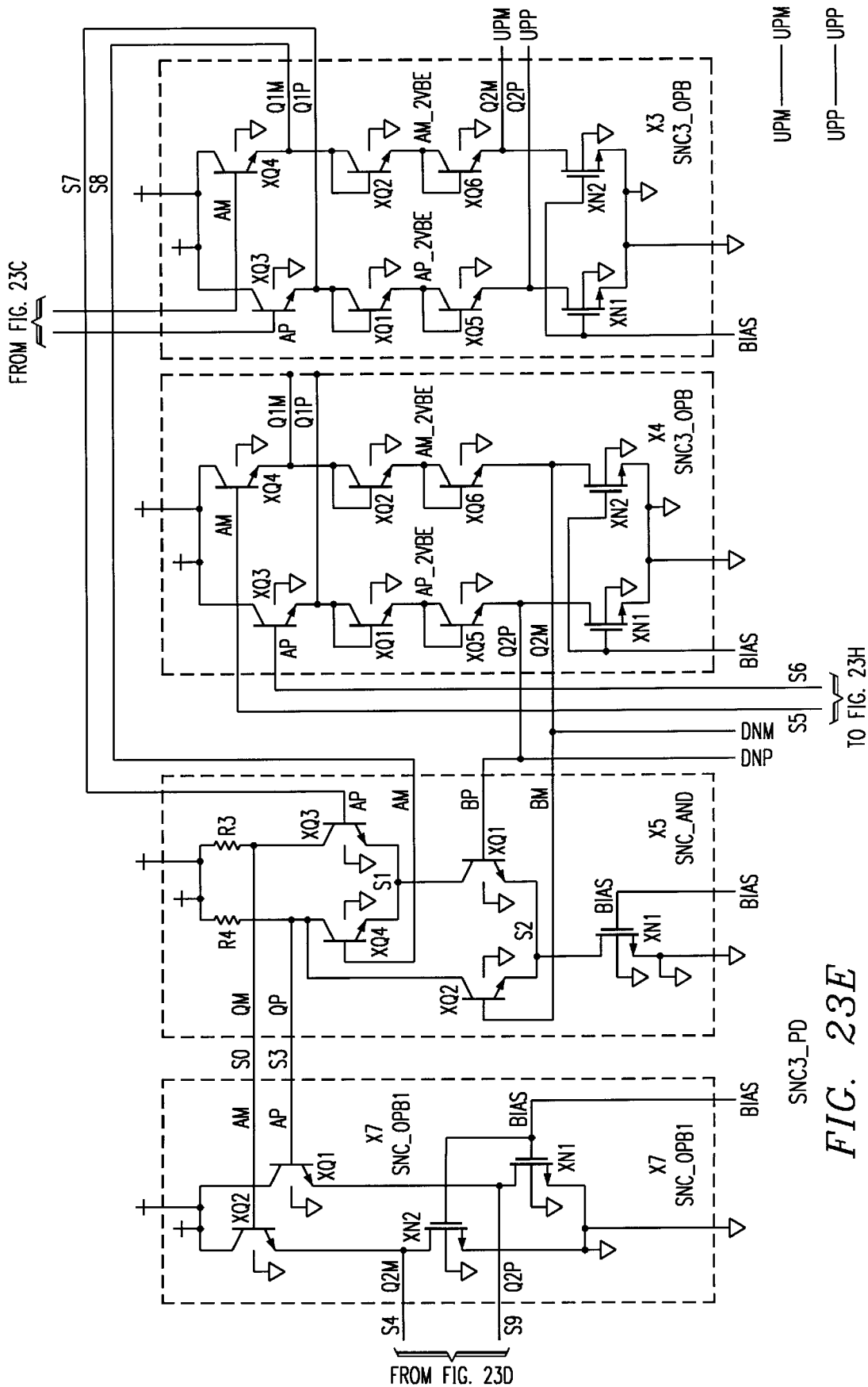
Figure 23G:
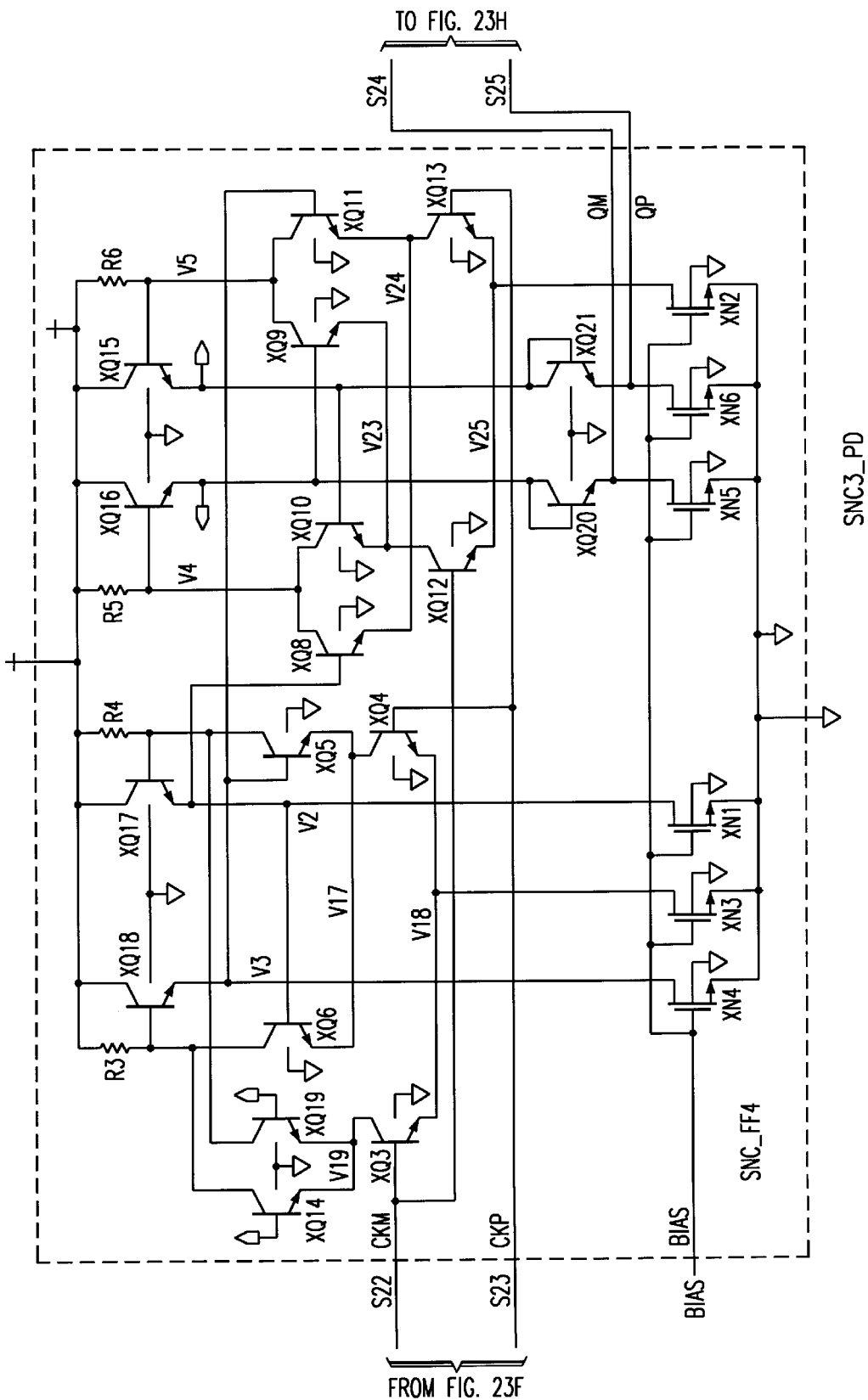
Figure 23H:
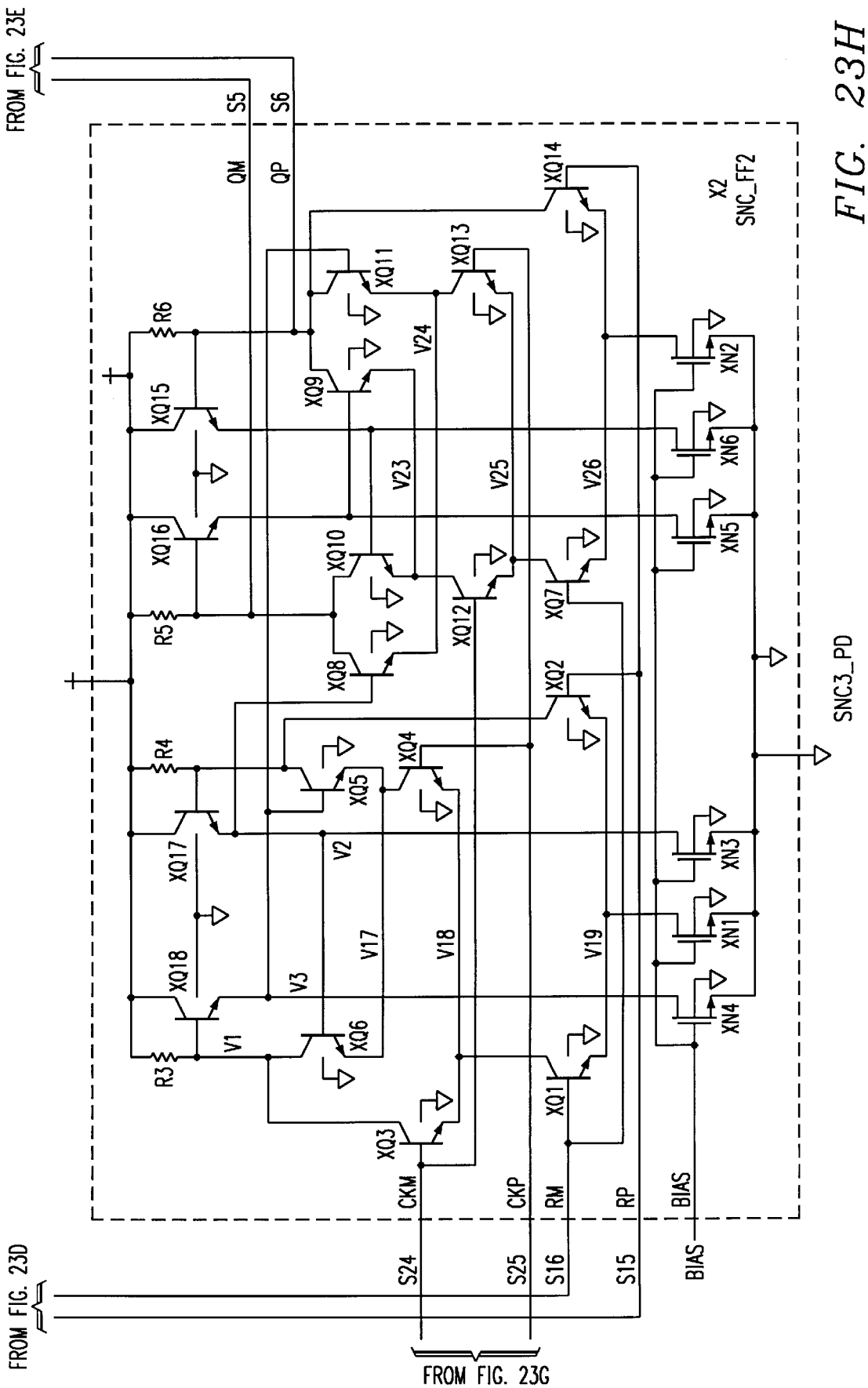
Figure 24:
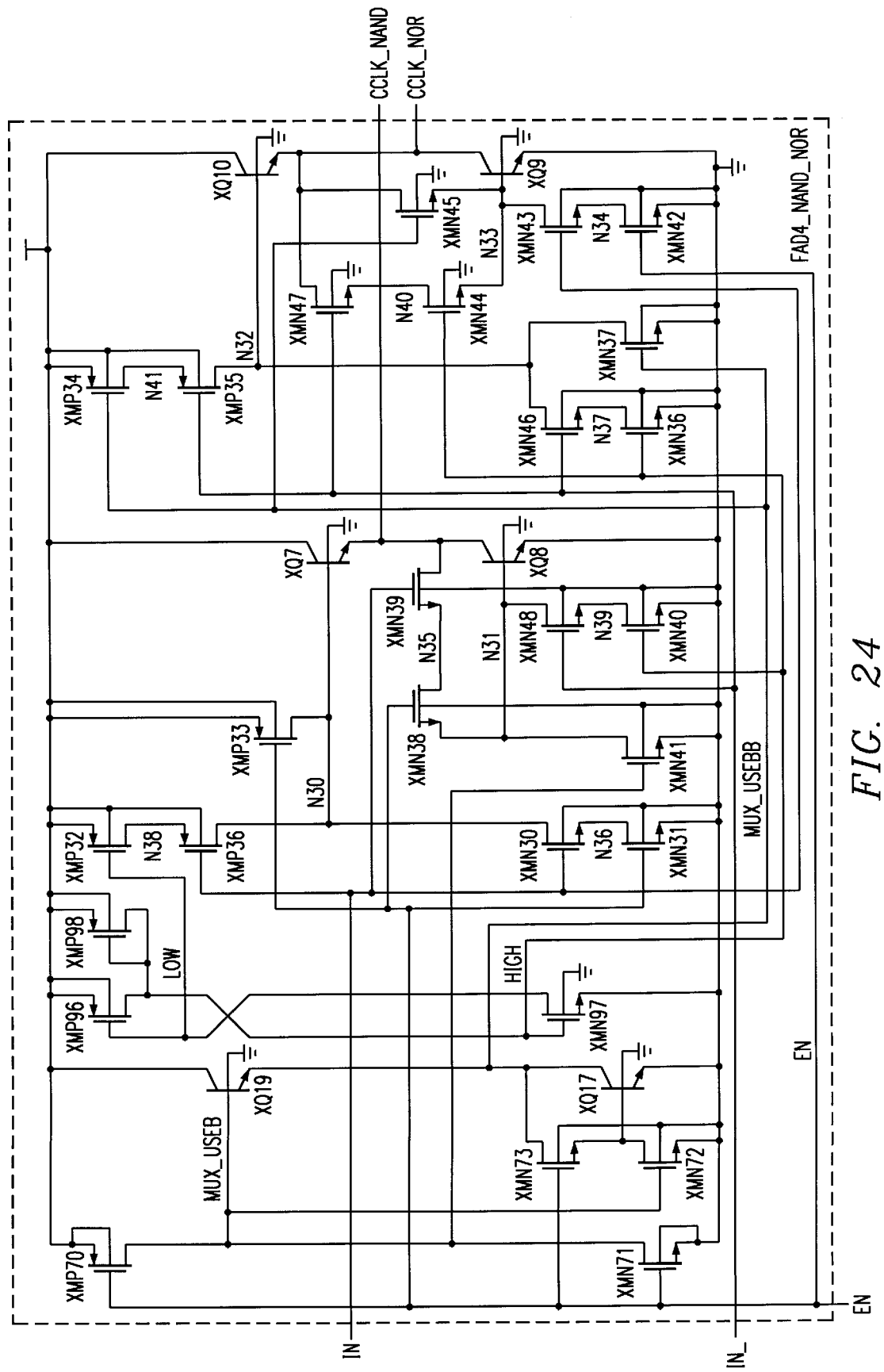
Figure 25:
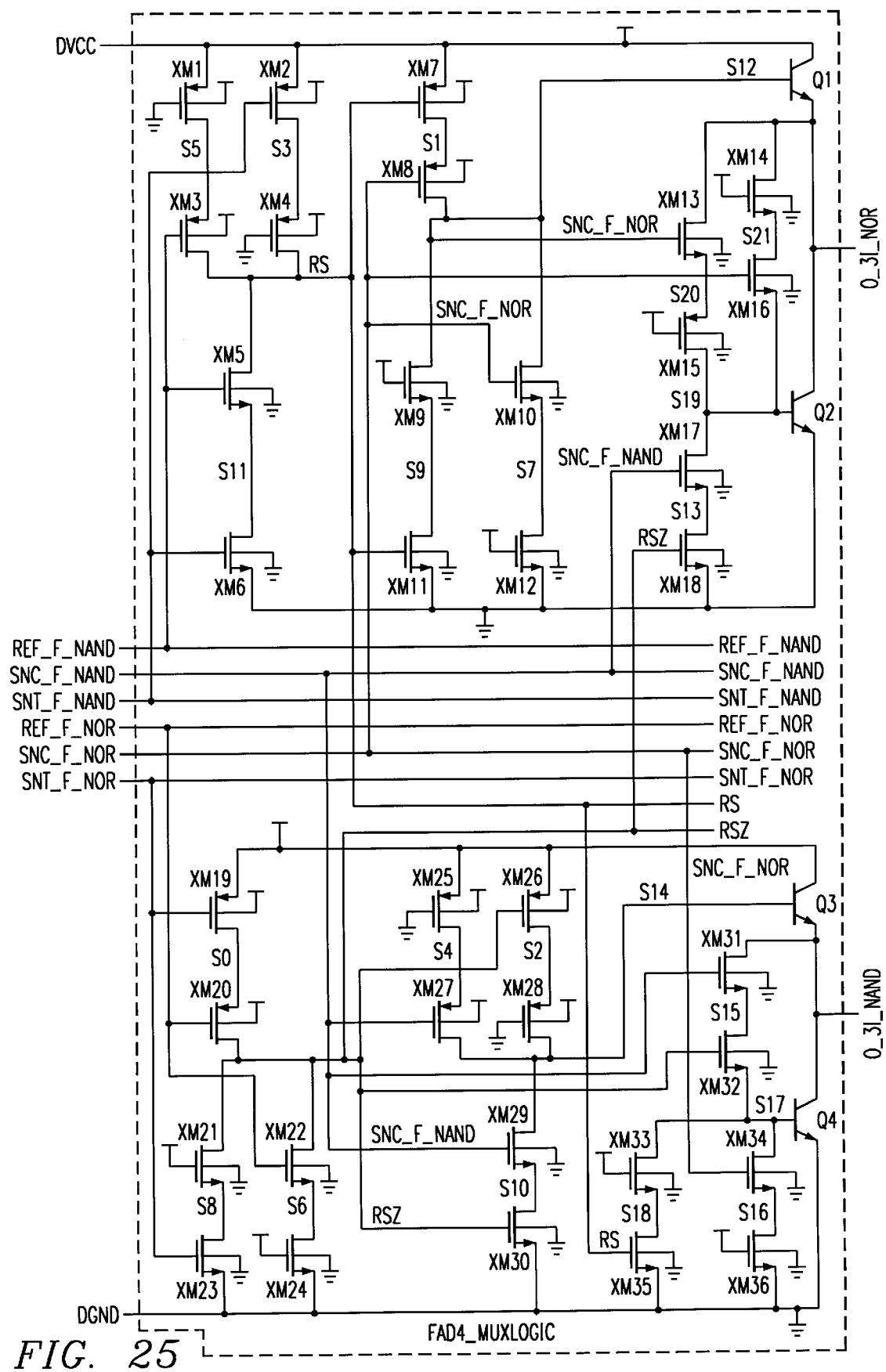
Figure 26A:
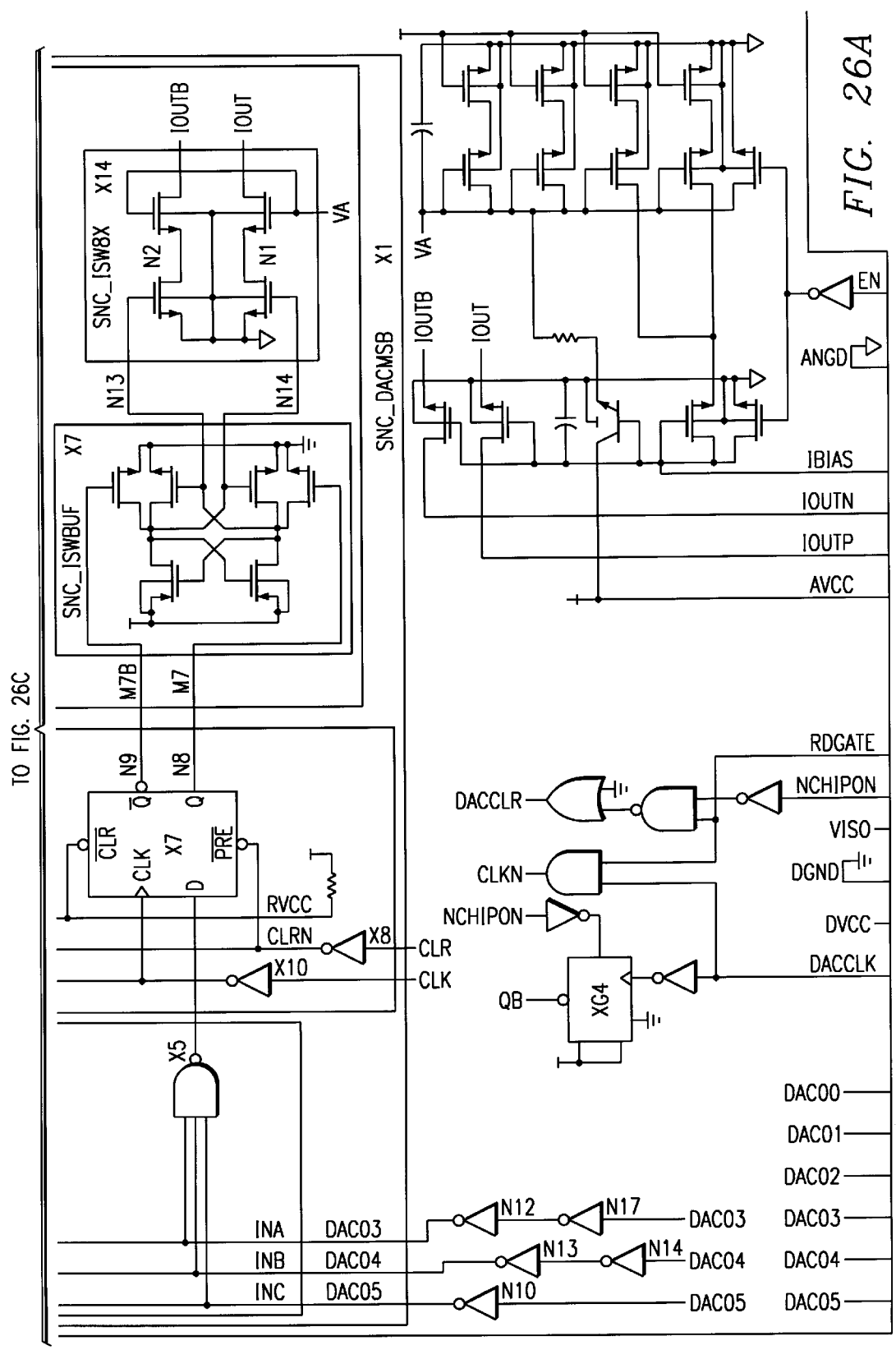
Figure 26B:
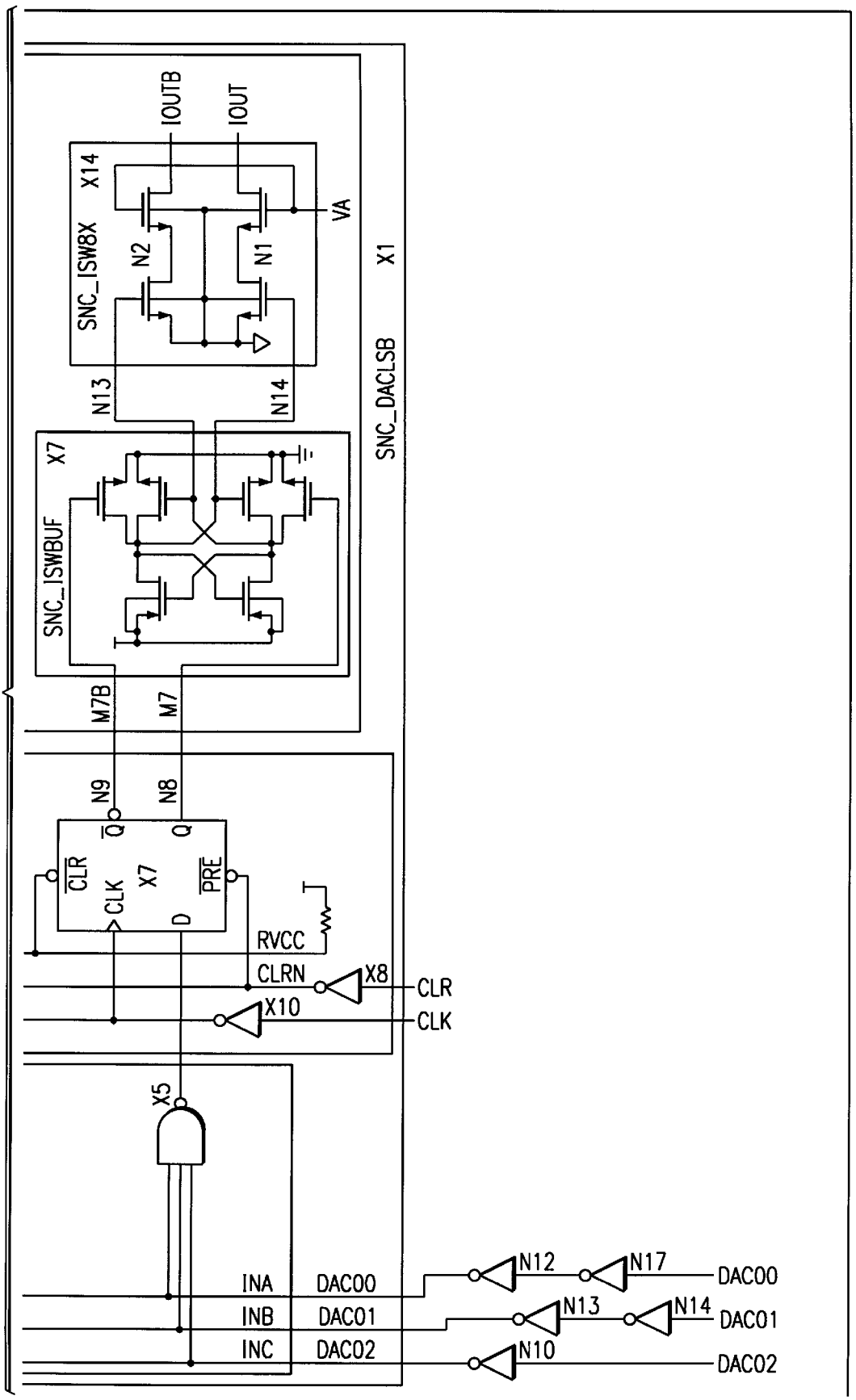
Figure 26C:
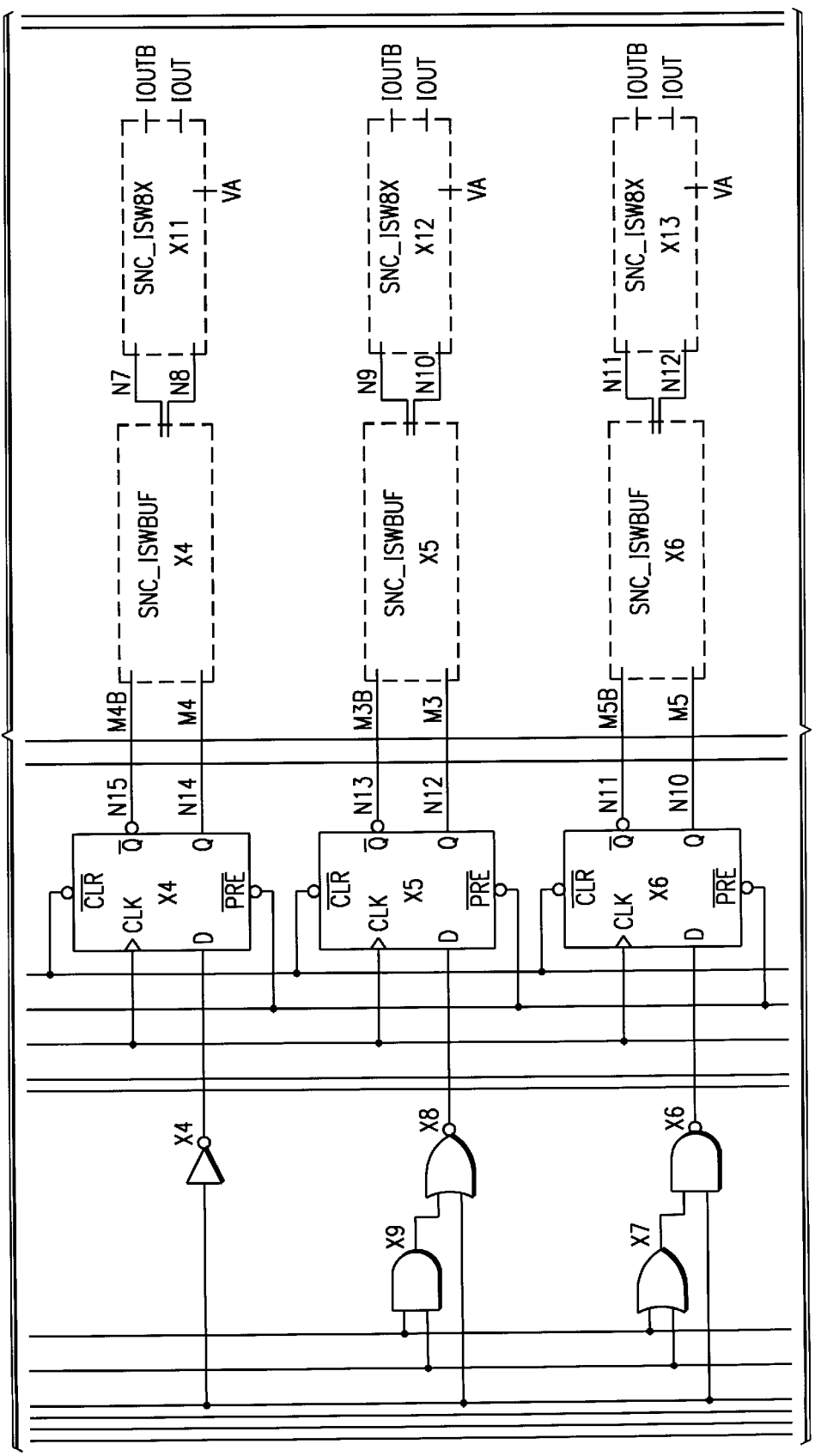
Figure 26D:
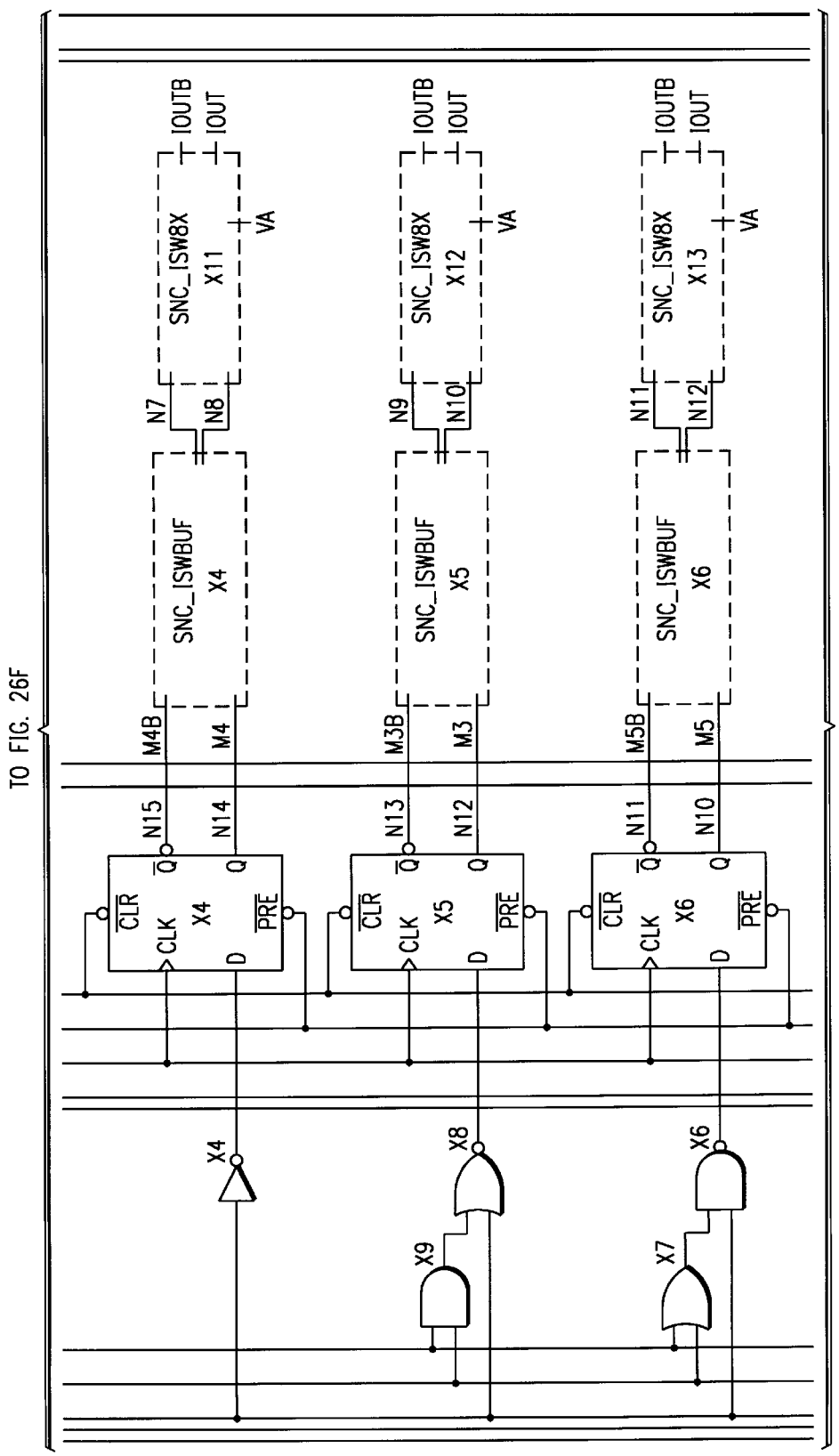
Figure 26E:
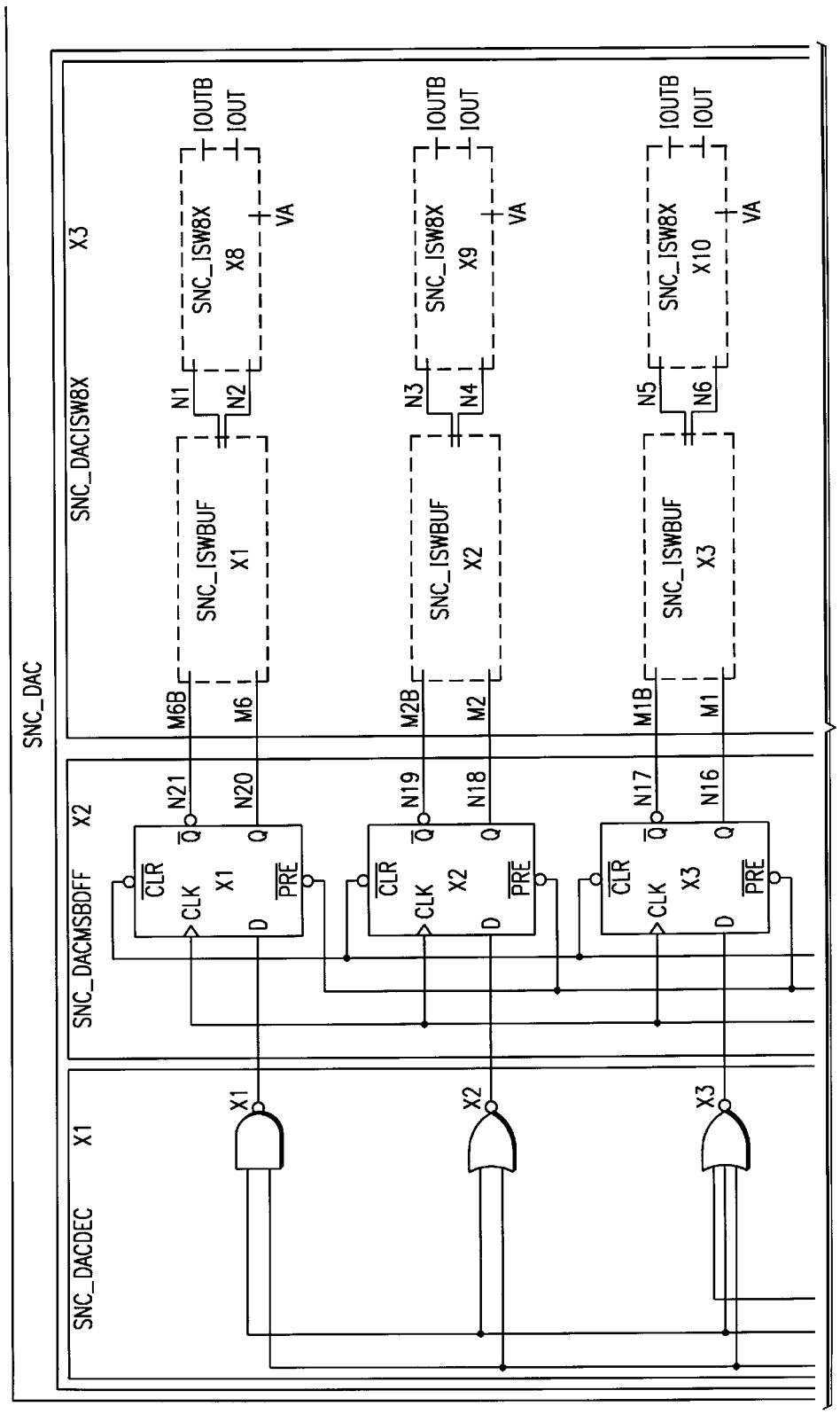
Figure 26F:
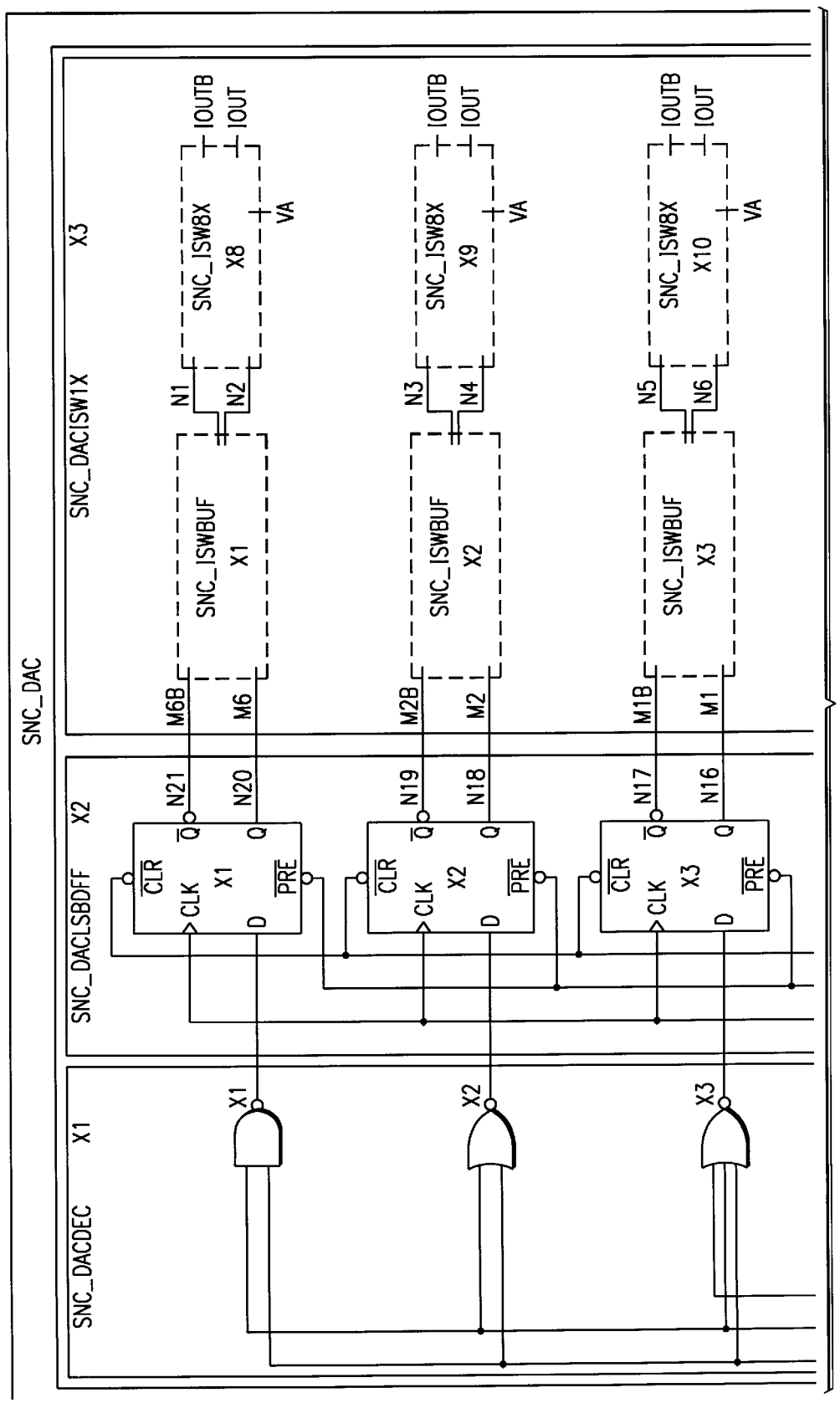

FIG. 8A–D illustrates a detailed circuit diagram of the differential to CMOS comparator of the present invention;

FIG. 9 illustrates a SNC 4 level circuit of the present invention;

FIGS. 10A–C illustrates a comparator circuit of the present invention;

FIG. 11 illustrates an overview of the comparator circuit of the present invention;

FIGS. 12A–B are circuits of the present invention;

FIGS. 13A–G are circuits of the present invention;

FIGS. 14A–B are circuits of the present invention;

FIGS. 15A–D are circuits of the present invention;

FIGS. 16A–E are circuits of the present invention;

FIG. 17 is a circuit of the present invention;

FIGS. 18A–B are circuits of the present invention;

FIGS. 19A–D are circuits of the present invention;

FIGS. 20A–D are circuits of the present invention;

FIGS. 21A–D are circuits of the present invention;

FIGS. 22A–B are circuits of the present invention;

FIGS. 23A–H are circuits of the present invention;

FIG. 24 is a circuit of the present invention;

FIG. 25 is a circuit of the present invention;

FIGS. 26A–F are circuits of the present invention.

DETAILED DESCRIPTION OF THE INVENTION

The present invention includes an apparatus for switching a first complementary signal and a second complementary signal, including an input circuit to receive the first complementary signal and the second complementary signal, switching circuitry coupled to the input circuit to switch the first complementary signal and the second complementary signal between a high state and a low state, said switching circuitry including two transistors, wherein said switching circuitry switches said first complementary signal and said second complementary signal within two gate delays based on the two transistors.

The present invention includes that the first complementary signal and the second complementary signal alternate between a first level when received by said input circuit and a second level, and that the switch between the first complementary signal and said second complementary signal are switched between said high state and a low state within 1.4 nano seconds.

Furthermore, the present invention includes a circuit for switching between a first complementary signal and a second complementary signal, including, an input circuit to receive the first complementary signal with respect to a first level and the second complementary signal with respect to said first level, a switch coupled to the input circuit to switch the first complementary signal and the second complementary signal between a high state and a low state, a inverting circuit coupled to switch to maintain an output of the inverting circuit at a threshold voltage of the inverting circuit, a pair of voltage limiting devices coupled to said output of said inverting circuit and coupled to said switch to output said first and second complementary circuits at a second level.

The present invention further includes that the output of the inverter is directly coupled to an input of the inverter.

A circuit for switching between a first complementary signal and a second complementary signal, wherein said pair of voltage liniting devices are resistors.

A circuit for switching between a first complementary signal and a second complementary signal, wherein said resistors have substantially the same resistance.

A circuit for switching between a first complementary signal and a second complementary signal, wherein each of said voltage limiting devices are coupled to another transistor.

Figure 1:
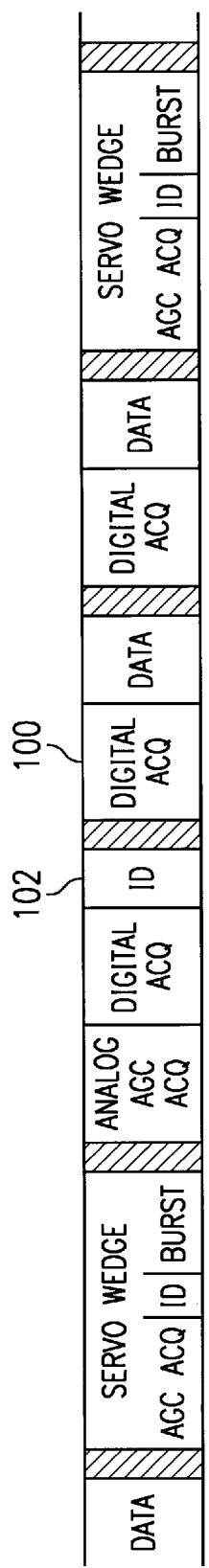
FIG. 1 illustrates a channel for a disk.
Figure 2:
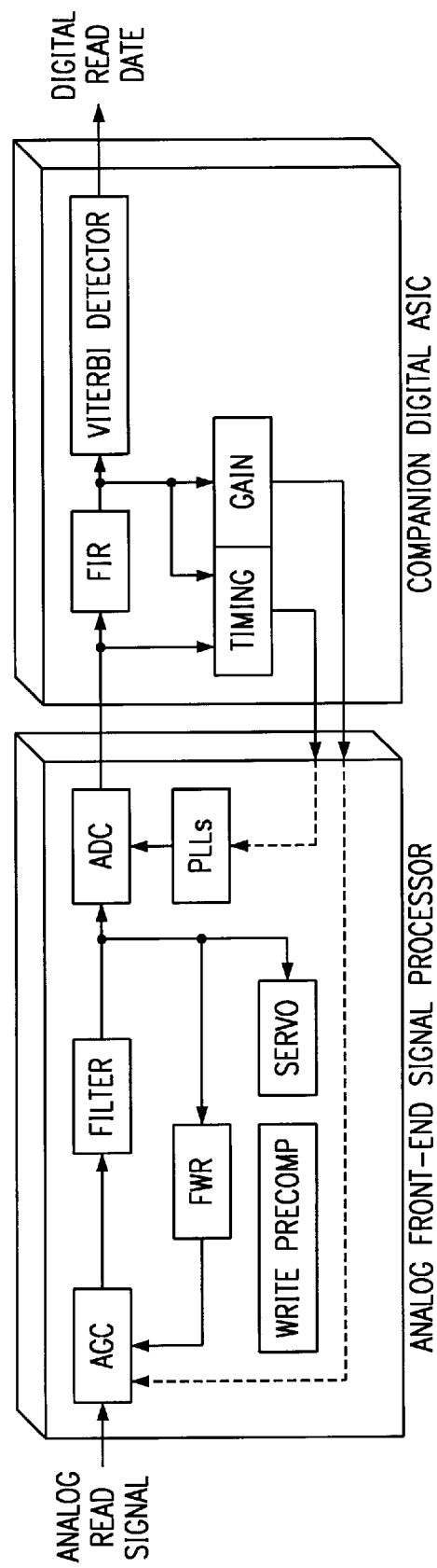
FIG. 2 illustrates a read channel device of the present invention.
Figure 3:
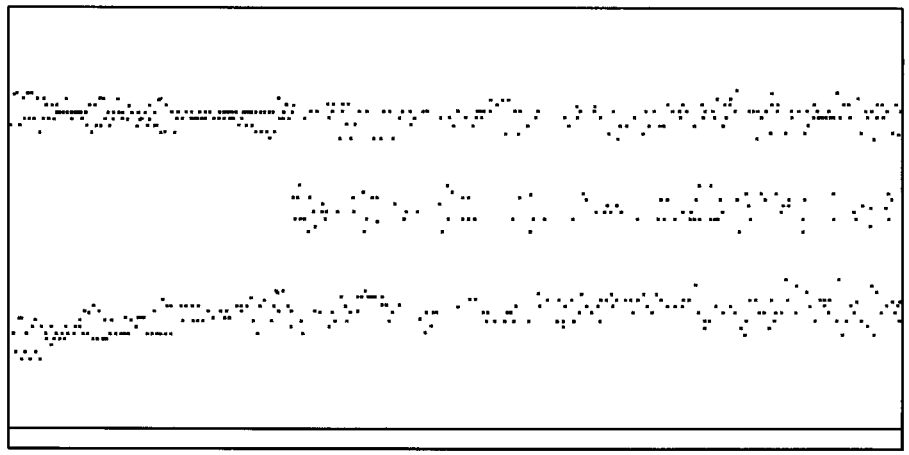
FIG. 3 illustrates the output from the circuit from the present invention.
Figure 4:
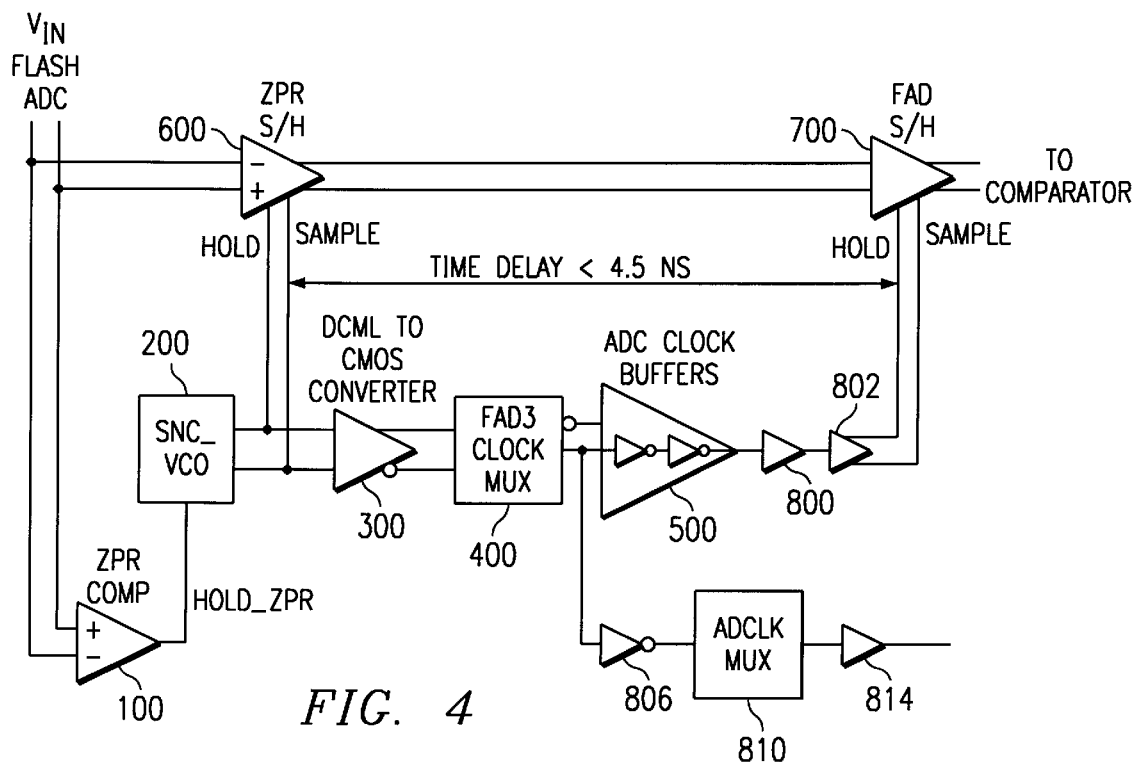
FIG. 4 illustrates an overall diagram of the present invention.
Figure 5:
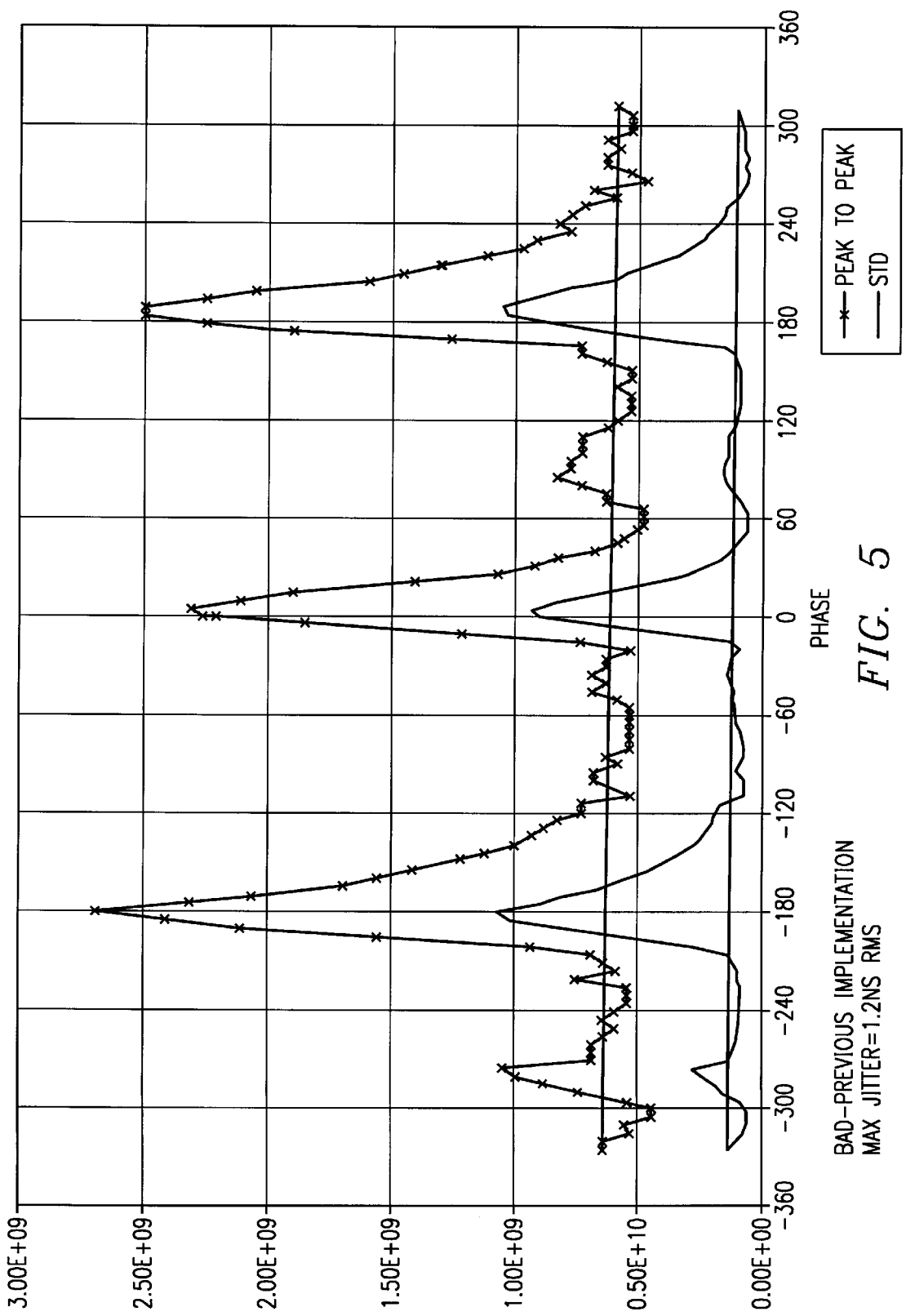
FIG. 5 illustrates a graph of relationships.
Figure 8A:
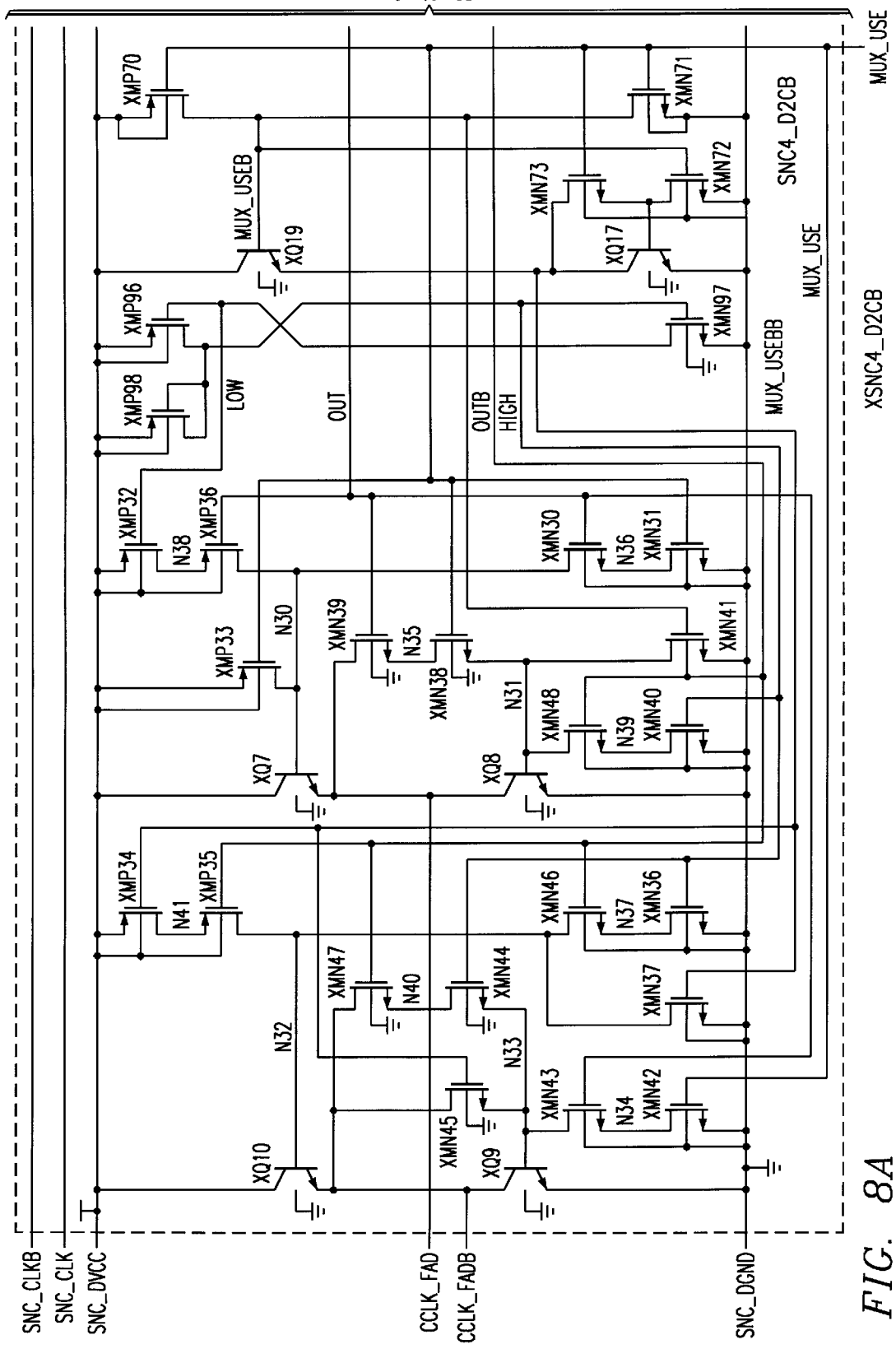
Figure 8B:
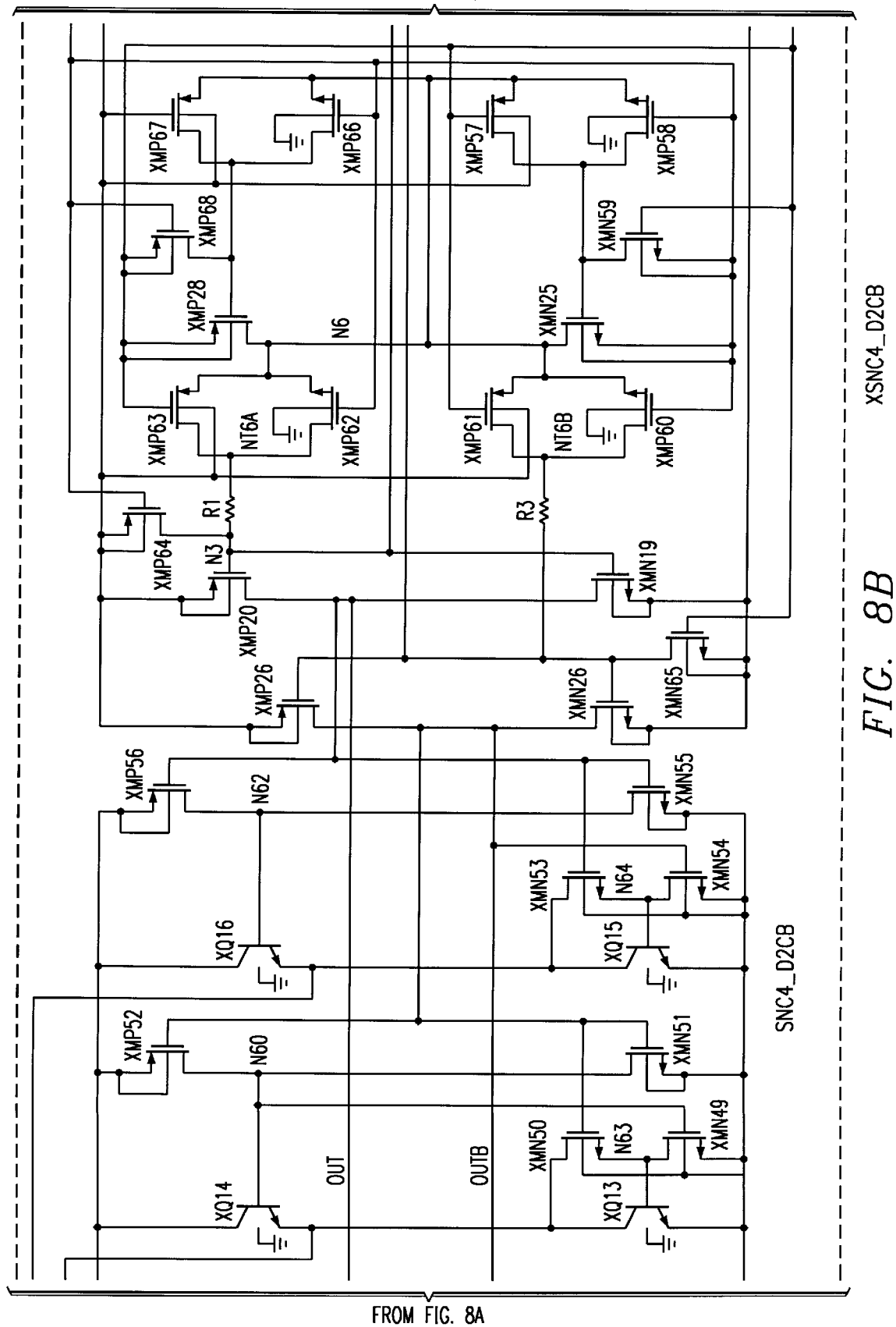
Figure 8C:
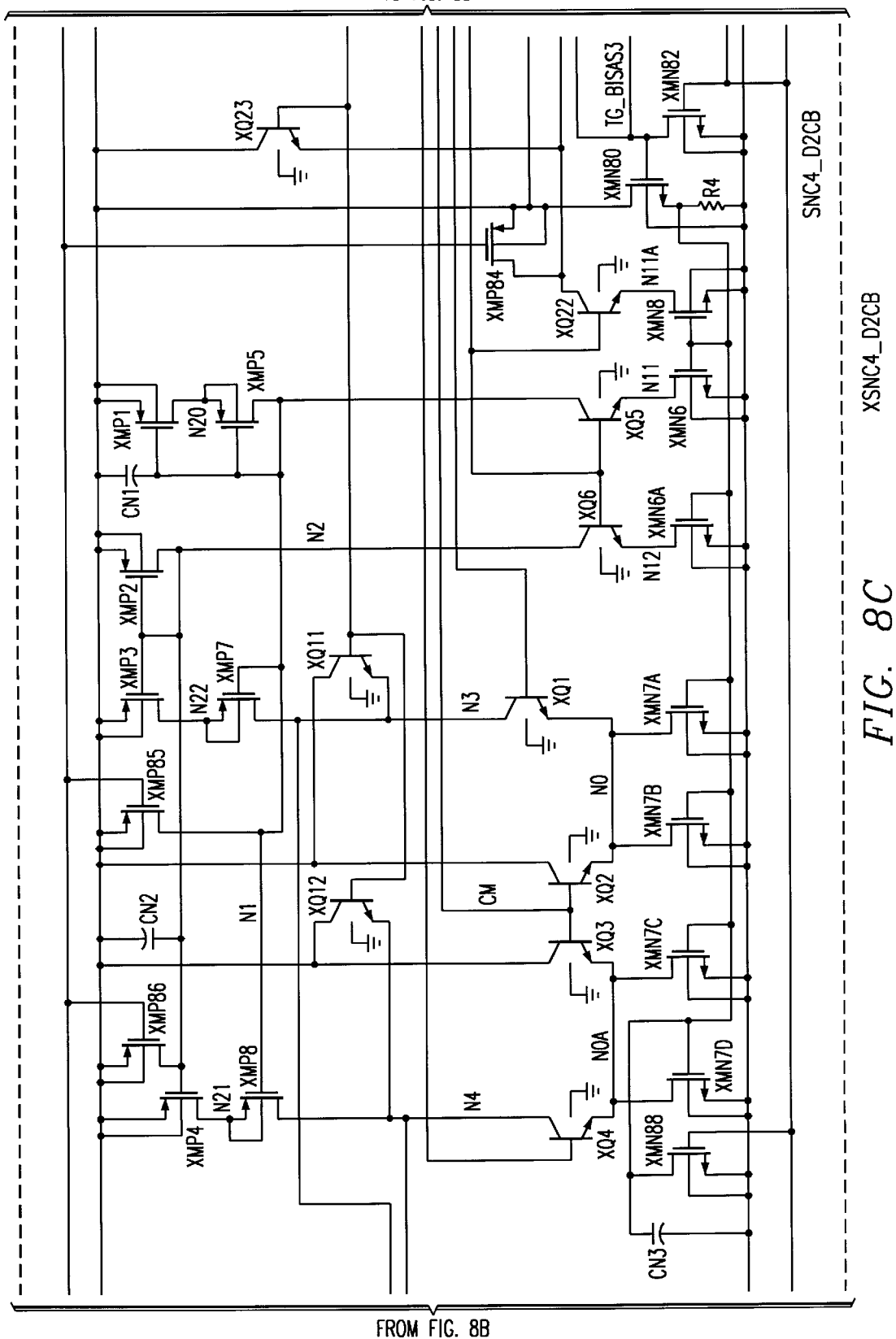
Figure 8D:
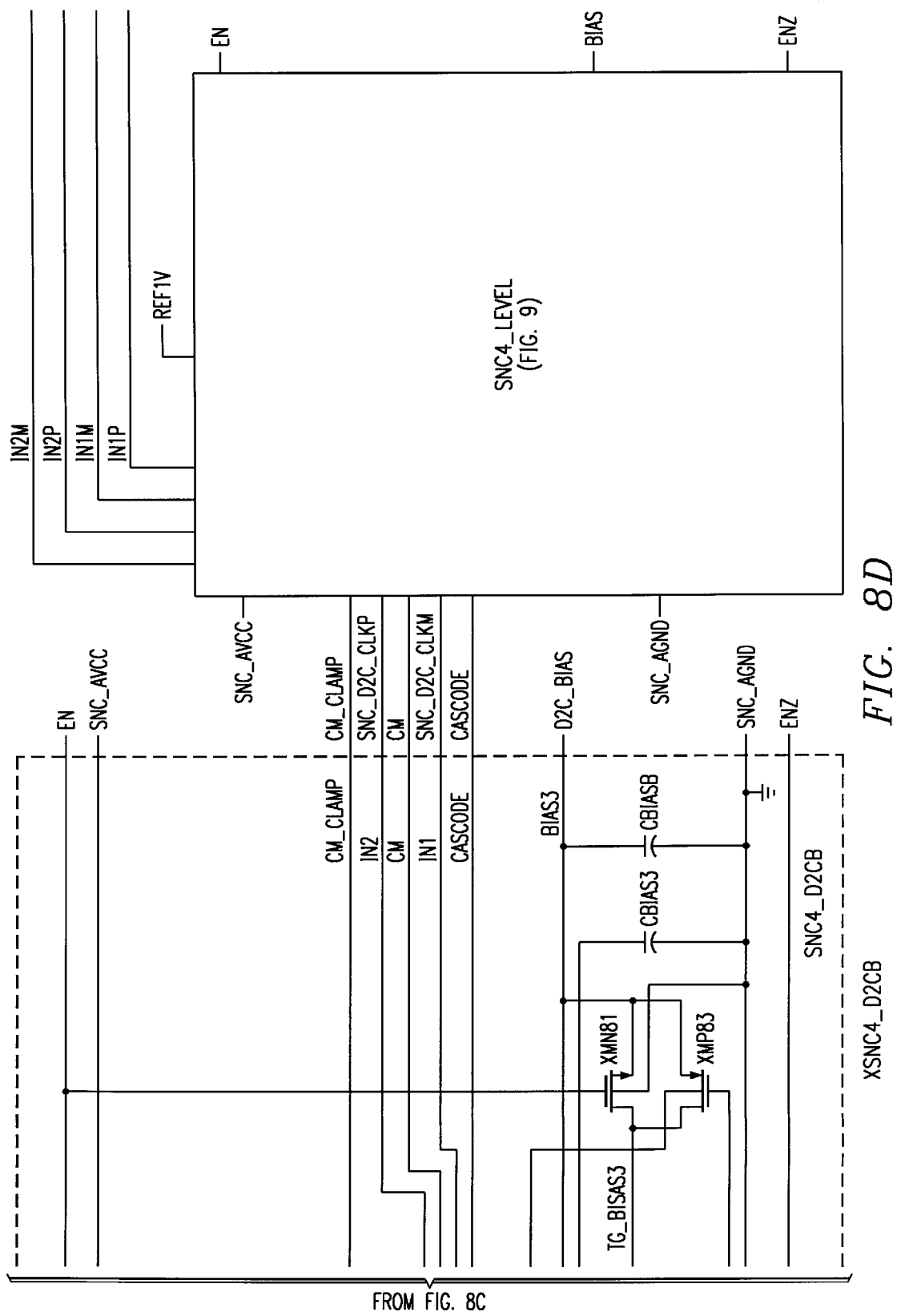

As illustrated in FIG. 4, zero phase restart comparator 100 detects a zero crossing of the amplified, filtered and, equalized read signal, and in response to this zero crossing outputs a signal to the synchronizer voltage controlled oscillator 200. This signal may be a logical one. The SNC VCO outputs a differential signal to the zero phase restart sample and hold circuit 600 and the DCML to CMOS converter 300. The DMCL to CMOS convertor level shifts and amplifies the differential signal from the VCO 200 and outputs a pair of complementary signals which are 5 volts in amplitude. These signals are transmitted to the FAD4 clock MUX 400 which in turn outputs the clock to the ADC clock buffer outputs the clock to the ADC clock buffer 500. The output of the syc NCO in a 2.4 full differential peak to peak signal which is referenced to plus 5 volt power supply. This signal should be level shifted to a common node voltage of 1 volt reference to ground potential of the circuit.

The read signal $V_{IN}$ has been amplified, filtered and equalized by the AGC and filter respectively. The signal $V_{IN}$ is a continuous time analog signal. The $V_{IN}$ is input to the zero phase comparator 100. The zero phase comparator 100 outputs a logical 1 signal for example, a HOLD ZPR signal which is input to the SNC VCO 200. Additionally, $V_{IN}$ is input to the zero phase restart sample and hold circuit 600, which is controlled by the sample and hold signals from the SNC VCO. The zero phase restart sample and hold 600 samples $V_{IN}$ when the sample control signal is active high and holds the sampled read signal from when the hold control signal is active high. The phase lock loop is started at a known time. And, because the delay has been defined, the analog signal is sampled at the correct time. This correct time 15 degrees from when the signal has crossed zero. The DCML to CMOS convertor 300 converts the differential VCO output clock signal to complementary 5 volt signals which are appropriate to use in CMOS circuits. The converter 300 converts the two input signals and outputs a combined signal based on these input signals. The clock MUX circuit 400 selects the signals such that when two clocks are switched no partial pulses are generated. The different clocks may be selected from either the reference clock or the clocks from the SNC PLL in order to sample different types of data recorded on the disk. At a period of time less than a half of clock cycle, for example, less than 4.590 nano seconds when the clock is a 90 megahertz clock, the sample on hold circuit 700 samples the output of the zero phase restart sample and hold circuit 600 when it is holding the sampled read signal.

The present invention provides a level shift between voltage levels. The circuit of FIG. 9 illustrates a low frequency path as well as a high speed high path to maintain clock signal transition information. The low frequency path 100 includes a two complementary paths through transistors Q1 and Q5. These transistors, Q1 and Q5, are configured in an emitter follower configuration. Resistor generated voltage drop I, while transistors XM13 and XM14 form pass gates for power down functions. These transistors are controlled by control signals EN and ENZ, which are high and low, respectively, when the circuit is operating.

Next, in the current path is transistor Q2 which is connected as a diode with collector connected to base. In a similar fashion, a complementary current path is established with transistor Q5, XM17 and XM18, Q4 and Q14 again set in the diode mode. Thus, the signal has been level shifted by the base to emitter voltage of Q5. The voltage drop across R4 and the base to emitter voltage of Q4 and Q14. Additionally, variations from the power supply can be eliminated. These variations are eliminated by a gain stage and buffer circuits XM11, XM12, XM23, XM2, XM4, XM26, Q18, Q9, XM24, XM25, R5 and R5A, Q8 and R3. The OUT CM signal is referenced to the GND and connected to transistor XM11. Node 15 controls the gate of XM26 which defines the current through XM26, Q10, R5A, Q9, XM24, XM25, R5 and Q8. This current controls the voltage at the OUT CM node.

The OUT CM signal is compared to a 1 volt reference through XM11 and XM12. If the OUT CM signal deviates from this 1 volt reference, then the current through XM26 is modulated to cause the OUT CM signal to return to 1 volt. If there is any power supply variation the node N15 will control the gate of XM26 such that the variations are eliminated from the signal OUT CM, clamp, OUT P and OUT M CAS code. This is achieved by modulating the currents through XM26, XM27, XM28, XM29, XM30, XM7, XM6, XM9 and XM10. For example if the power supply increases OUT CM will rise momentarily. The current through XM11 will be reduced and the current through XM12 will increase, causing the voltage at node N15 to increase. The current of XM26 will mirror, increasing the voltage drop across R5A and R5. Thus circuiting the OUT CM signal to 1 volt, eliminating the power supply variation. This results that the voltage drop across transistors Q8, R5, XM24 and XM25, Q9, RSA and Q10 are to be the same as the voltage drop across transistors XM13, Q1, R1 and XM14, Q2 and Q13 and signaling Q5, R4, XN17 and XM18, Q4 and Q14. These transistors are controlled such that the common mode voltage at OUT P and OUT M is the same as OUT CM. Controlling the common mode voltage of OUT CM signal therefore controls the OUT P and OUT M common mode voltage. Thus, the common mode (CM) is maintained.

Turning now to FIGS. 10 and 11, transistors XMN66, XMP67, XMN58, XMP57 turn on and off the comparative circuit during normal operations transistors XMN66 and XMP67 are turned on during normal operations so as to turn on XMP28. Additionally, transistor XMN25 will be turned on since transistors XMN58 and XMP57 are turned on during normal operations. This permits the threshold reference node to be connected together so that the inverters 900 and 800 are connect. Thus, the inverter 500 with its output connected to its input maintains the threshold reference node at the threshold point and correspondingly the inverters 800 and 900 are at this threshold voltage so that any deviation of the voltages will act to trip inverters 800 and 900. Thus, invertor 500 operates at the threshold value in order to bias inverters 800 and 900 at or near their threshold values.

Referring now to FIG. 11, the inverter 800 corresponds to transistors XMP26 and XMN26 while the inverter 900 corresponds to the transistors XMP20 and XMN19. The resistors 1000 corresponds to XR1 while the resister 1100 corresponds to transistor XR3. The transistors 100 and 200 which corresponds to transistors XQ1 and XQ4, respectively, conducts either 2 I current or no current. If for example, device 200 is conducting 2 I, one of the currents I comes from the current mirror and the other comes through resistors XR1 and XR3. The current though these resistors comes from the complementary current source since transistor 100 is turned off. Likewise, when transistor 200 is turned off current flows through one current source 202 through resistors XR3, XR1 and through transistor 100 while the other current source 102 flows through transistor 100. Thus, invertor 500 is not required to supply any current since the entire current are supplied by the two current sources. However, invertor 500 provides a DC bias for inverters 800 and 900. Transistors XMN62 and XMP63 are power down transistors for one of the inverters 900 while transistors XMN60 and XMN61 is a power down circuit for the other inverter 800. Transistor XMN25 is matched to transistor XMN19 and XMN26 transistor XMP28 being matched to transistors XMP20 and XMP26, so that the circuit is independent of temperature process. Thus, since inverters 900 and 800 are set at their threshold, these inverters will switch very fast since no threshold voltage need be overcome. Thus, any small signal will cause inverters 800 or 900 to switch. Very clearly, the signals that drive these circuits must be independent of variations since any small variation can result in these circuits being inadvertently tripped. Thus, transistors 100 and 200 must switch at exactly the same time in order to prevent variations induced from the switching of these circuits to inadvertently tripped one of inverters 800 or 900. Furthermore, this circuit will maintain complementary rise and fall times of the complementary signals. Thus, by making resistors XR3 and XR1 the same value, a symmetric circuit is obtained allowing the rise and fall times to be complementary. Thus, as illustrated, there are 2 gate delays from input of FIG. 11 to its output. For example, 1 gate delay is transistor 100 while a second gate delay is inverter 900.

The above circuit converts a small signal swing to a large signal swing for complementary circuits with 2 gate delays. For example, the total delay is approximately 800 pico seconds long. The gate delay for each individual transistor is approximately 200 or 300 pico seconds with additional delays due to overhead, for example, charging capacitors. Furthermore, the above circuit is power supply independent in that the signals are independent of variations within the power supply. Thus, the outputs of inverters 800 and 900, output complementary 5 volt signals, based on the switching of complementary 1.2 volt differential signals. The output voltage is clamped by XQ12 and XQ11 in order to prevent saturation of XQ14 and XQ3. The rise and fall time should be matched on both N4 and N3. This ensures that both output signals are complementary, in order to achieve this desirable result. The same current should flow through from the transistors XMP7 and XMP8 and devices XMN, 7A, 7B, 7C and 7D. If devices XMN8, XMN6, XMN6*a*, XMN7*a*, XMN7*b*, XMN7*c* and XMN7*d* match each other, then the current going through the NMOS devices matches the current going through the PMOS devices. In order to eliminate temperature variation device XQ22 which is connected to XMN8. Transistors XMN81 and XMP83 and XMN82 are used for power down. XMN80 prevents transistor XQ22 from saturating. The current flows into the collector of XQ22. The gate of XM80 is connected to node TG BIAS3 which turns on XM80 causing node NG-BIAS3 to turn on device XM8, XM6, XM6A, XM7A, XM7B, XM7C and XM7D. The current flowing through XQ22 and XMN8 causes the potential at node BIAS3 and TG BIA3 to settle at a voltage such that XM8 conducts the BIAS current from BIAS3 input. The BIAS current in XM8, XM6, XM7A, XM7B, XM7C and 7D are accurately matched so that the gate, source and the drain source voltage are approximately equal on all devices.

What is claimed is:

1. A level shifting circuit for switching a first complementary signal and a second complementary signal, comprising:
   an input circuit including a first transistor to receive said first complementary signal and said second complementary signal; and
   a switching circuit coupled to said input circuit to switch said first complementary signal and said second complementary signal between a high state and a low state, said level shifting circuit including a second transistor coupled to said input circuit, wherein said switching circuit switches said first complementary signal and said second complementary signal within a time period of two gate delays based on said first and second transistors.

2. A level shifting circuit for switching between a first complementary signal and a second complementary signal as in claim 1, wherein said first complementary signal and said second complementary signal alternate between a first level when received by said input circuit and a second level.

3. A level shifting circuit for switching between a first complementary signal and a second complementary signal as in claim 1, wherein said first complementary signal and said second complementary signal are switched between said high state and a low state within 1.4 nano seconds.

4. A level shifting circuit for switching between a first complementary signal and a second complementary signal as in claim 1, wherein said transistors are coupled to a common node voltage.

5. A level shifting circuit for switching between a first complementary signal and a second complementary signal as in claim 4, wherein said transistors are coupled to a common node voltage of substantially 1 volt.

6. A level shifting circuit for switching between a first complementary signal and a second complementary signal, comprising:
   an input circuit to receive said first complementary signal with respect to a first level and said second complementary signal with respect to said first level;
   a switch coupled to said input circuit to switch said first complementary signal and said second complementary signal between a high state and a low state;
   an inverting circuit coupled to said switch to maintain an output of said inverting circuit at a threshold voltage of said switch;
   a pair of voltage limiting devices coupled to said output of said inverting circuit and coupled to said switch to output said first and second complementary signals at a second level.

7. A level shifting circuit for switching between a first complementary signal and a second complementary signal as in claim 6, wherein said first level is lower than said second level.

8. A level shifting circuit for switching between a first complementary signal and a second complementary signal as in claim 6, wherein said first level is substantially 1 volt.

9. A level shifting circuit for switching between a first complementary signal and a second complementary signal as in claim 6, wherein said second level is substantially 5 volts.

10. A level shifting circuit for switching between a first complementary signal and a second complementary signal as in claim 6, wherein said output of said inverting circuit is directly coupled to an input of said inverting circuit.

11. A level shifting circuit for switching between a first complementary signal and a second complementary signal as in claim 6, wherein said pair of voltage limiting devices are resistors.

12. A level shifting circuit for switching between a first complementary signal and a second complementary signal as in claim 11, wherein said resistors have substantially the same resistance.

13. A level shifting circuit for switching between a first complementary signal and a second complementary signal as in claim 6, wherein each of said voltage limiting devices are coupled to a transistor.

* * * * *

UNITED STATES PATENT AND TRADEMARK OFFICE
CERTIFICATE OF CORRECTION

PATENT : 5,900,746

DATED : May 4, 1999

INVENTOR(S) : Benjamin Joseph Sheahan

It is certified that error appears in the above-identified patent and that said Letters Patent is hereby corrected as shown below:

Title page, insert the following item:
    Related U.S. Application Data
--[60] Provisional application No. 60/000,183, Jun. 13, 1995.--.

Column 1, line 5, insert the following:
--This application claims priority under 35 USC§ 119(e)(1) of provisional application serial no. 60/000,183, filed Jun. 13, 1995.--.

Signed and Sealed this

Eleventh Day of April, 2000

Attest:

Q. TODD DICKINSON

Attesting Officer

Director of Patents and Trademarks